United States Patent
Choi

(10) Patent No.: US 11,587,946 B2
(45) Date of Patent: Feb. 21, 2023

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 17 days.

(21) Appl. No.: 17/020,011

(22) Filed: Sep. 14, 2020

(65) Prior Publication Data

US 2020/0411550 A1  Dec. 31, 2020

Related U.S. Application Data

(63) Continuation of application No. 16/177,044, filed on Oct. 31, 2018, now Pat. No. 10,811,428.

(30) Foreign Application Priority Data

Mar. 13, 2018 (KR) ........................ 10-2018-0029360

(51) Int. Cl.
| | |
|---|---|
| *H01L 27/11582* | (2017.01) |
| *H01L 21/764* | (2006.01) |
| *H01L 27/1157* | (2017.01) |
| *H01L 29/06* | (2006.01) |
| *H01L 21/768* | (2006.01) |

(52) U.S. Cl.
CPC ...... *H01L 27/11582* (2013.01); *H01L 21/764* (2013.01); *H01L 21/76837* (2013.01); *H01L 27/1157* (2013.01); *H01L 29/0649* (2013.01)

(58) Field of Classification Search
None
See application file for complete search history.

(56) References Cited

U.S. PATENT DOCUMENTS

| | | |
|---|---|---|
| 2012/0032245 A1 | 2/2012 | Hwang et al. |
| 2016/0181264 A1 | 6/2016 | Miyamoto et al. |
| 2018/0366488 A1 | 12/2018 | Choi et al. |
| 2019/0189633 A1 | 6/2019 | Choi et al. |

FOREIGN PATENT DOCUMENTS

| | | |
|---|---|---|
| CN | 105977257 A | 9/2016 |
| CN | 106558591 A | 4/2017 |
| KR | 1020100137155 A | 12/2010 |
| KR | 1020170112292 A | 10/2017 |

*Primary Examiner* — Long Pham
(74) *Attorney, Agent, or Firm* — William Park & Associates Ltd.

(57) ABSTRACT

A semiconductor device and a manufacturing method thereof are provided. The semiconductor device includes a well structure, a first channel pillar and a second channel pillar extending from an inside of the well structure in an upward direction, a semiconductor pattern coupled between the first channel pillar and the second channel pillar and having a gap disposed in a central region of the semiconductor pattern, and a source junction formed in the semiconductor pattern.

21 Claims, 41 Drawing Sheets

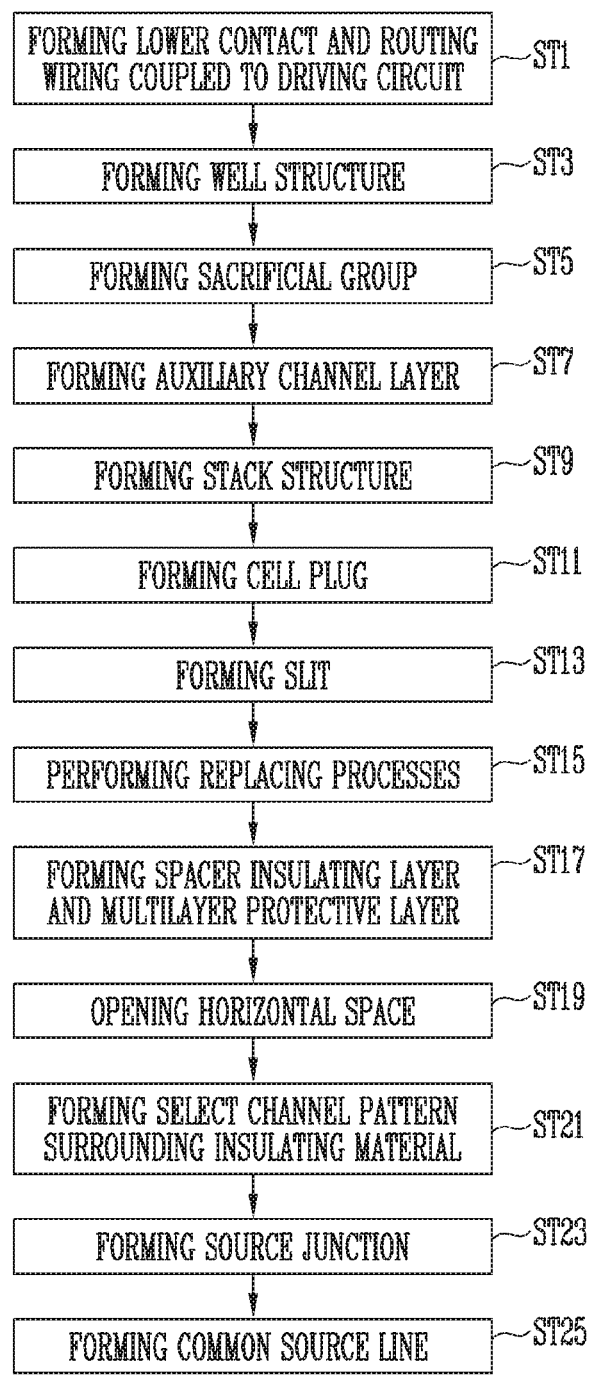

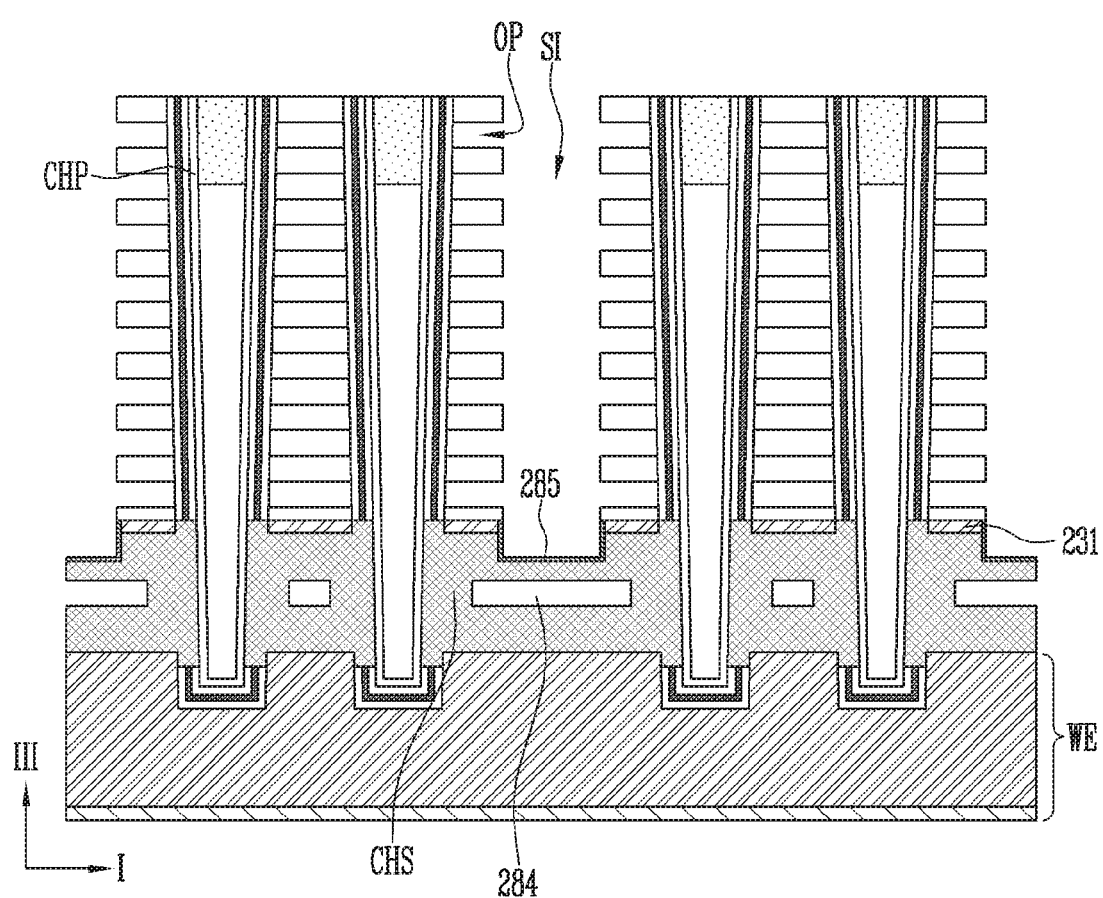

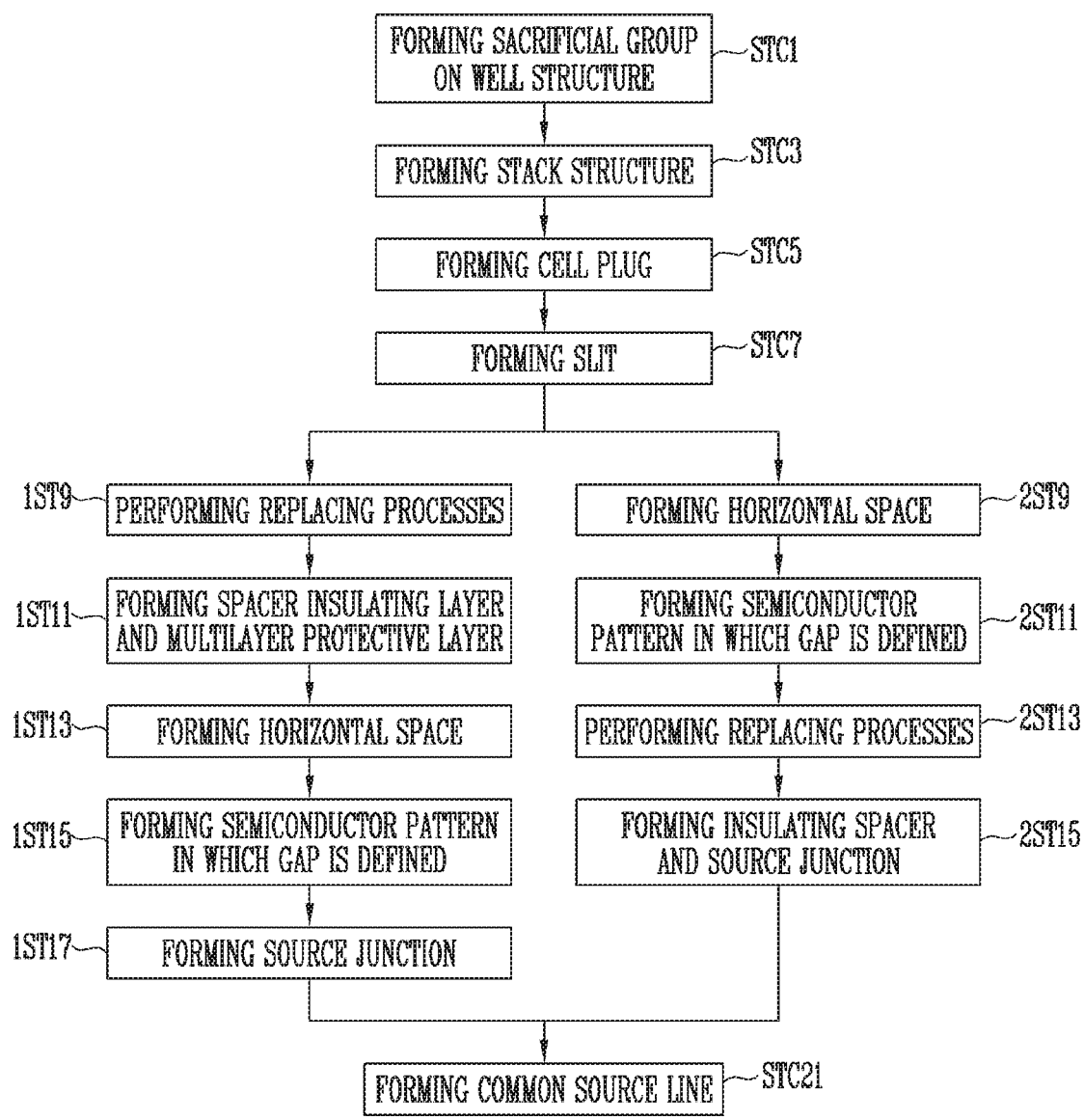

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 16/177,044, filed on Oct. 31, 2018, and claims priority under 35 U.S.C. § 119(a) to Korean patent application number 10-2018-0029360, filed on Mar. 13, 2018, which is incorporated herein by reference in its entirety.

BACKGROUND

1. Technical Field

Various examples of embodiments relate generally to a semiconductor device and a method of manufacturing the semiconductor device, and more particularly, to a semiconductor device including a stacked structure and a method of manufacturing the semiconductor device.

2. Related Art

A semiconductor device may include a plurality of memory cells capable of storing data. These memory cells may be coupled in series between select transistors to form a plurality of memory strings. Gates of the memory cells and the select transistors forming the memory strings may be stacked on each other for high integration density of the semiconductor device. A three-dimensional semiconductor device may be realized by using a gate stack structure including the gates stacked on each other. With regard to the realization of such a three-dimensional semiconductor device including the gate stack structure, various techniques for improving the operational reliability of the semiconductor device are being developed.

SUMMARY

According to an embodiment, a semiconductor device may include a well structure, a first channel pillar and a second channel pillar extending from an inside of the well structure in an upward direction, a semiconductor pattern coupled between the first channel pillar and the second channel pillar and having a gap disposed in a central region of the semiconductor pattern, and a source junction formed in the semiconductor pattern.

According to an embodiment, a semiconductor device may include a well structure extending in a first direction and a second direction, a gate stack structure disposed above the well structure and including a lower select gate group and word lines stacked above the lower select gate group to be spaced apart from one another along a third direction, a horizontal space disposed between the gate stack structure and the well structure, a slit passing through the gate stack structure to be coupled to the horizontal space, and a select channel pattern disposed in the horizontal space to contact the well structure. The select channel pattern may extend on a surface of the slit to face a sidewall of the lower select gate group.

According to an embodiment, a method of manufacturing a semiconductor device may include forming a sacrificial group above a well structure, forming a stack structure above the sacrificial group, forming a slit passing through the stack structure and extending into the sacrificial group, forming a horizontal space by removing the sacrificial group through the slit, forming a semiconductor pattern on a surface of the horizontal space to define a gap in the horizontal space, and forming a source junction in the semiconductor pattern.

According to an embodiment, a method of manufacturing a semiconductor device may include forming a sacrificial group on a well structure, forming a stack structure including first and second material layers alternately stacked on each other on the sacrificial group, forming a slit passing through the stack structure and extending into the sacrificial group, opening a horizontal space by removing the sacrificial group through the slit, forming a select channel pattern surrounding a gap-fill insulating pattern filling the horizontal space, and extending on a sidewall of the slit to protrude farther into the slit than the gap-fill insulating pattern, and forming a source junction in the select channel pattern protruding farther than the gap-fill insulating pattern.

BRIEF DESCRIPTION OF THE DRAWINGS

FIG. 3 is a flowchart schematically illustrating a manufacturing method of the semiconductor device shown in FIG.

FIGS. 17A to 17I are cross-sectional views illustrating a manufacturing method of the semiconductor device shown in FIG. 16.

FIG. 19 is a flowchart schematically comparing methods of manufacturing semiconductor devices in accordance with embodiments.

DETAILED DESCRIPTION

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Various embodiments may be directed to a semiconductor device capable of improving driving reliability of a three-dimensional semiconductor device including a stack structure, and a manufacturing method thereof.

Figure 1:
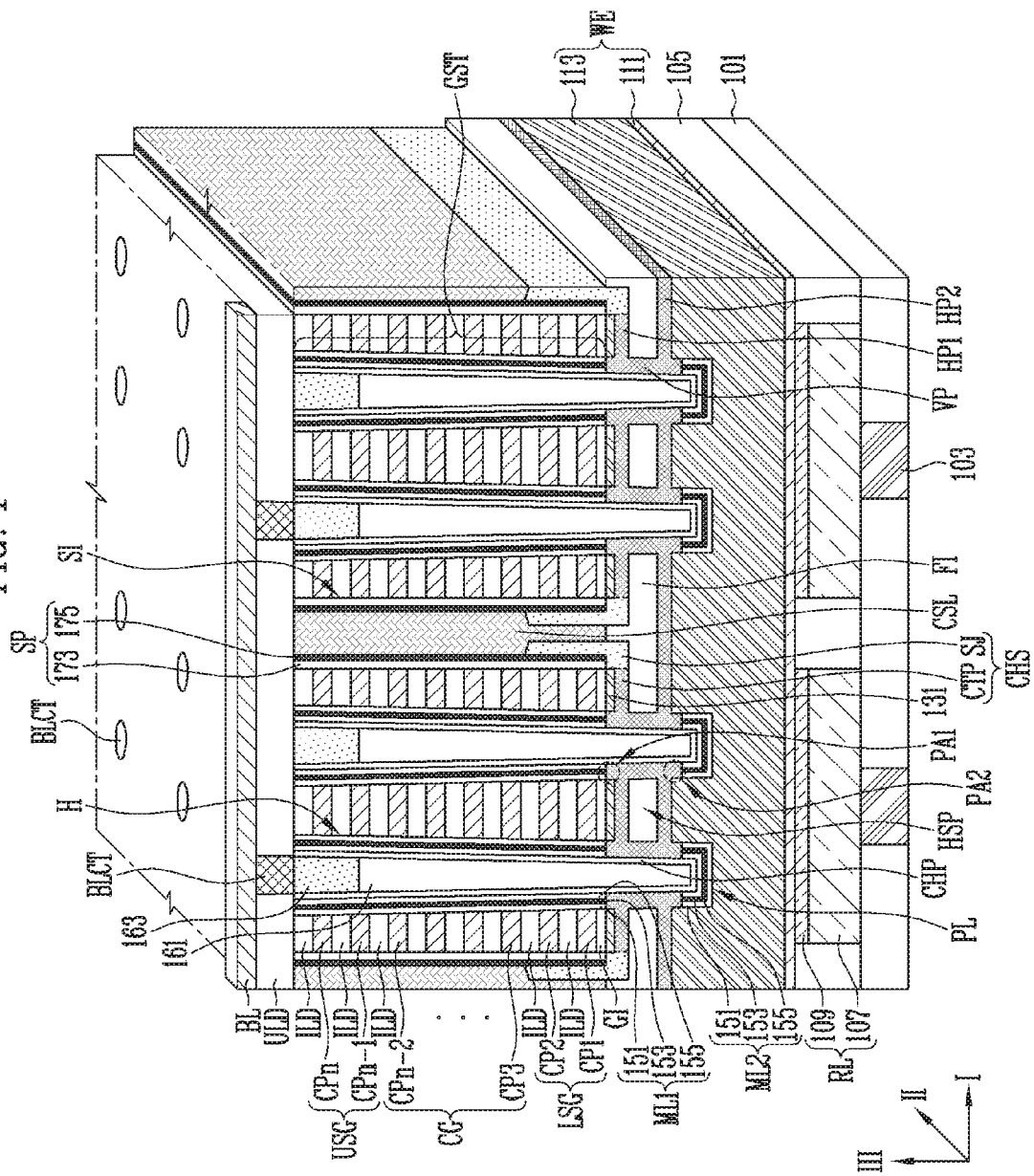
FIG. 1 is a diagram illustrating a semiconductor device according to an embodiment.

FIG. 1 is a diagram illustrating a semiconductor device according to an embodiment.

Referring to FIG. 1, the semiconductor device according to an embodiment may include patterns extending in at least one direction in a first direction I, a second direction II, and a third direction III that intersect one another. For example, the semiconductor device according to an embodiment may include a well structure WE, a select channel pattern CHS disposed above the well structure WE, cell plugs PL passing through the select channel pattern CHS and extending in the third direction III, gate stack structures GST surrounding the cell plugs PL, a slit SI disposed between neighboring gate stack structures GST, a common source line CSL contacting the select channel pattern CHS and extending in the third direction III in the slit SI, and a bit line 13L electrically connected to the cell plugs PL.

Although not illustrated in FIG. 1, the semiconductor device may further include a circuit section including driving circuits for transferring electrical signals to the gate stack structures GST, the common source line CSL, the well structure WE, and the bit line BL, and for controlling operations of the semiconductor device. The circuit section (not illustrated) may be disposed to overlap the well structure WE under the well structure WE.

The well structure WE may be electrically connected to the circuit section (not illustrated) through at least one of a lower contact 103 and routing wiring RL. The lower contact 103 may pass through a first lower insulating layer 101. The routing wiring RL may pass through a second lower insulating layer 105 disposed above the first lower insulating layer 101 to be coupled to the lower contact 103. The lower contact 103 and the routing wiring RL may include a conductive material. The routing wiring RL may include a low resistance metal such as tungsten. The routing wiring RL may include a metal layer 107 and a barrier metal layer 109 for preventing diffusion of metal. The routing wiring RL may be well pickup wiring for transferring an erase voltage.

The well structure WE may be electrically connected to the routing wiring RL for transferring the erase voltage. The well structure WE may extend in the first direction I and the second direction II. The well structure WE may be disposed above the second lower insulating layer 105 in which the routing wiring RL is embedded. The well structure WE may include a first conductivity type impurity. For example, the well structure WE may include a p-type impurity. The well structure WE may include a first semiconductor layer 111 and a second semiconductor layer 113 formed on the first semiconductor layer 111. The first semiconductor layer 111 and the second semiconductor layer 113 may extend in the first direction I and the second direction II, respectively. The first semiconductor layer 111 may be a doped silicon layer including the first conductivity type impurity at a first concentration. The second semiconductor layer 113 may be a doped silicon layer including the first conductivity type impurity at a second concentration lower than the first concentration. Forming the second semiconductor layer 113 may include forming an undoped silicon layer and operating a heat treatment for diffusing the impurity from the first semiconductor layer 111 into the undoped silicon layer. The first semiconductor layer 111 may serve as a well pickup region.

Each of the gate stack structures GST may include a gate insulating layer GI, conductive patterns CP1 to CPn, and interlayer insulating layers ILD. The conductive patterns CP1 to CPn and the interlayer insulating layers ILD are alternately stacked on the gate insulating layer GI. The conductive patterns CP1 to CPn may be stacked apart from one another along the third direction III. Each of the interlayer insulating layers ILD may be disposed between each pair of the neighboring conductive patterns CP1 to CPn. The gate insulating layer GI may have a smaller thickness than each of the interlayer insulating layers ILD. The conductive patterns CP1 to CPn may be divided into a lower select gate group LSG, a cell gate group CG, and an upper select gate group USG.

The lower select gate group LSG may include a conductive pattern in a single layer or conductive patterns in two or more layers adjacent to the well structure WE. For example, the lower select gate group LSG may include a first conductive pattern CP1 closest to the well structure WE, among the conductive patterns CP1 to CPn, and a second conductive pattern CP2 arranged above the first conductive pattern CP1. The lower select gate group LSG may serve as a source select line coupled to a gate of a source select transistor.

In comparison with the lower select gate group LSG, the upper select gate group USG may be more distant from the well structure WE. The upper select gate group USG may include a conductive pattern in a single layer or conductive patterns in two or more layers adjacent to the bit line BL. For example, the upper select gate group USG may include an nth conductive pattern CPn, the farthest from the well structure WE, among the conductive patterns CP1 to CPn, and an (n−1)th conductive pattern CPn−1 arranged under the nth conductive pattern CPn. The upper select gate group USG may serve as a drain select line coupled to a gate of a drain select transistor.

The cell gate group CG may be arranged above the lower select gate group LSG and under the upper select gate group USG. In other words, the cell gate group CG may include the conductive patterns arranged between the lower select gate group LSG and the upper select gate group USG. For example, the cell gate group CG may include third to (n−2)th conductive patterns CP3 to CPn−2. The conductive patterns forming the cell gate group CG may serve as word lines coupled to gates of memory cell transistors.

As described above, the conductive patterns CP1 to CPn of the gate stack structure GST may serve as gate electrodes coupled to the gates of the source select transistor, the memory cell transistors and the drain select transistor. The interlayer insulating layers ILD may insulate the gate electrodes from each other, or insulate the gate electrode from the bit line BL. The conductive patterns CP1 to CPn may include at least one of polysilicon, metal, and metal silicide. The interlayer insulating layers ILD may include oxides.

The gate stack structures GST may be spaced apart from the well structure WE with a horizontal space HSP interposed the gate structures GST and the well structure WE. The horizontal space HSP disposed between the gate stack structures GST and the well structure WE may be coupled to the slit SI, The slit SI may be coupled to the horizontal space HSP, and may extend in the third direction III between the neighboring gate stack structures GST.

An insulating spacer SP may be formed on a sidewall of the slit SI. The insulating spacer SP may include a spacer insulating layer 173 formed on a sidewall of the gate stack structure GST and a protective layer 175 on the spacer insulating layer 173. The spacer insulating layer 173 may have a sufficient thickness to insulate the conductive patterns CP1 to CPn from the common source line CSL. The spacer insulating layer 173 may include an oxide layer. The protective layer 175 may include a material different from a tunnel insulating layer 155 which will be described later. For example, the protective layer 175 may include a material having a different etch rate from the tunnel insulating layer 155. For example, the protective layer 175 may include a nitride layer.

The cell plugs PL may pass through the gate stack structures GST at both sides of the slit SI and extend into the well structure WE. Each of the cell plugs PL may include a channel pillar CHP, a first multilayer memory pattern ML1, a second multilayer memory pattern ML2, and a capping pattern 163.

The channel pillar CHP may pass through the corresponding gate stack structure GST to extend into the well structure WE. The channel pillar CHP may include a semiconductor layer. For example, the channel pillar CHP may include a polysilicon layer. The channel pillar CHP may include a sidewall which contacts the select channel pattern CHS. The sidewall of the channel pillar CHP and the select channel pattern CHS may directly contact each other in the horizontal space HSP. The channel pillar CHP may completely fill a central region of a hole H passing through the gate stack structure GST or may include a thin layer surrounding a core insulating layer 161 which fills the central region of the hole H. The core insulating layer 161 may have a smaller height than the channel pillar CHP.

The capping pattern 163 may be disposed on the core insulating layer 161 and fill a top central portion of the channel pillar CHP. The capping pattern 163 may directly contact the channel pillar CHP. The capping pattern 163 may include a semiconductor layer doped with a second conductivity type impurity. The second conductivity type impurity may be different from the first conductivity type impurity doped to the well structure WE. For example, the second conductivity type impurity may be an n-type impurity. For example, the capping pattern 163 may be a doped polysilicon layer doped with the n-type impurity. The capping pattern 163 may serve as a drain junction.

The first multilayer memory pattern ML1 may extend along an interface between the channel pillar CHP and the gate stack structure GST. The second multilayer memory pattern ML2 may extend along an interface between the channel pillar CHP and the well structure WE. The first multilayer memory pattern ML1 and the second multilayer memory pattern ML2 may be separated from each other by the select channel pattern CHS. Each of the first and second multilayer memory patterns ML1 and ML2 may include the tunnel insulating layer 155 surrounding the channel pillar CHP, a data storage layer 153 surrounding the tunnel insulating layer 155, and a blocking insulating layer 151 surrounding the data storage layer 153. The data storage layer 153 may store data being changed by using Fowler-Nordheim tunneling induced by the voltage difference between the channel pillar CHP and word lines (e.g., CP3 to CPn−2) included in the cell gate group CG. The data storage layer 153 may include various materials, for example, a nitride layer capable of trapping charges. In addition, the data storage layer 153 may include silicon, a phase-change material, nanodots, etc. The blocking insulating layer 151 may include an oxide layer capable of blocking charges. A portion of the first multilayer memory pattern ML1 disposed between the upper select gate group USG and the channel pillar CHP and another portion of the first multilayer memory pattern ML1 disposed between the lower select gate group LSG and the channel pillar CHP may serve as gate insulating layers. The second multilayer memory pattern ML2 may serve as an insulating layer which insulates the well structure WE and the channel pillar CHP from each other.

The select channel pattern CHS may be disposed in the horizontal space HSP between the well structure WE and the gate stack structure GST, and may extend in the third direction III towards the slit SI. Since the select channel pattern CHS extends on a surface of the slit SI, the select channel pattern CHS may face a sidewall of the lower select gate group LSG which is towards the slit SI.

A height of the select channel pattern CHS disposed in the slit SI may be the same as heights of conductive patterns (e.g., CP1 and CP2) forming the lower select gate group LSG. Alternatively, the height of the select channel pattern CHS disposed in the slit may be greater than a height of the lower select gate group LSG in the third direction III. In addition, the height of the select channel pattern CHS disposed in the slit SI may be less than heights of the slit SI, the channel pillars CHP, and the insulating spacer SP. The select channel pattern CHS may be formed on the insulating spacer SP in the slit SI.

A portion of the insulating spacer SP may protrude farther in the third direction III than the select channel pattern CHS to insulate the common source line CSL and the gate stack structure GST from each other. Another portion of the insulating spacer SP disposed between the select channel pattern CHS and the lower select gate group LSG may serve as a gate insulating layer.

The select channel pattern CHS may directly contact the well structure WE and may extend along an upper surface of the well structure WE. The select channel pattern CHS may extend on the sidewall of the channel pillar CHP passing in the horizontal space HSP to directly contact the channel pillar CHP. The select channel pattern CHS may be divided into a contact channel portion CTP disposed in the horizontal space HSP and a source junction SJ extending from the contact channel portion CTP towards the slit SI. A single semiconductor pattern (e.g., the select channel pattern CHS) may include the contact channel portion CTP and the source junction SJ. The contact channel portion CTP and the source junction SJ may be divided by a diffusion boundary of the second conductivity type impurity. The select channel pattern CHS may include a semiconductor layer. For example, the select channel pattern CHS may include a silicon layer.

The contact channel portion CTP may serve as a channel and may function as electrically connecting the channel pillar CHP, the well structure WE, and the source junction SJ to one another. The contact channel portion CTP may be disposed in the horizontal space HSP and may directly contact the well structure WE and the channel pillar CHP. The contact channel portion CTP may include a first horizontal portion HP1 extending along a lower surface of the gate stack structure GST, a second horizontal portion HP2 facing the first horizontal portion HP1 and extending along the upper surface of the well structure WE, and a vertical portion VP coupling the first horizontal portion HP1 and the second horizontal portion HP2 to each other. The verticap portion VP surrounds the sidewall of the channel pillar CHP. In addition, the vertical portion VP of the contact channel portion CTP may include a first protruding portion PA1 protruding towards the gate stack structure GST and a second protruding portion PA2 protruding towards the well structure WE. The first protruding portion PA1 may protrude farther towards the gate stack structure GST than the first horizontal portion HP1, and the second protruding portion PA2 may protrude farther towards the opposite direction to the protruding direction of the first protruding portion PA1 than the second horizontal portion HP2.

An auxiliary channel layer 131 may be further disposed between the first horizontal portion HP1 of the contact channel portion CTP and the gate stack structure GST. The auxiliary channel layer 131 may be passed through by the channel pillar CHP and the first protruding portion PA1, and may directly contact the first protruding portion PA1 and the first horizontal portion HP1 of the contact channel portion CTP. The auxiliary channel layer 131 may include an undoped semiconductor layer or a semiconductor layer including a first conductivity type impurity. For example, the auxiliary channel layer 131 may include an undoped silicon layer or a p-type silicon layer.

The well structure WE may protrude towards the second horizontal portion HP2 and may directly contact a sidewall of the second protruding portion PA2 and the second horizontal portion HP2.

The first multilayer memory pattern ML1 may be disposed on the first protruding portion PA1 and the second multilayer memory pattern ML2 may be disposed under the second protruding portion PA2.

The semiconductor device according to an embodiment may further include a gap-fill insulating pattern FI disposed between the first horizontal portion HP1 and the second horizontal portion HP2. The gap-fill insulating pattern FI may be surrounded by the first horizontal portion HP1, the second horizontal portion HP2, and the vertical portion VP, and may completely fill the horizontal space HSP.

The source junction SJ may be a portion of the select channel pattern CHS disposed in the slit SI, and the portion extending from the contact channel portion CTP. The source junction SJ may include the second conductivity type impurity which is different from the first conductivity type impurity included in the well structure WE. For example, the source junction SJ may include an n-type impurity. The source junction SJ may be formed as high as the lower select gate group LSG and may overlap a sidewall of the lower select gate group LSG towards the slit SI.

A lower portion of the slit SI may not be completely filled with the source junction SJ, and a portion of the lower portion of the slit SI may be opened by the source junction SJ. The slit opened by the source junction SJ may be filled with the common source line CSL. The common source line CSL may be coupled to the source junction SJ. The common source line CSL may include a conductive layer. For example, the common source line CSL may include various materials such as a silicide layer, a metal layer, a doped silicon layer, etc. The insulating spacer SP may extend from between the source junction SJ and the gate stack structure GST, to between the common source line CSL and the gate stack structure GST. The common source line CSL may protrude farther along the silt SI in the third direction III than the source junction SJ. In an embodiment, the source junction SJ may extend in a downward direction, opposite to the third direction III, lower than the common source line CSL.

The bit line BL may be coupled to the plurality of cell plugs PL arranged next to each other in one direction. Alternatively, the bit line BL may be coupled to even or odd cell plugs PL, among the plurality of cell plugs PL arranged next to each other in one direction.

The bit line BL may be electrically coupled to the channel pillar CHP and the capping pattern 163 via a bit line contact plug BLCT coupled to the cell plug PL. The bit line contact plug BLCT may pass through an upper insulating layer ULD disposed between the gate stack structure GST and the bit line BL. Though not shown in FIG. 1, the bit line BL may directly contact the channel pillar CHP and the capping pattern 163 of the cell plug PL.

According to the above-described embodiment, the source select transistor may be defined at an intersection between the lower select gate group LSG and the channel pillar CHP, a memory cell may be defined at an intersection between the cell gate group CG and the channel pillar CHP, and the drain select transistor may be defined at an intersection between the upper select gate group USG and the channel pillar CHP. Accordingly, the drain select transistor, the memory cell, and the source select transistor may be coupled in series between the bit line BL and the common source line CSL by the channel pillar CHP to form a memory string.

Figure 2:
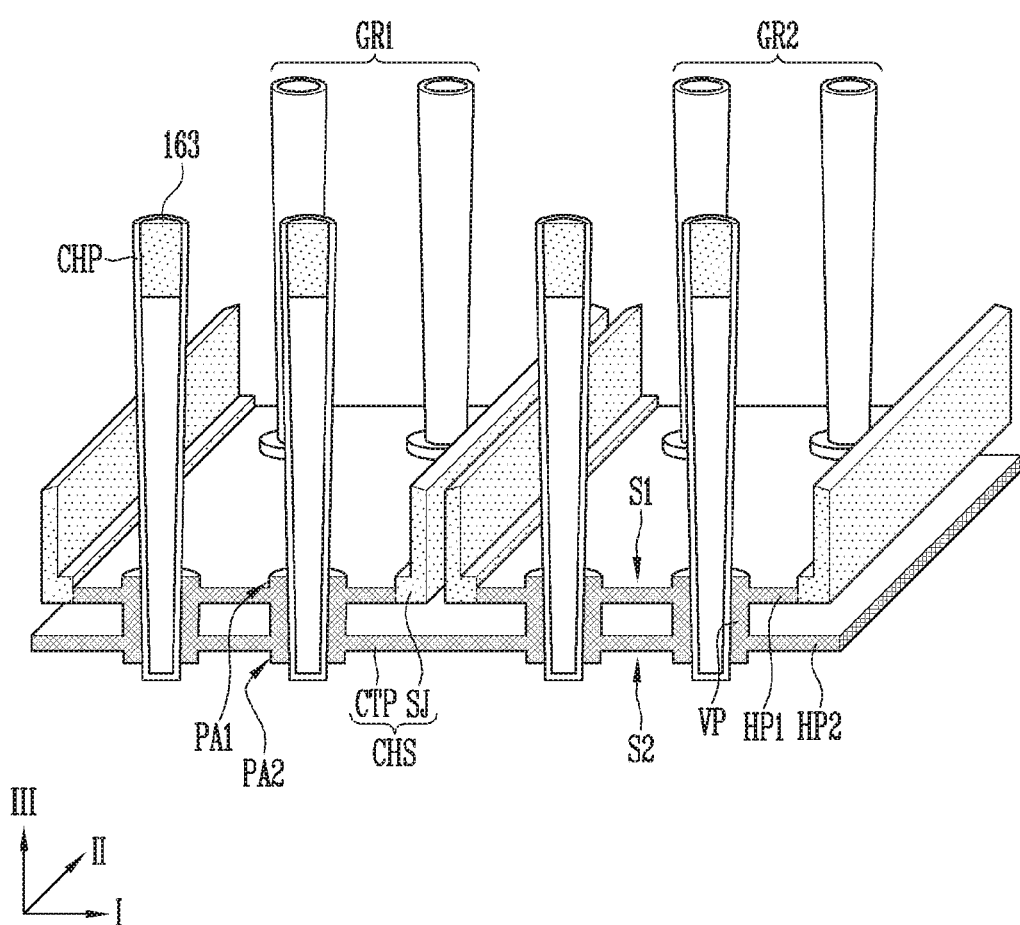
FIG. 2 is a diagram illustrating a channel pillar and a select channel layer shown in FIG.

FIG. 2 is a diagram illustrating the channel pillar CHP and a select channel layer shown in FIG. 1.

Referring to FIG. 2, the semiconductor device according to an embodiment may include the plurality of channel pillars CHP. The channel pillars CHP may pass through the select channel pattern CHS. The channel pillars CHP may be divided into a first group GR1 and a second group GR2 which are alternately disposed along the first direction I.

The select channel pattern CHS may include end portions spaced apart from one another in the slit SI of FIG. disposed between channel pillars of the first group GR1 and channel pillars of the second group GR2. The end portions of the select channel pattern CHS may include the second conductivity type impurity to serve as the source junctions SJ. The source junctions SJ may include the same conductivity type impurity as the conductivity type impurity of the capping patterns 163. The rest of the region of the select channel pattern CHS in which the second conductivity type purity does not diffuse may be defined as the contact channel portion CTP.

The contact channel portion CTP may include a first surface S1 and a second surface S2. The first surface S1 may extend along the first direction I and the second direction II, and may be towards the gate stack structure GST of FIG. 1. The second surface S2 may extend along the first direction I and the second direction II, and may be towards the well structure WE of FIG. 1. The first surface S1 may correspond to a top surface of the first horizontal portion HP1. The second surface S2 may correspond to a bottom surface of the second horizontal portion HP2. The vertical portions VP may be disposed between the first horizontal portion HP1 and the second horizontal portion HP2, and may surround the sidewalls of the channel pillars CHP. Each of the vertical portions VP may include the first protruding portion PA1 protruding from the first surface S1 and the second protruding portion PA2 protruding from the second surface S2. The source junction SJ may be formed lower than the channel pillars CHP and higher than the first protruding portion PA1.

The semiconductor device according to the above-described embodiments in FIGS. 1 and 2 may easily form the source junction SJ overlapping the select gate group in the select channel pattern CHS by extending the select channel pattern CHS coupled to the well structure WE into the slit SI passing through the stack structure. In addition, the semiconductor device according to the above-described embodiments in FIGS. 1 and 2 may improve driving reliability of the semiconductor device by securing an overlapping region between the source junction SJ in the select channel pattern CHS and the select gate group.

FIG. 3 is a flowchart schematically illustrating a manufacturing method of the semiconductor device shown in FIG. 1. FIG. 3 shows processes between forming a lower structure including a driving circuit and forming the bit line BL.

Referring to FIG. 3, step ST1 for forming the lower contact 103 and the routing wiring RL on the lower structure including the driving circuit (not illustrated). Subsequently, step ST3 for forming the well structure WE may be performed.

Figure 4A:
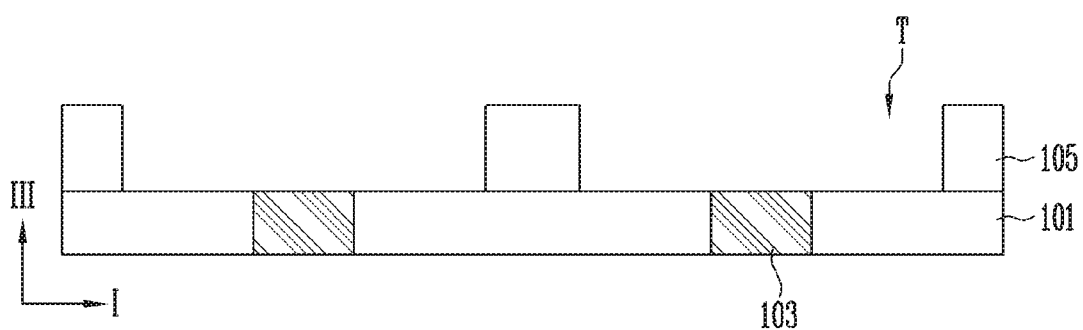
FIGS. 4A and 4B are cross-sectional views illustrating steps ST1 and ST3 shown in FIG. 3.
Figure 4B:
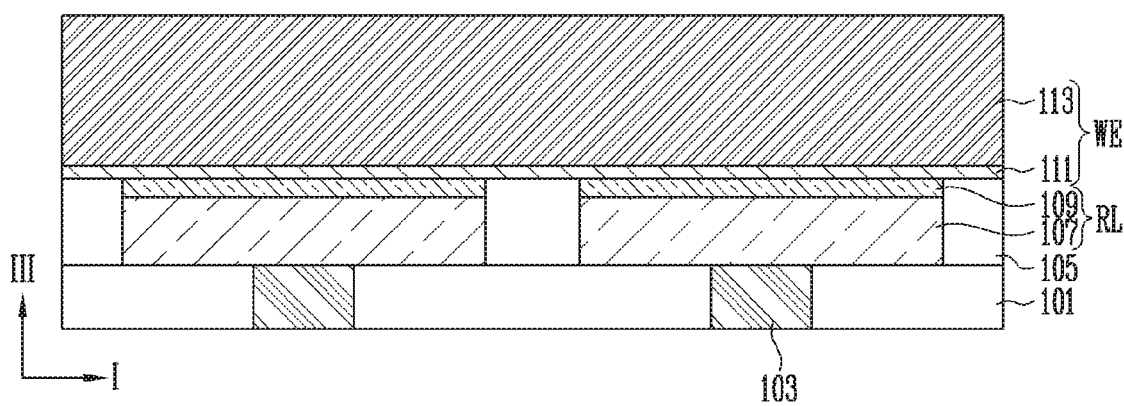

FIGS. 4A and 4B are cross-sectional views illustrating steps ST1 and ST3 shown in FIG. 3.

Referring to FIG. 4A, step ST1 may include forming the lower contact 103 passing through the first lower insulating layer 101, The lower contact 103 may include a conductive material, and may be coupled to the driving circuit which is not illustrated in FIG. 4A.

Step ST1 may further include forming the second lower insulating layer 105 on the first lower insulating layer 101 including the lower contact 103, and forming a trench T exposing the lower contact 103 by etching the second lower insulating layer 105. The trench T may extend in various directions.

Referring to FIG. 4B, step ST1 may further include forming the routing wiring RL filling the trench T. The routing wiring RL may include a conductive material. For example, the routing wiring RL may include the metal layer 107. A low resistance metal such as tungsten may serve as the metal layer 107. The routing wiring RL may further include the barrier metal layer 109 formed on the metal layer 107. The barrier metal layer 109 may be formed for preventing diffusion of metal. The barrier metal layer 109 may include a titanium (Ti) layer, a titanium nitride (TIN) layer, etc.

Referring to FIG. 4B, after step ST1, step ST3 for forming the well structure WE may be performed. Step ST3 may be formed by depositing at least one semiconductor layer on the second lower insulating layer 105 including the routing wiring RL. A semiconductor layer for the well structure WE may include the first conductivity type impurity. For example, the well structure WE may include the first semiconductor layer 111 including the p-type impurity and the second semiconductor layer 113 disposed on the first semiconductor layer 111. The first semiconductor layer 111 and the second semiconductor layer 113 may be doped silicon layers including the p-type impurities. The second semiconductor layer 113 may include the undoped silicon layer or may be a doped silicon layer including the p-type impurity having a lower concentration than the first semiconductor layer 111. Even if the second semiconductor layer 113 includes the undoped silicon layer, the first conductivity type impurity in the first semiconductor layer 111 may diffuse into the second semiconductor layer 113.

Figure 5:
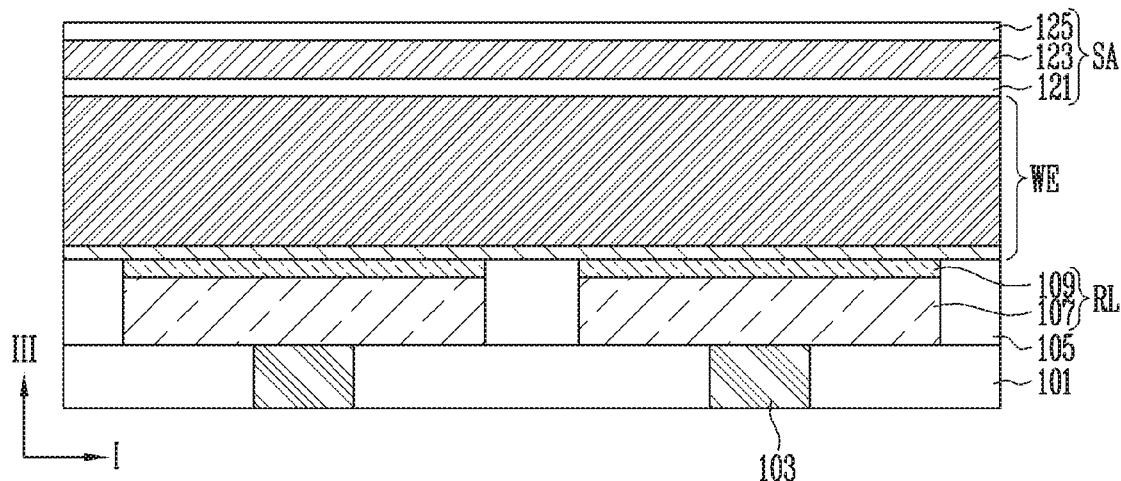
FIG. 5 is a cross-sectional view illustrating step ST5 shown in FIG. 3.

FIG. 5 is a cross-sectional view illustrating step ST5 shown in FIG. 3.

Referring to FIGS. 3 and 5, after step ST3, step ST5 for forming a sacrificial group SA on the well structure WE may be performed. The sacrificial group SA may include first, second, and third sacrificial layers 121, 123, and 125 sequentially stacked on one another.

At least one of the first sacrificial layer 121 and the third sacrificial layer 125 may be omitted. The first sacrificial layer 121 may include an oxide layer serving as a protective layer for protecting the well structure WE. The second sacrificial layer 123 may include a material having a different etch rate from first and second material layers 141 and 143 to be formed during subsequent processes. For example, the second sacrificial layer 123 may include a polysilicon layer. The third sacrificial layer 125 may include an oxide layer serving as a protective layer for protecting the first and second material layers 141 and 143 or the auxiliary layer 131 to be formed during subsequent processes.

Figure 6:
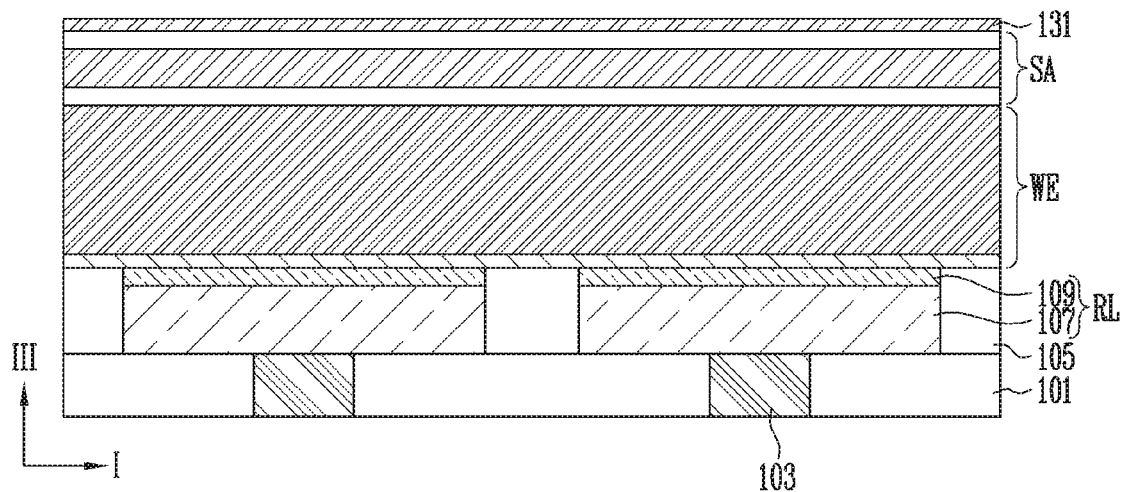
FIG. 6 is a cross-sectional view illustrating step ST7 shown in FIG. 3.

FIG. 6 is a cross-sectional view illustrating step ST7 shown in FIG. 3.

Referring to FIGS. 3 and 6, after step ST5, step ST7 for forming the auxiliary channel layer 131 on the sacrificial group SA may be performed. In some cases, step ST7 may be omitted.

The auxiliary channel layer 131 may include a semiconductor layer serving as a channel. For example, the auxiliary channel layer 131 may include an undoped silicon layer or a doped silicon layer including a first conductivity type impurity.

Figure 7:
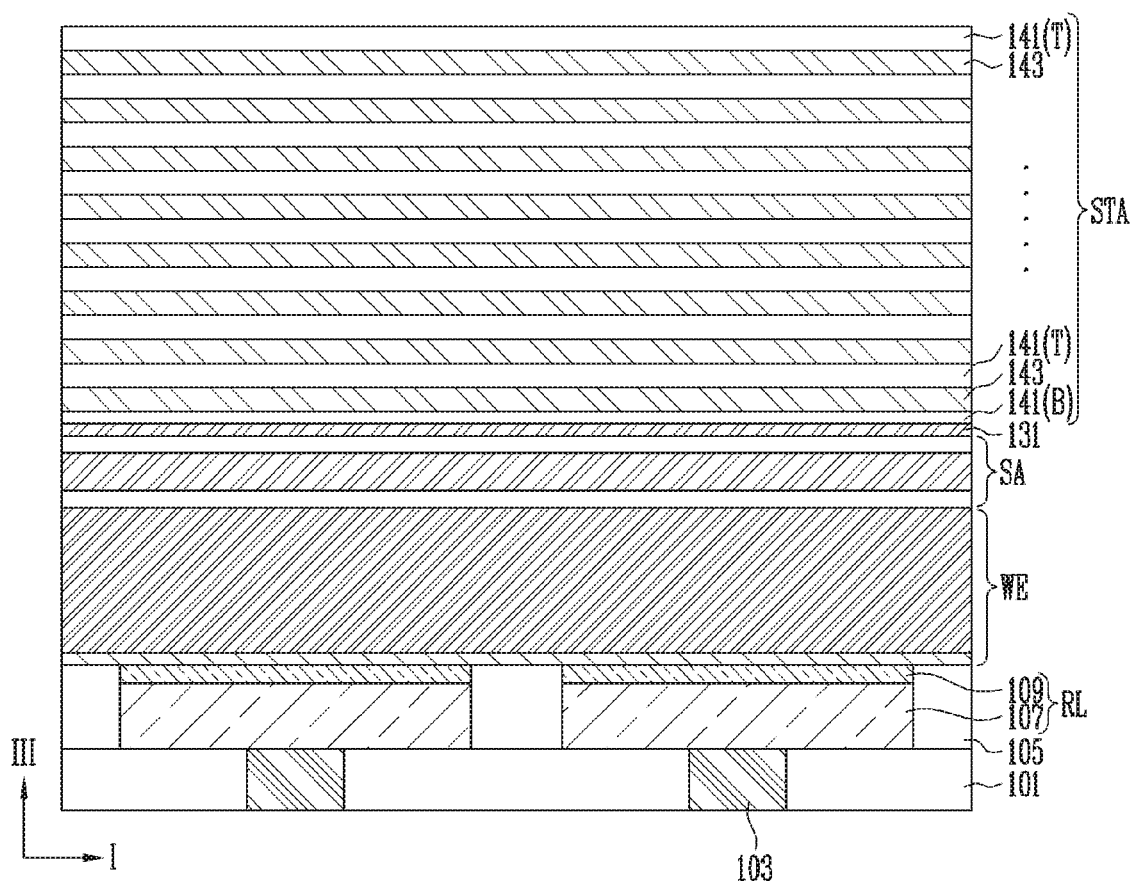
FIG. 7 is a cross-sectional view illustrating step ST9 shown in FIG. 3.

FIG. 7 is a cross-sectional view illustrating step ST9 shown in FIG. 3.

Referring to FIGS. 3 and 7, after step ST5 or ST7, step ST9 for forming a stack structure STA in which the first material layers 141 and the second material layers 143 alternately stacked one by one may be performed. The stack structure STA may be formed above the sacrificial group SA or the auxiliary channel layer 131.

The second material layers 143 may include different materials from the first material layers 141. For example, the first material layers 141 may include insulating materials for interlayer insulating layers, and the second material layers 143 may include conductive materials for conductive patterns. In another example, the first material layers 141 may include insulating materials for interlayer insulating layers, and the second material layers 143 may include sacrificial insulating materials serving as sacrificial layers and having a different etch rate from the first material layers 141. In detail, each first material layer 141 may include a silicon oxide layer, and each second material layer 143 may include a silicon nitride layer. When both of the first and second material layers 141 and 143 include insulating materials, a level of difficulty of subsequent etching processes for forming the hole H or the slit SI may be lowered. In a third example, the first material layers 141 may include sacrificial conductive materials serving as sacrificial layers and having a different etch rate from the second material layers 143, and the second material layers 143 may include conductive materials so as to be configured as conductive patterns. In this example, the first material layers 141 may include undoped polysilicon layers, and the second material layers 143 may include doped polysilicon layers or metal layers.

The first material layers 141 may be divided into a lowermost layer B which is most adjacent to the well structure WE and upper layers T disposed above the lowermost layer B. The lowermost layer B may have a smaller thickness than the upper layers T.

Referring to FIG. 3, after step ST9, step ST11 for forming cell plugs passing through a stack structure may be performed.

Figure 8A:
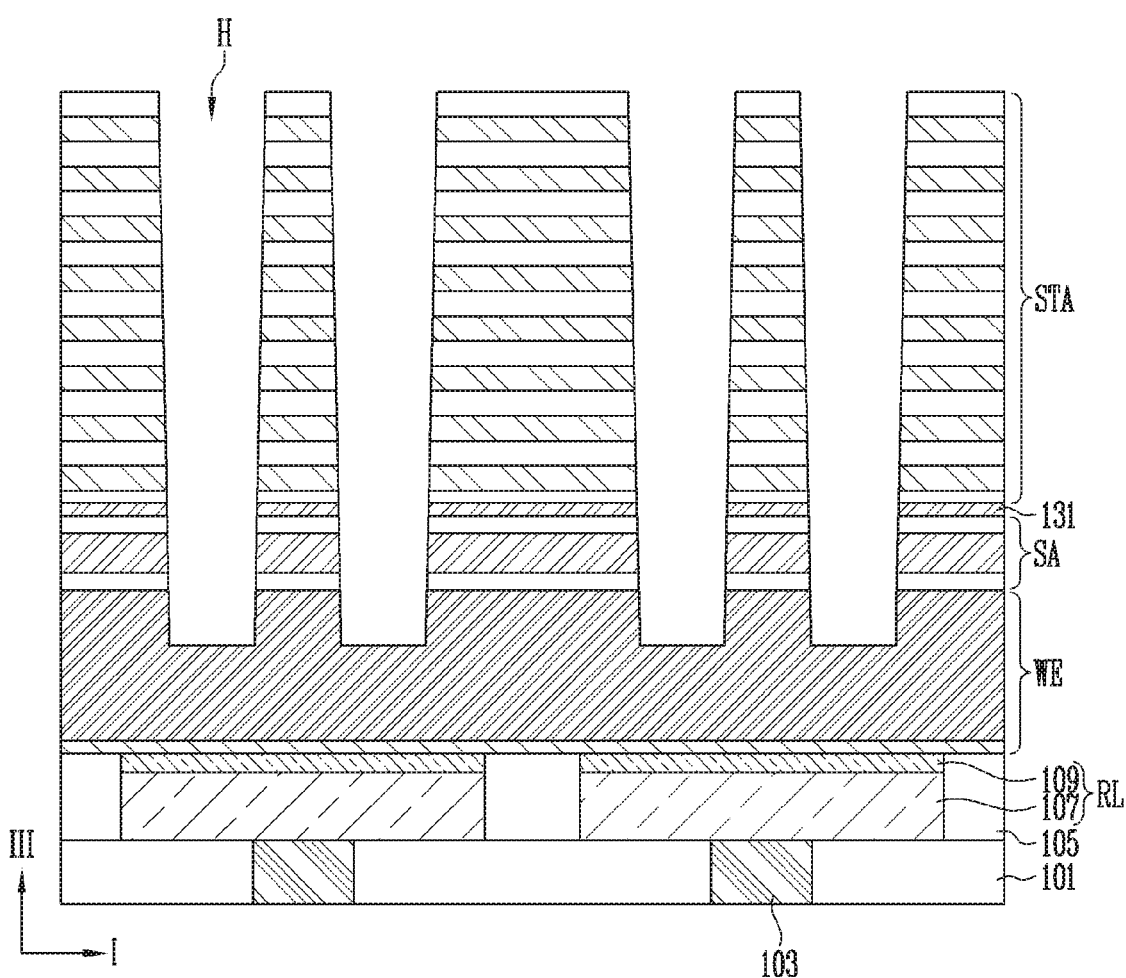
FIGS. 8A to 8C are cross-sectional views illustrating step ST11 shown in FIG. 3.
Figure 8B:
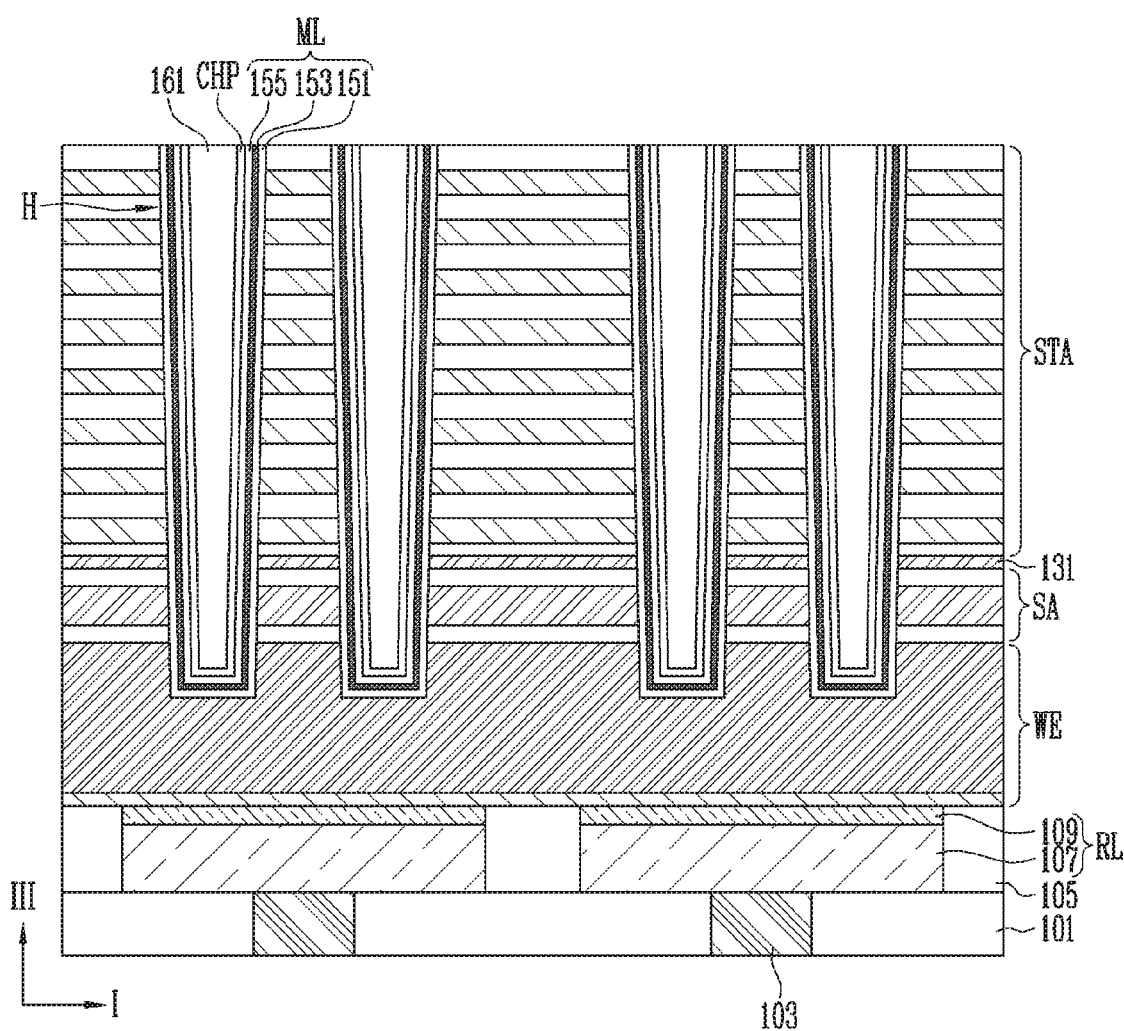
Figure 8C:
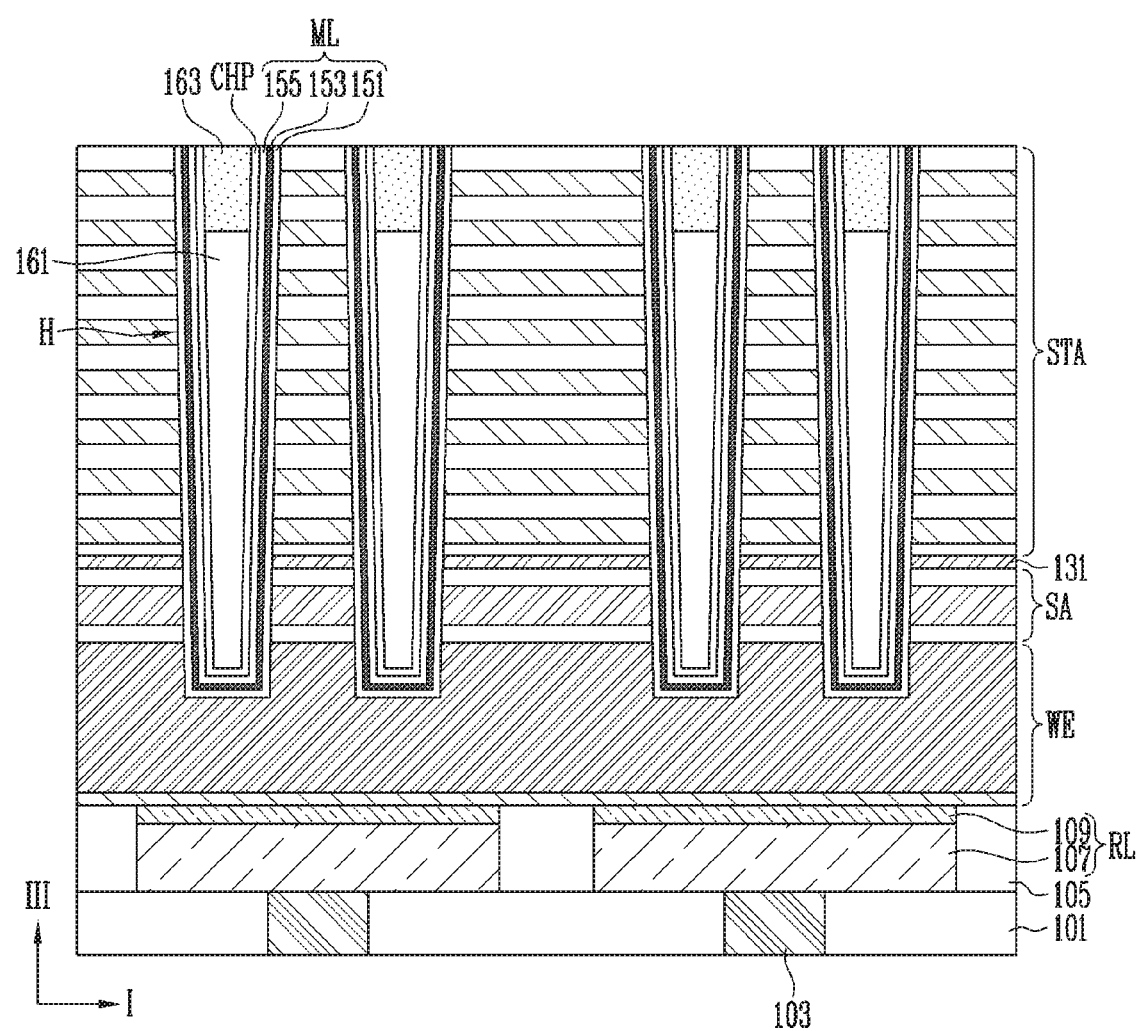

FIGS. 8A to 8C are cross-sectional views illustrating step ST11 shown in FIG. 3.

Referring to FIG. 8A, step ST11 may include forming the holes H passing through the stack structure STA to extend into the well structure WE. The holes H may pass through the auxiliary channel layer 131 and the sacrificial group SA under the stack structure STA, and may extend into the well structure WE.

Referring to FIG. 8B, step ST11 may further include forming a multilayer memory layer ML on a surface of each of the holes H. The multilayer memory layer ML may be formed by sequentially stacking the blocking insulating layer 151, the data storage layer 153, and the tunnel insulating layer 155 on one another. The multilayer memory layer ML may be planarized to expose a top surface of the stack structure STA.

Step ST11 may include forming the channel pillars CHP on the multilayer memory layer ML, Forming the channel pillar CHP may include forming a semiconductor layer on the multilayer memory layer ML and planarizing a surface of the semiconductor layer to expose a top surface of the stack structure STA. The channel pillars CHP may be formed in the holes H. Each of the channel pillars CHP may completely fill each of the holes H, or open a central portion of each of the holes H.

When each of the central portions of the holes H is opened by each of the channel pillars CHP, the central portion of each of the holes H may be filled with the core insulating layer 161.

Referring to FIG. 8C, step ST11 may further include forming the capping pattern 163 on the core insulating layer 161. To this end, an upper end of each of the holes H may be opened by recessing an upper end of the core insulating layer 161. Accordingly, the height of the core insulating layer 161 may be formed lower than the height of each of the holes H and the height of the channel pillar CHP. Subsequently, the capping pattern 163 filled in the upper end of each of the holes H may be formed on the core insulating layer 161 of which height is lowered. The capping pattern 163 may include a semiconductor material and include a second conductivity type impurity.

Figure 9:
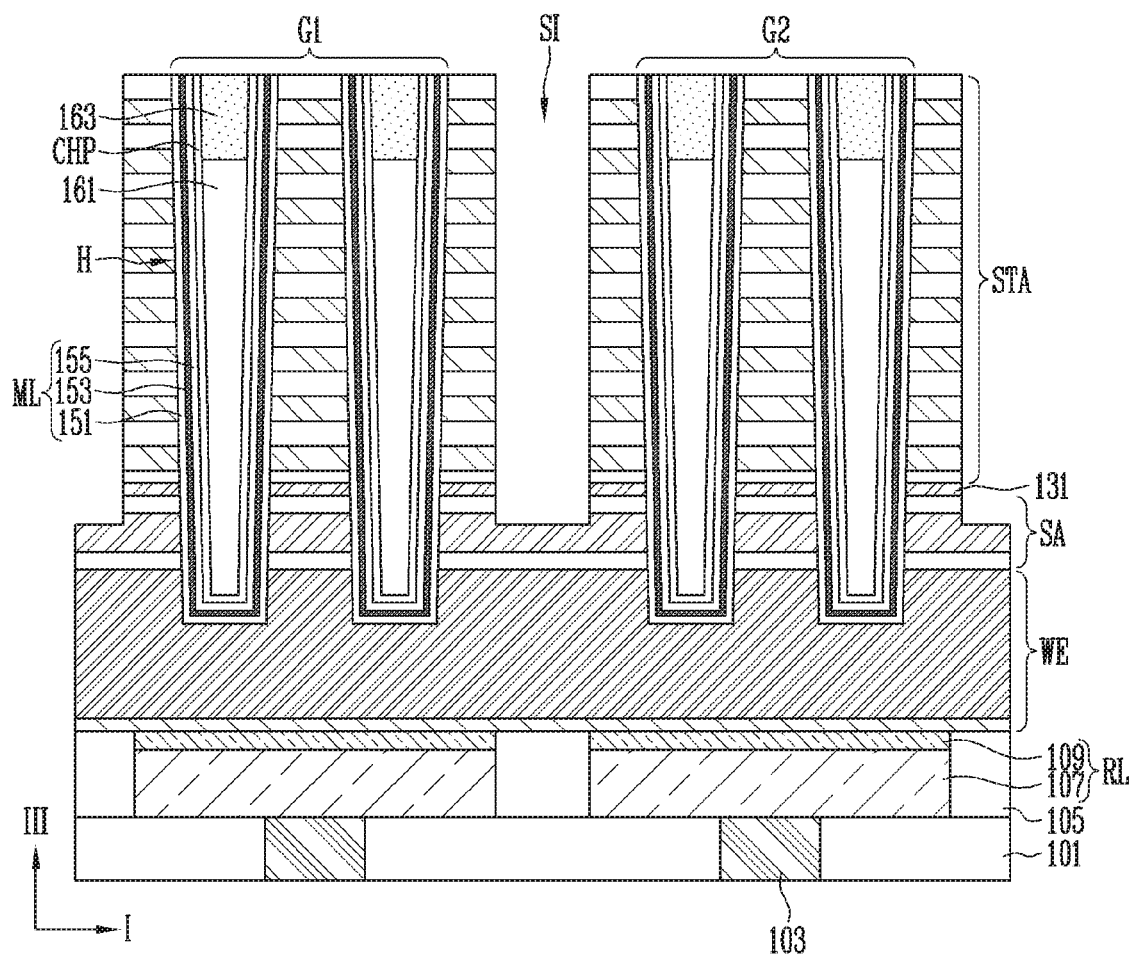
FIG. 9 is a cross-sectional view illustrating step ST13 shown in FIG. 3.

FIG. 9 is a cross-sectional view illustrating step ST13 shown in FIG. 3.

Referring to FIGS. 3 and 9, after step ST11, step ST13 for forming the slit SI may be performed. The slit SI may pass through the stack structure STA and the auxiliary channel layer 131 and extend into the sacrificial group SA. The slit SI may be formed between cell plugs of the first group G1 and cell plugs of the second group G2. The stack structure STA may be divided into a first sub-stack structure surrounding the cell plugs of the first group G1 and a second sub-stack structure surrounding the cell plugs of the second group G2 by the slit SI.

Referring to FIG. 3, after step ST13, step ST15 for replacing the first material layers 141 or the second material layers 143 by third material layers 171 may be performed. When the first material layers 141 are replaced by the third material layers 171, the third material layers 171 may be insulating materials. When the second material layers 143 are replaced by the third material layers 171, the third material layers may be conductive materials.

Figure 10A:
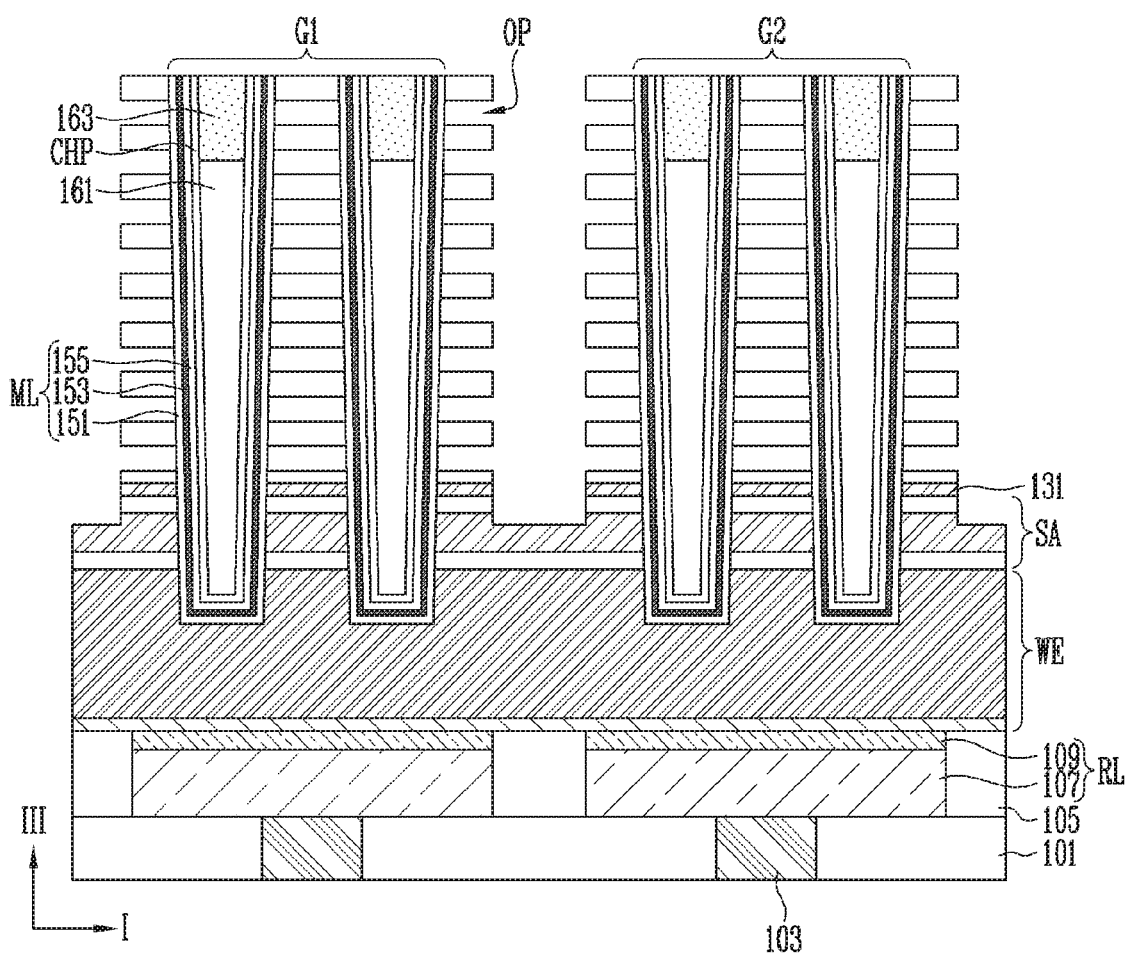
FIGS. 10A and 10B are cross-sectional views illustrating step ST15 shown in FIG. 3.
Figure 10B:
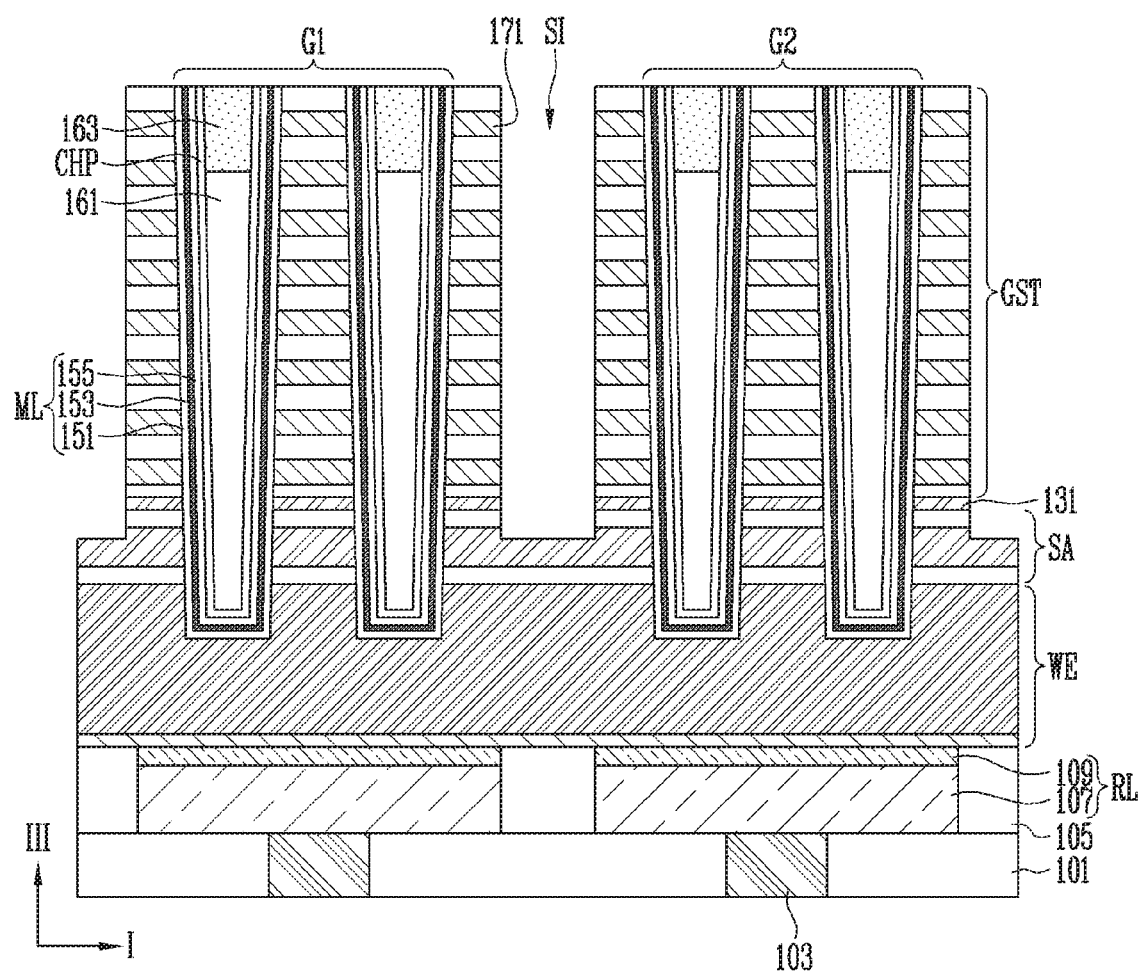

FIGS. 10A and 10B are cross-sectional views illustrating step ST15 shown in FIG. 3. Hereinafter, for convenience of explanation, only an example in which the first material layers 141 are insulating layers and the second material layers 143 are sacrificial insulating materials having a different etch rate from the first material layers 141 will be described. However, embodiments are not limited thereto.

Referring to FIG. 10A, step ST15 may include forming openings OP by selectively removing the second material layers 143.

Referring to FIG. 10B, step ST15 may include filling the openings OP with the third material layers 171 which are conductive materials. The third material layers 171 may correspond to the conductive patterns CP1 to CPn illustrated in FIG. 1. Although not illustrated in FIG. 10B, before forming the third material layers 171 which are conductive materials, at least one of a barrier layer or the blocking insulating layer 151 may be further formed along a surface of each of the third material layers 171.

Through the above-described step ST15, the gate stack structure GST penetrated by the slit SI and including the insulating layers and the conductive patterns that are alternately stacked on one another may be formed.

When the first material layers are insulating layers and the second material layers are conductive layers, step ST15 may be omitted.

Referring to FIG. 3, after step ST13 or ST15, step ST17 for forming a spacer insulating layer 173 and a multilayer protective layer MPL, and step S19 for opening a horizontal space may be sequentially performed.

FIGS. 11A to 11E are cross-sectional views illustrating steps ST17 and ST19 shown in FIG. 3.

Figure 11A:
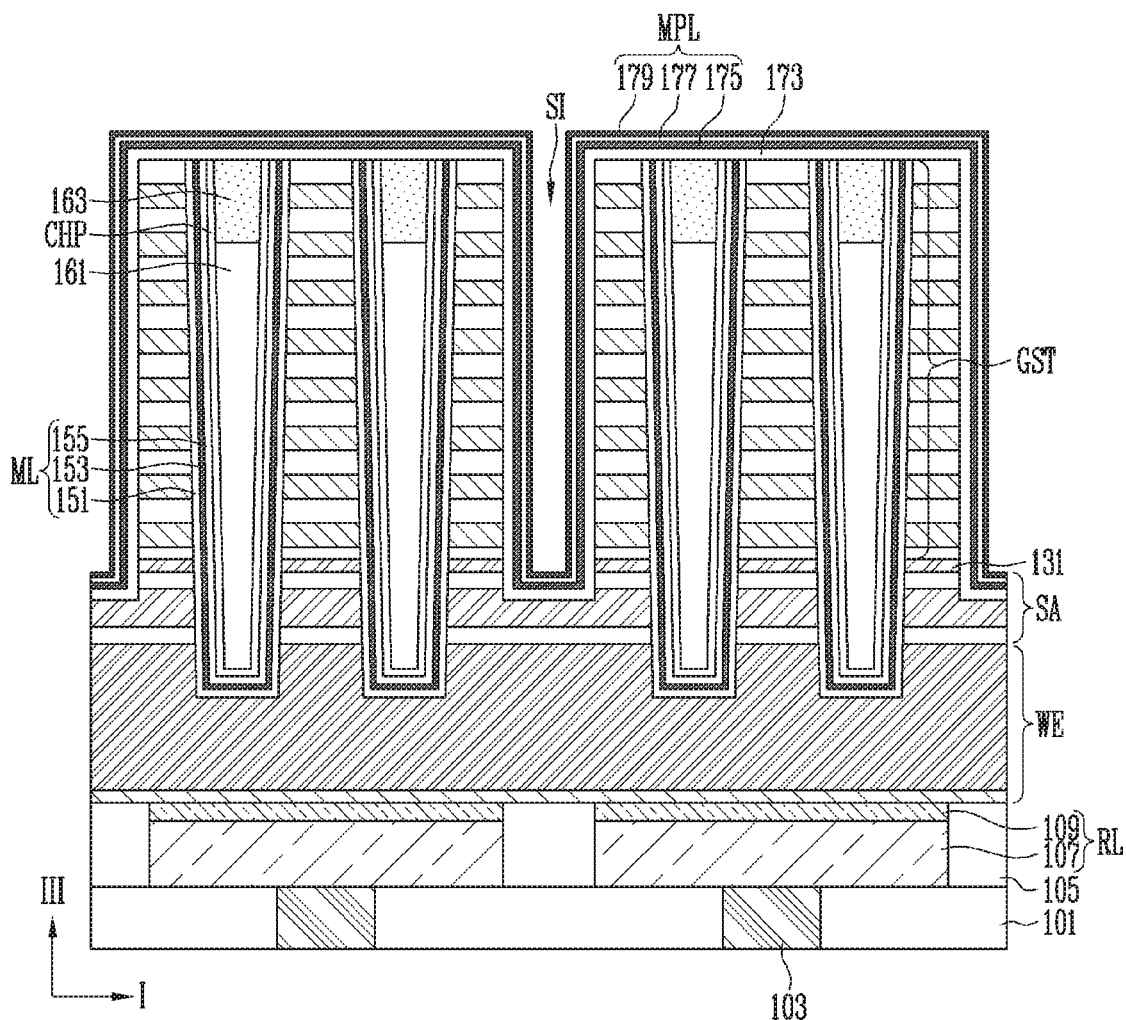
FIGS. 11A to 11E are cross-sectional views illustrating steps ST17 and ST19 shown in FIG. 3.

Referring to FIG. 11A, step ST17 may include forming the spacer insulating layer 173 along a surface of the slit SI and a surface of the gate stack structure GST, and forming the multilayer protective layer MPL on the spacer insulating layer 173.

The spacer insulating layer 173 may have a sufficient thickness to electrically separate the third material layers 171 which are conductive materials from the common source line CSL to be formed during subsequent processes. The spacer insulating layer 173 may include an oxide.

The multilayer protective layer MLP may include a first protective layer 175, a second protective layer 177, and a third protective layer 179 sequentially stacked on one another. The first protective layer 175 may include an insulating material having a different etch rate from the blocking insulating layer 151, the second protective layer 177 may include an insulating material having a different etch rate from the data storage layer 153, and the third protective layer 179 may include an insulating material having a different etch rate from the tunnel insulating layer 155. The first protective layer 175 and the third protective layer 179 may include the same material as the data storage layer 153. For more specific example, the first protective layer 175 and the third protective layer 179 may include a nitride layer. The second protective layer 177 may include an oxide layer.

Figure 11B:
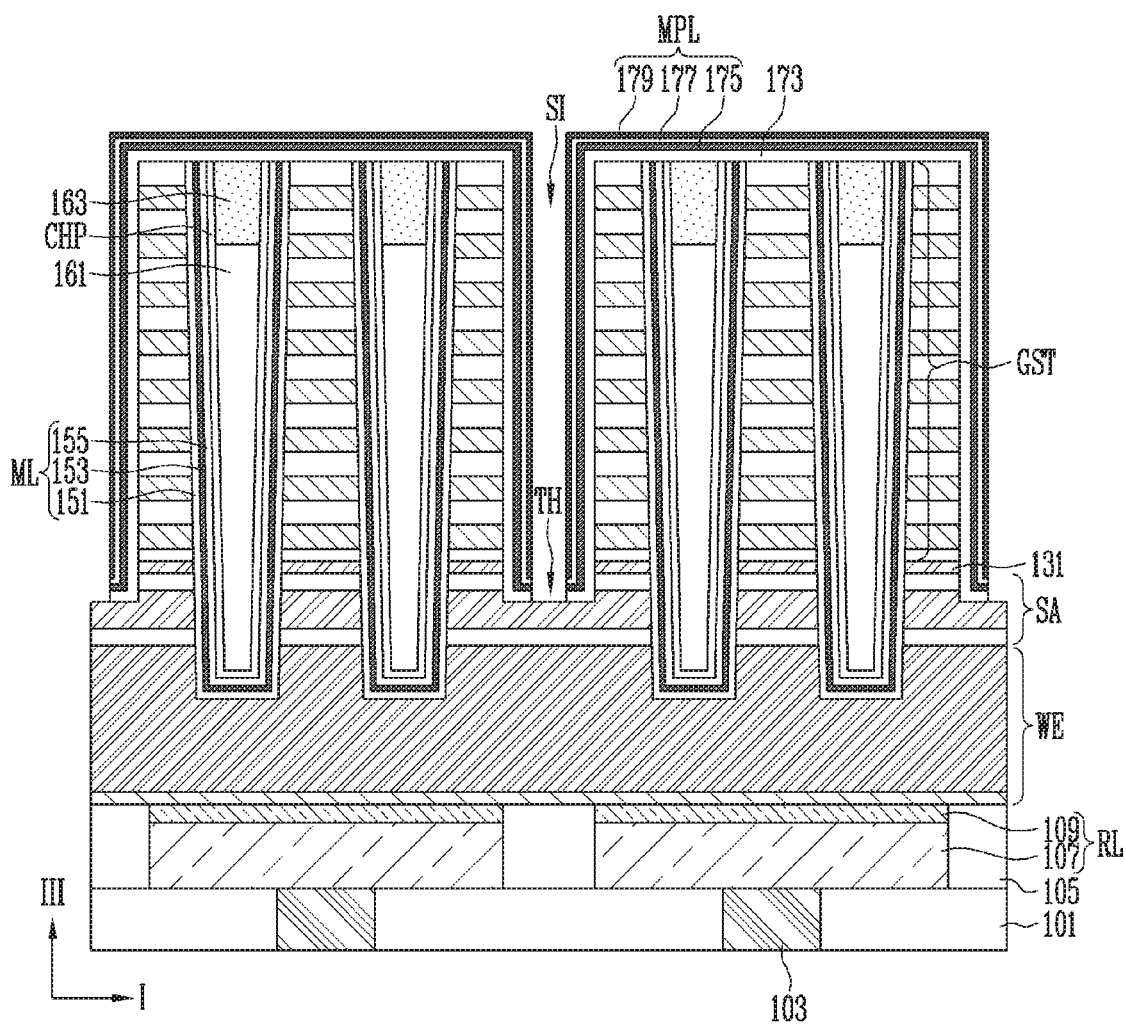

Referring to FIG. 11B, step ST19 may further include forming a through portion TH by removing portions of a spacer insulating layer 173 and the multilayer protective layer MPL, respectively, so as to expose the sacrificial group SA through a bottom surface of the slit SI. An etch-back process may be used to form the through portion TH. The spacer insulating layer 173 and the multilayer protective layer MPL may remain on a sidewall of the slit SI.

Figure 11C:
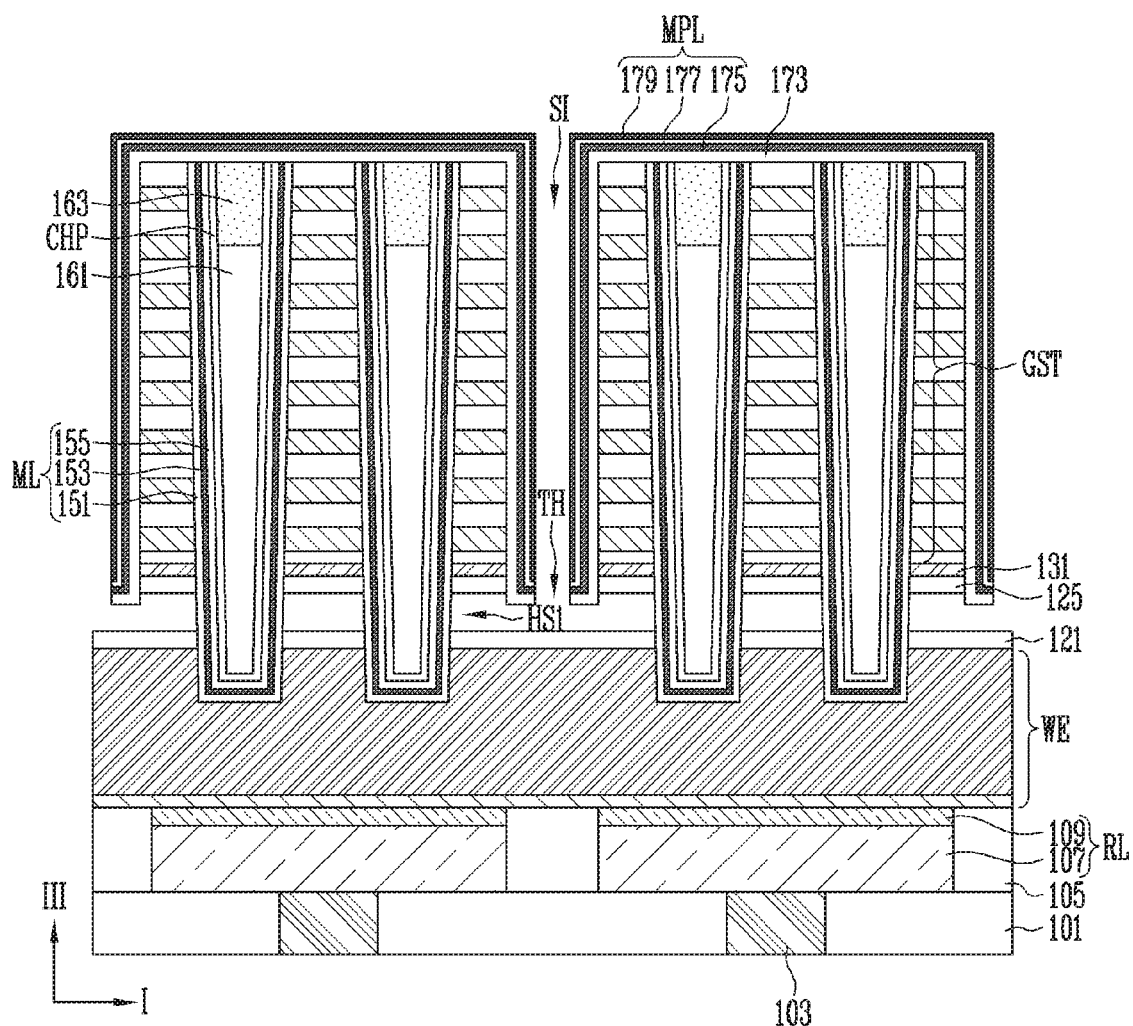

Referring to FIG. 11C, step ST19 may include removing the second sacrificial layer 123 of the sacrificial group SA through the slit SI and the through portion TH. As the second sacrificial layer 123 is removed, a first horizontal space HS1 exposing the multilayer memory layer ML may be opened. When the second sacrificial layer 123 is removed, the well structure WE and the auxiliary channel layer 131 may be protected by the first sacrificial layer 121 and the third sacrificial layer 125 which have markedly lower etch rates than the second sacrificial layer 123. In addition, the gate stack structure GST may be protected by the multilayer protective layer MPL.

Figure 11D:
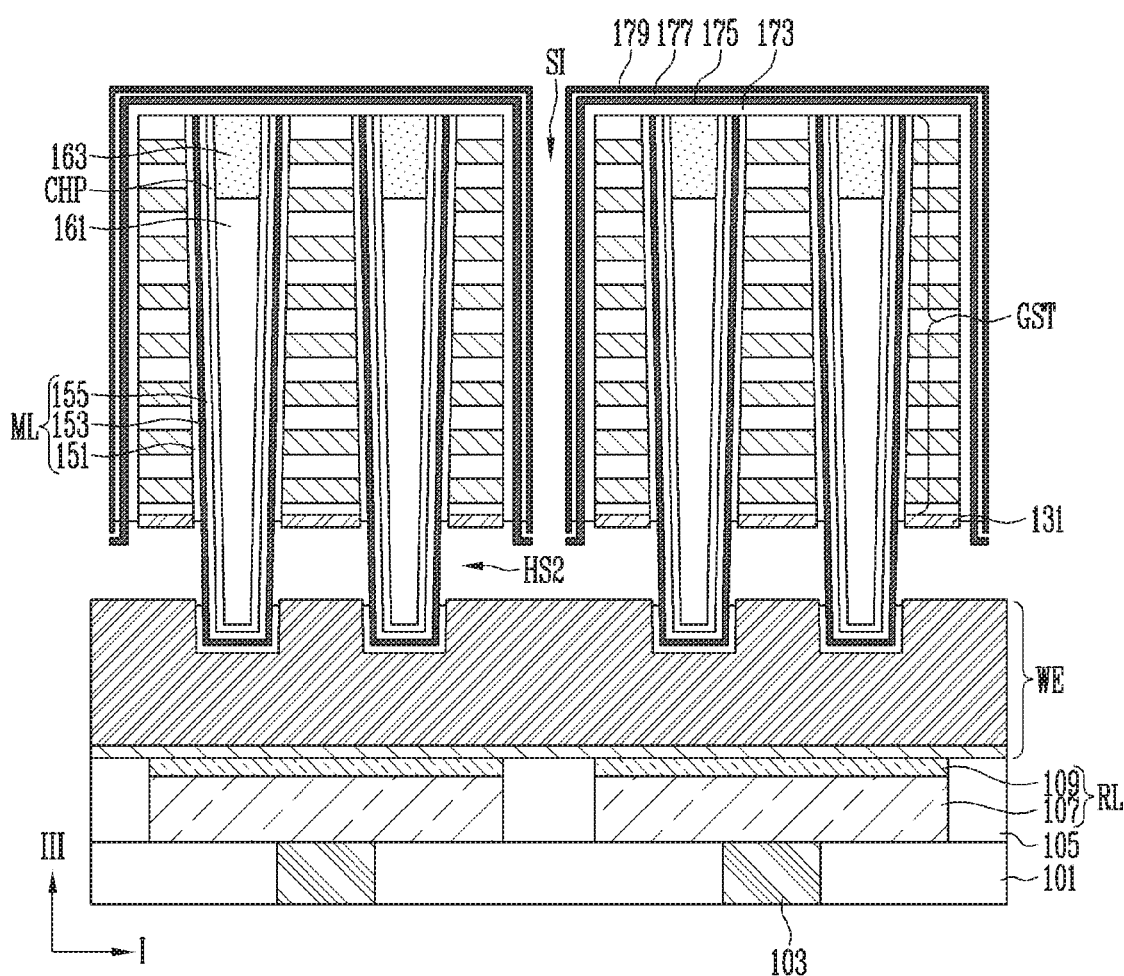

Referring to FIG. 11D, step ST19 may include removing the first sacrificial layer 121 and the third sacrificial layer 125 of the sacrificial group SA through the slit SI and the first horizontal space HS1. As the first sacrificial layer 121 and the third sacrificial layer 125 are removed, a second horizontal space HS2 exposing the auxiliary channel layer 131 and the well structure WE as well as the multilayer memory layer ML may be opened. Since the first sacrificial layer 121 and the third sacrificial layer 125 include material layers having different etch rates from the auxiliary channel layer 131 and the well structure WE, according to an embodiment, the first sacrificial layer 121 and the third sacrificial layer 125 may be selectively etched by minimizing damage to the auxiliary channel layer 131 and the well structure WE.

When the first sacrificial layer 121 and the third sacrificial layer 125 are etched, portions of the spacer insulating layer 173 and the second protective layer 177 which are adjacent to the first horizontal space HS1 may be removed. On the contrary, the first protective layer 175 and the third protective layer 179 having different etch rates from the first sacrificial layer 121 and the third sacrificial layer 125 may scarcely be etched when the second horizontal space HS2 is opened.

Step ST19 may include removing the blocking insulating layer 151 through the slit SI and the second horizontal space HS2. Accordingly, the data storage layer 153 may be exposed through the second horizontal space HS2. When the blocking insulating layer 151 is removed, the third protective layer 179 having a different etch rate from the blocking insulating layer 151 may remain but not be removed to protect the gate stack structure GST and the spacer insulating layer 173.

Through the process described above, the second horizontal space HS2 may extend between the auxiliary channel layer 131 and the first protective layer 175, and between the first protective layer 175 and the third protective layer 179. In addition, the first protective layer 175 and the third protective layer 179 may remain in a state in which the first protective layer 175 and the third protective layer 179 protrude farther towards the well structure WE than the second protective layer 177.

Figure 11E:
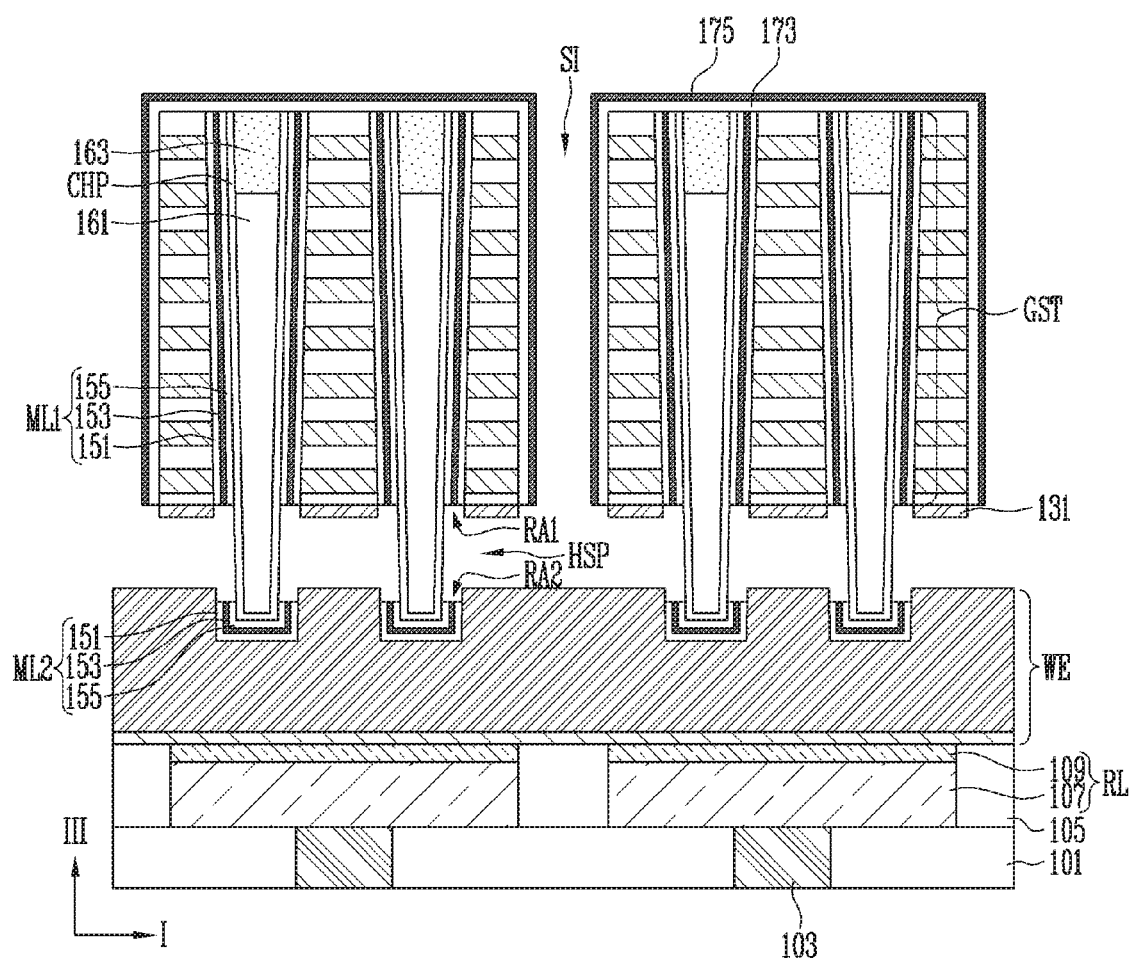

Referring to FIG. 11E, step ST19 may remove the data storage layer 153 and the tunnel insulating layer 155 through the slit SI and the second horizontal space HS2. Accordingly, the horizontal space HSP as a target may be opened. The sidewall of the channel pillar CHP passing through the gate stack structure GST and extending into the well structure WE may be exposed by the horizontal space HSP.

When the data storage layer 153 is removed so as to form the horizontal space HSP, the third protective layer 179 may be removed to expose the second protective layer 177. Since the second protective layer 177 has a different etch rate from the data storage layer 153, when the data storage layer 153 is removed, the second protective layer 177 may remain but not be removed to protect the gate stack structure GST and the spacer insulating layer 173. Subsequently, when the tunnel insulating layer 155 which is exposed by removing the data storage layer 153 is removed, the second protective layer 177 may be removed to expose the first protective layer 175. Since the first protective layer 175 has a different etch rate from the tunnel insulating layer 155, when the tunnel insulating layer 155 is removed, the first protective layer 175 may remain but not be removed to protect the gate stack structure GST and the spacer insulating layer 173.

When the horizontal space HSP is opened, a portion of the multilayer memory layer ML between the auxiliary channel layer 131 and the channel pillar CHP and a portion of the multilayer memory layer ML between the well structure WE and the channel pillar CHP. Accordingly, a first ring type groove RA1 may be formed between the auxiliary channel layer 131 and the channel pillar CHP and a second ring type groove RA2 may be formed between the well structure WE and the channel pillar CHP.

The multilayer memory layer ML may be divided into the first multilayer memory pattern ML1 disposed between the gate stack structure GST and the channel pillar CHP, and the second multilayer memory pattern ML2 disposed between the channel pillar CHP and the well structure WE by the horizontal space HSP.

Referring to FIG. 3, after step ST19, step ST21 for forming the select channel pattern CHS surrounding the gap-fill insulating layer FI may be performed.

Figure 12A:
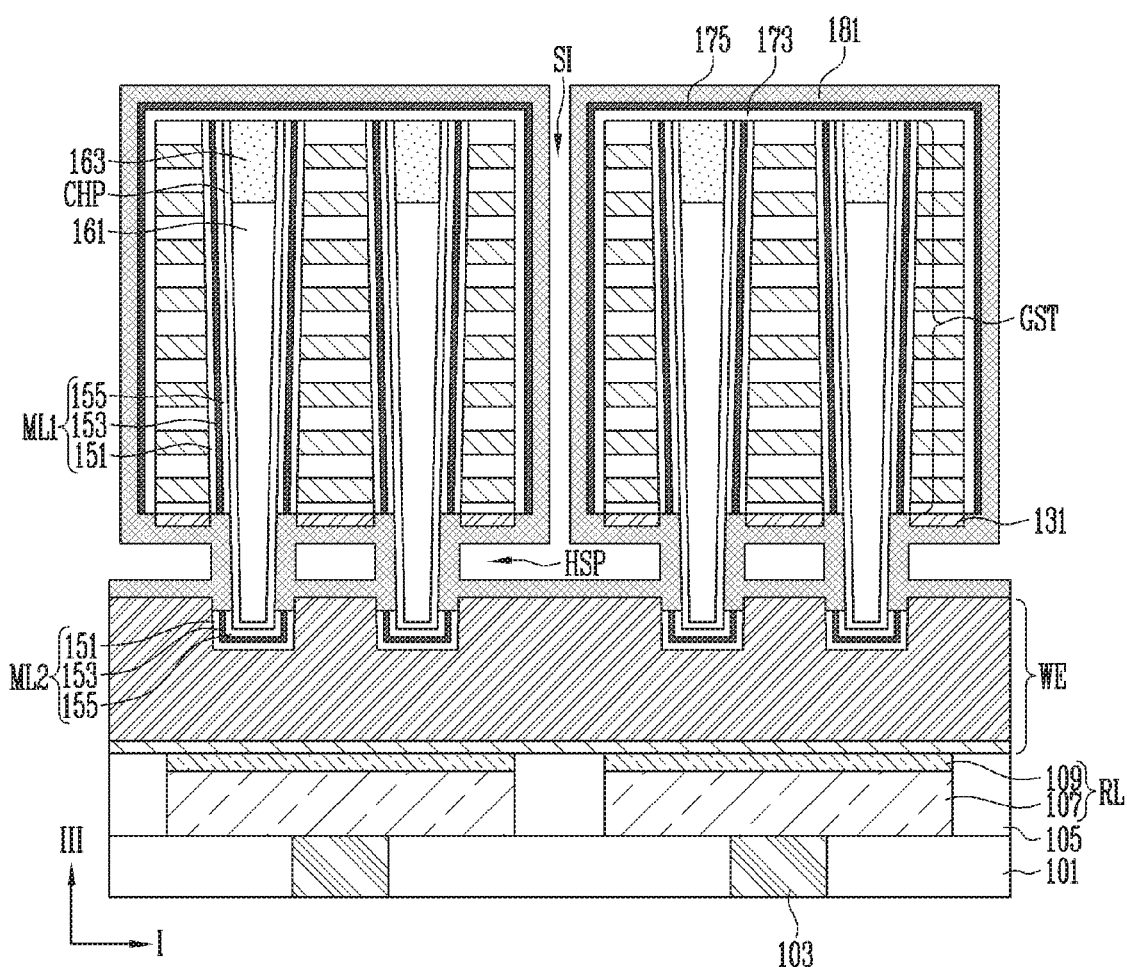
FIGS. 12A to 12C are cross-sectional views illustrating an example of step ST21 shown in FIG. 3.
Figure 12B:
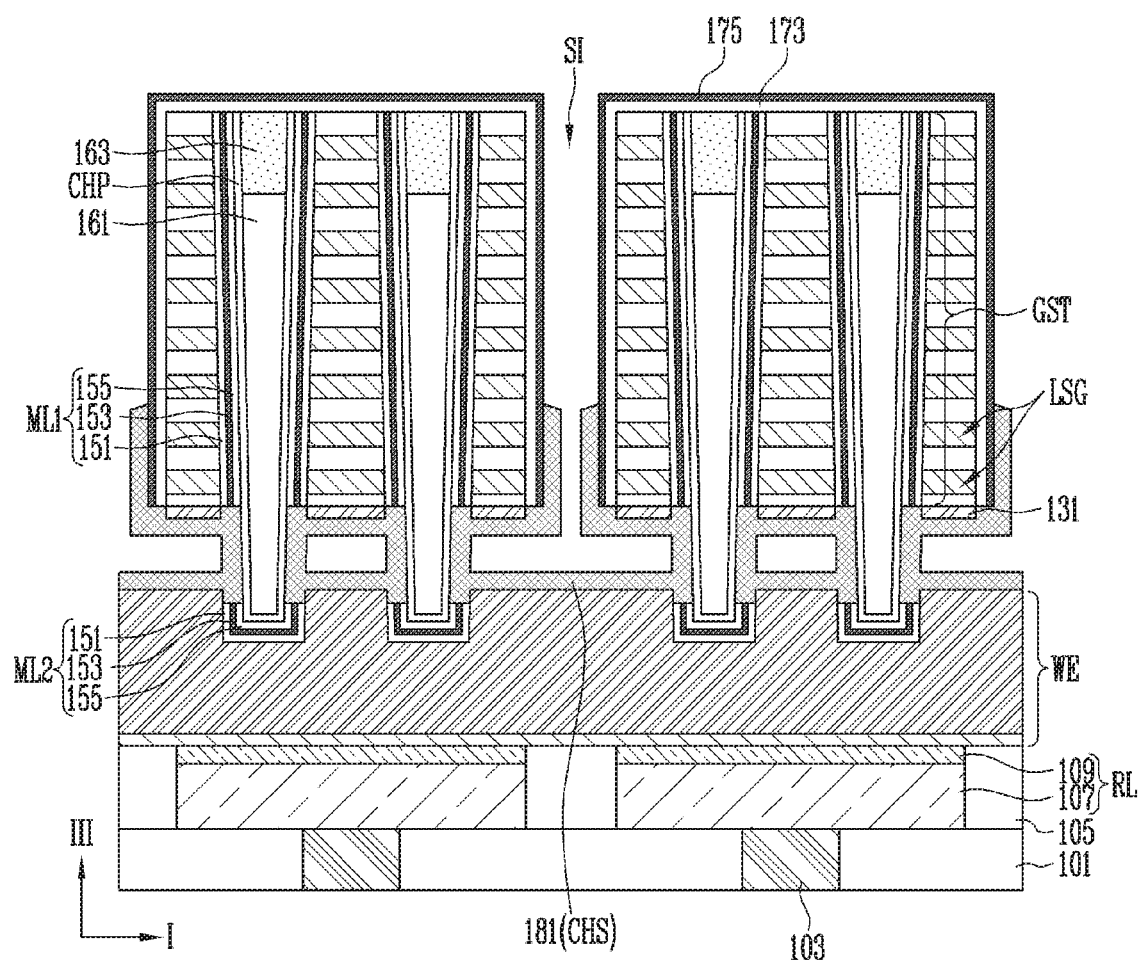
Figure 12C:
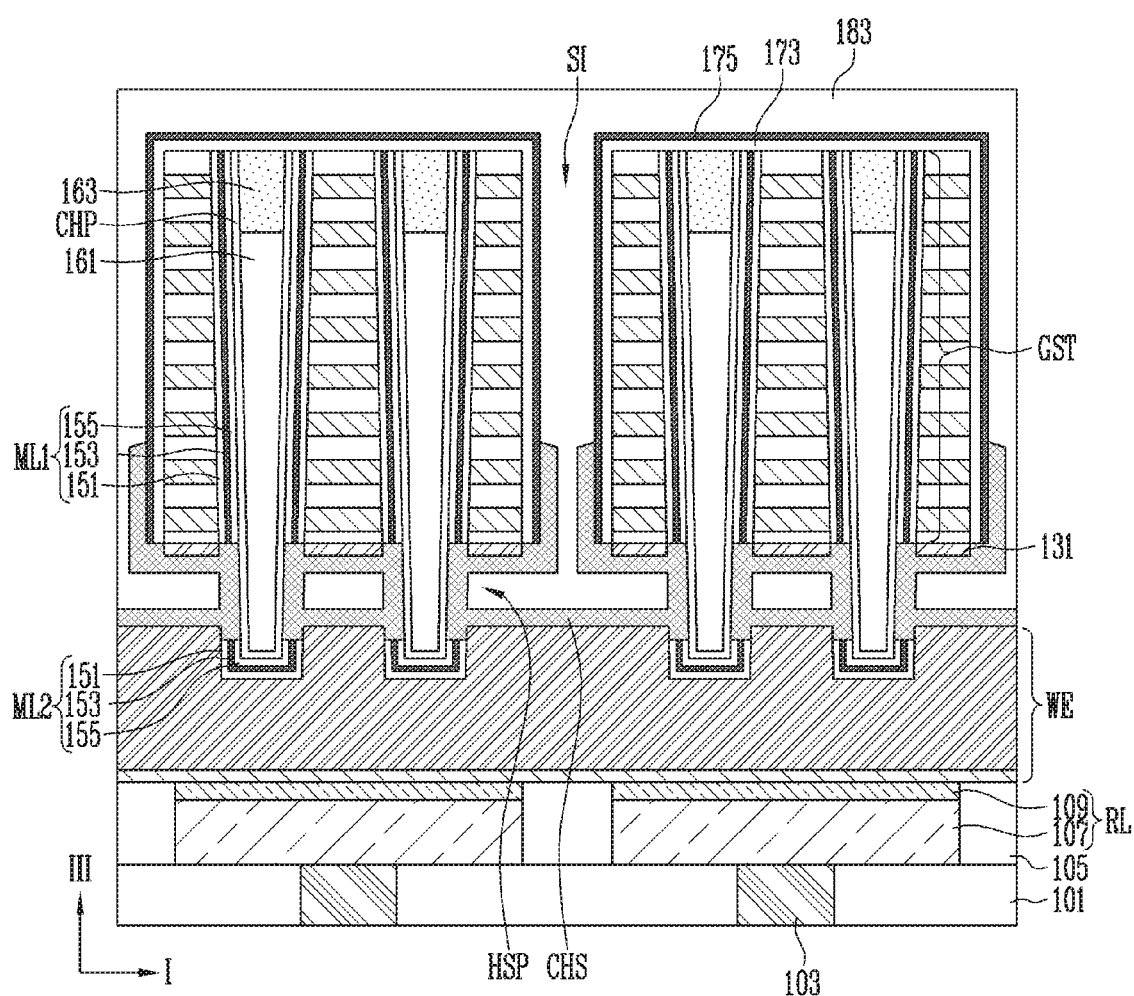

FIGS. 12A to 12C are cross-sectional views illustrating an example of step ST21 shown in FIG. 3.

Referring to FIG. 12A, step ST21 may include forming a semiconductor layer 181 along a surface of the horizontal space HSP and a surface of the slit SI. The semiconductor layer 181 may directly contact the sidewall of the channel pillar CHP and the well structure WE which are exposed by the horizontal space HSP. The semiconductor layer 181 may directly contact the auxiliary channel layer 131 exposed by the horizontal space HSP.

The semiconductor layer 181 may serve as a channel. The semiconductor layer 181 may include various materials, for example, the semiconductor layer 181 may be a polysilicon layer. The semiconductor layer 181 may be formed by using a selective growth method in which at least one of the channel pillar CHP, the well structure WE, and the auxiliary channel layer 131 serves as a seed layer (for example, Selective Epitaxial Growth (SEG)). On the contrary, the semiconductor layer 181 may be formed by using a deposition method (for example, Chemical Vapor Deposition (CVD)). Although an example in which the semiconductor layer 181 is formed using a deposition method is illustrated in FIG. 12A, these embodiments may not be limited thereto. When a deposition method is used, the semiconductor layer 181 may be coupled to the channel pillar CHP to extend into the slit SI.

Referring to FIG. 12B, step ST21 may include patterning the select channel pattern CHS by removing a portion of the semiconductor layer 181. The select channel pattern CHS may remain lower than the slit SI and at the same height as the lower select gate group LSG adjacent to the well structure WE among the gate stack structure GST. An etch-back process may be used to remove the semiconductor layer 181.

The select channel pattern CHS may remain to fill the first and second ring type grooves RA1 and RA2 of FIG. 11E, and to directly contact the well structure WE, the auxiliary channel layer 131, and the channel pillar CHP.

Referring to FIG. 12C, step ST21 may further include filling the slit SI and the horizontal space HSP which are opened by the select channel pattern CHS with an insulating material 183, The insulating material 183 may be etched to be patterned to the gap-fill insulating pattern F1 during subsequent processes.

Figure 13A:
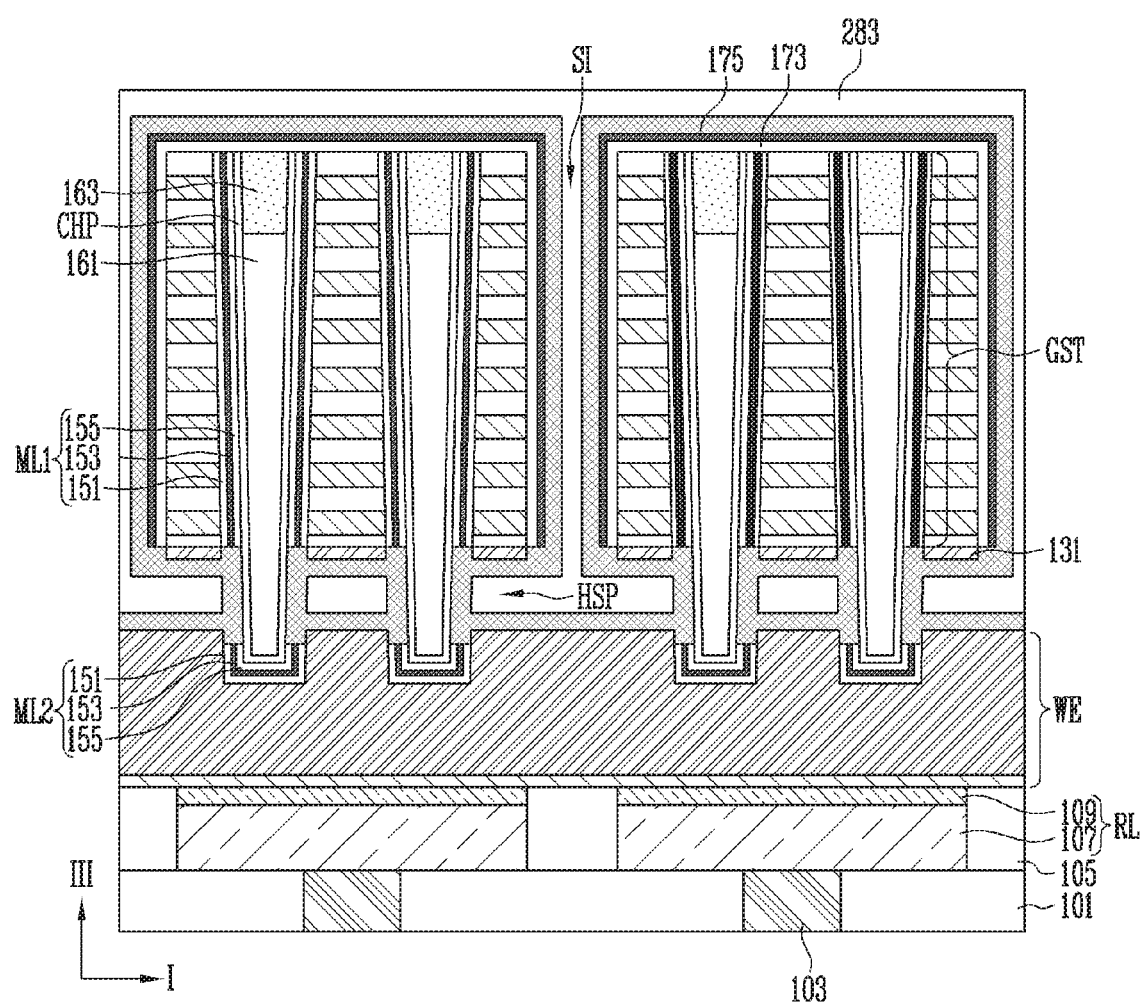
FIGS. 13A and 13B are cross-sectional views illustrating another example of step ST21 shown in FIG. 3.
Figure 13B:
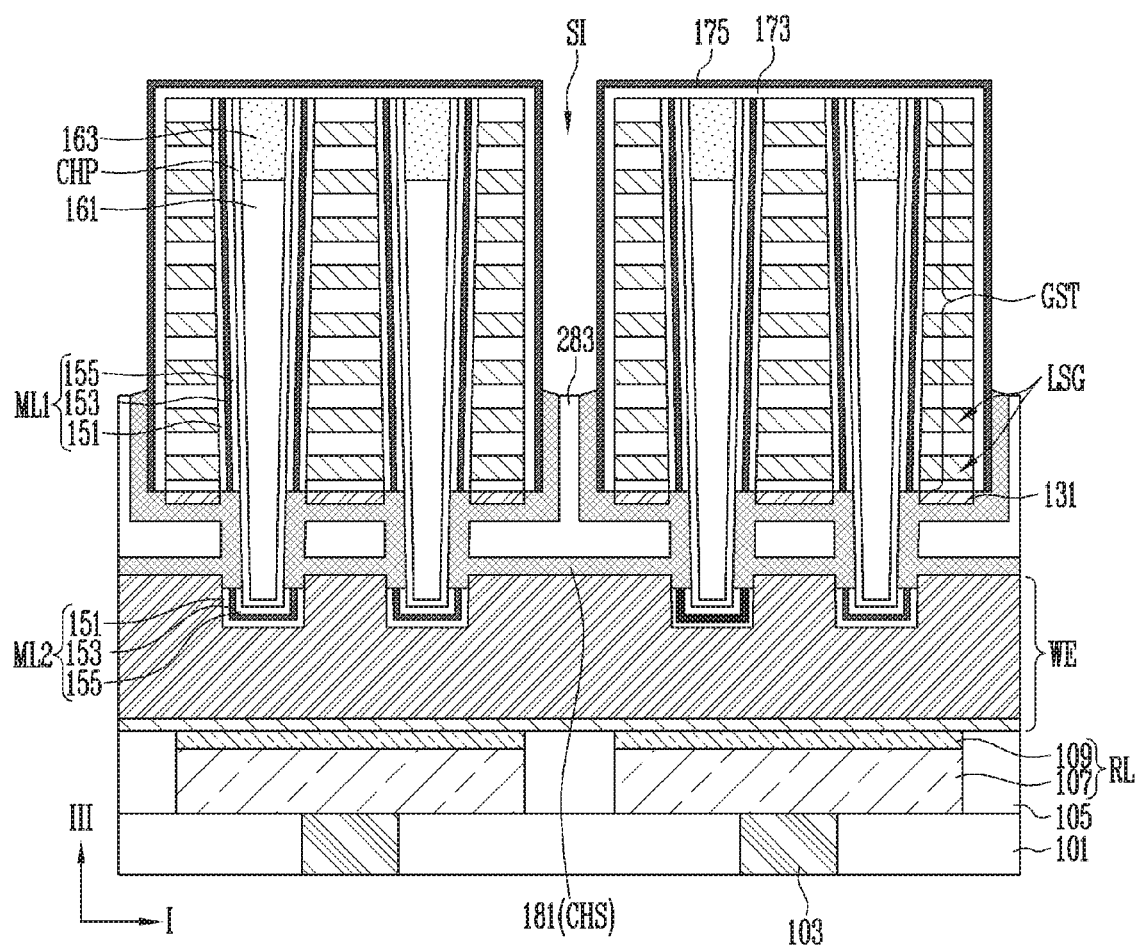

FIGS. 13A and 13B are cross-sectional views illustrating another example of step ST21 shown in FIG. 3.

Referring to FIG. 13A, as described in FIG. 12A, step ST21 may include forming the semiconductor layer 181 along the surface of the horizontal space HSP and the surface of the slit SI. Subsequently, before the semiconductor layer 181 is patterned to the select channel pattern CHS, the slit SI and the horizontal space HSP which are opened by the semiconductor layer 181 may be filled with an insulating material 283.

Referring to FIG. 13B, step ST21 may further include primarily etching the insulating material 283 by an etching process such as an etch-back process. The primarily etched insulating material 283 may remain lower than the slit SI and at the same height as the lower select gate group LSG adjacent to the well structure WE among the gate stack structure GST.

Step ST21 may include patterning the select channel pattern CHS by using the primarily etched insulating material 283 as an etching barrier to etch the semiconductor layer 181. The primarily etched insulating material 283 may be secondarily etched to be patterned to the gap-fill insulating pattern F1 during subsequent processes.

As describe above, in step ST21, various methods may be used to form the select channel pattern CHS surrounding the insulating material.

Referring to FIG. 3, after step ST21, step ST23 for forming the source junction 53 may be performed.

Figure 14A:
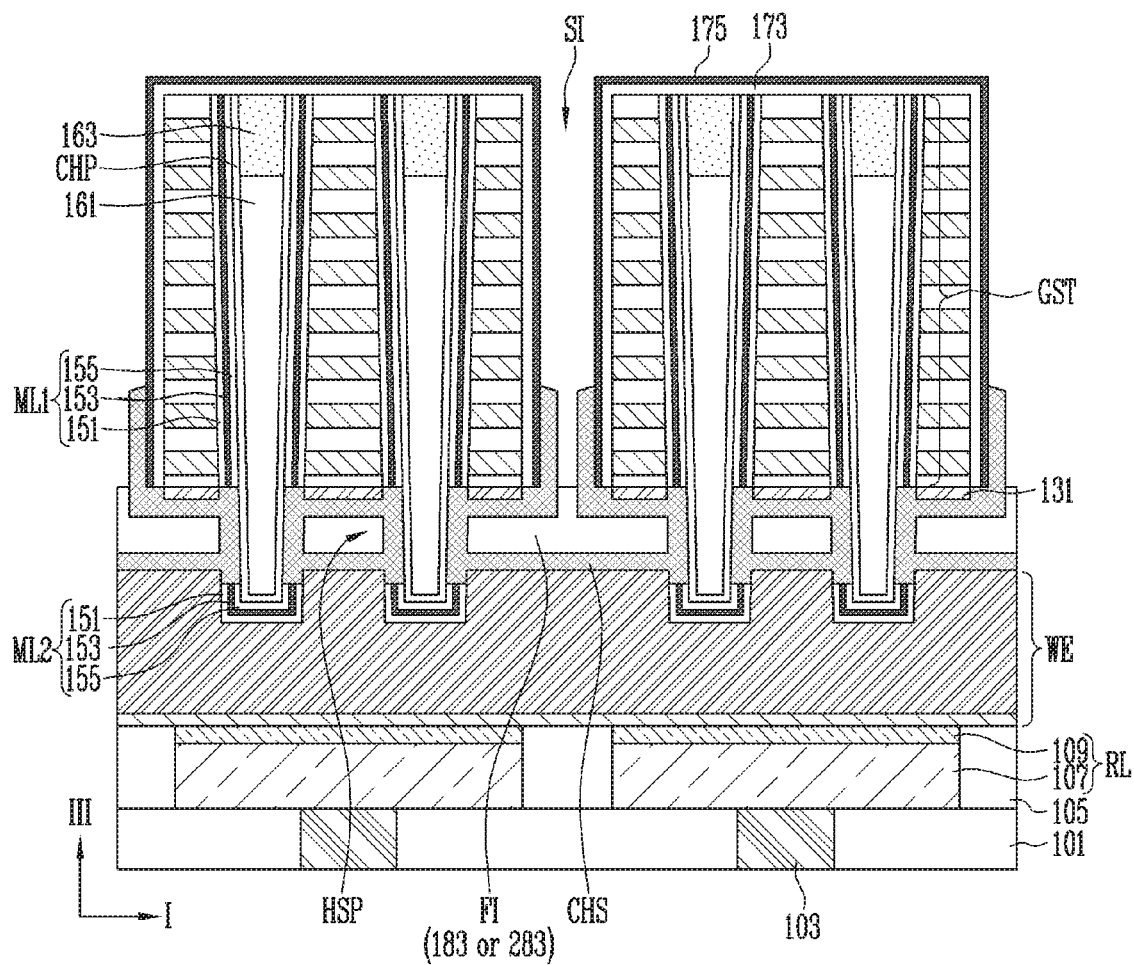
FIGS. 14A to 14C are cross-sectional views illustrating step ST23 shown in FIG. 3.
Figure 14B:
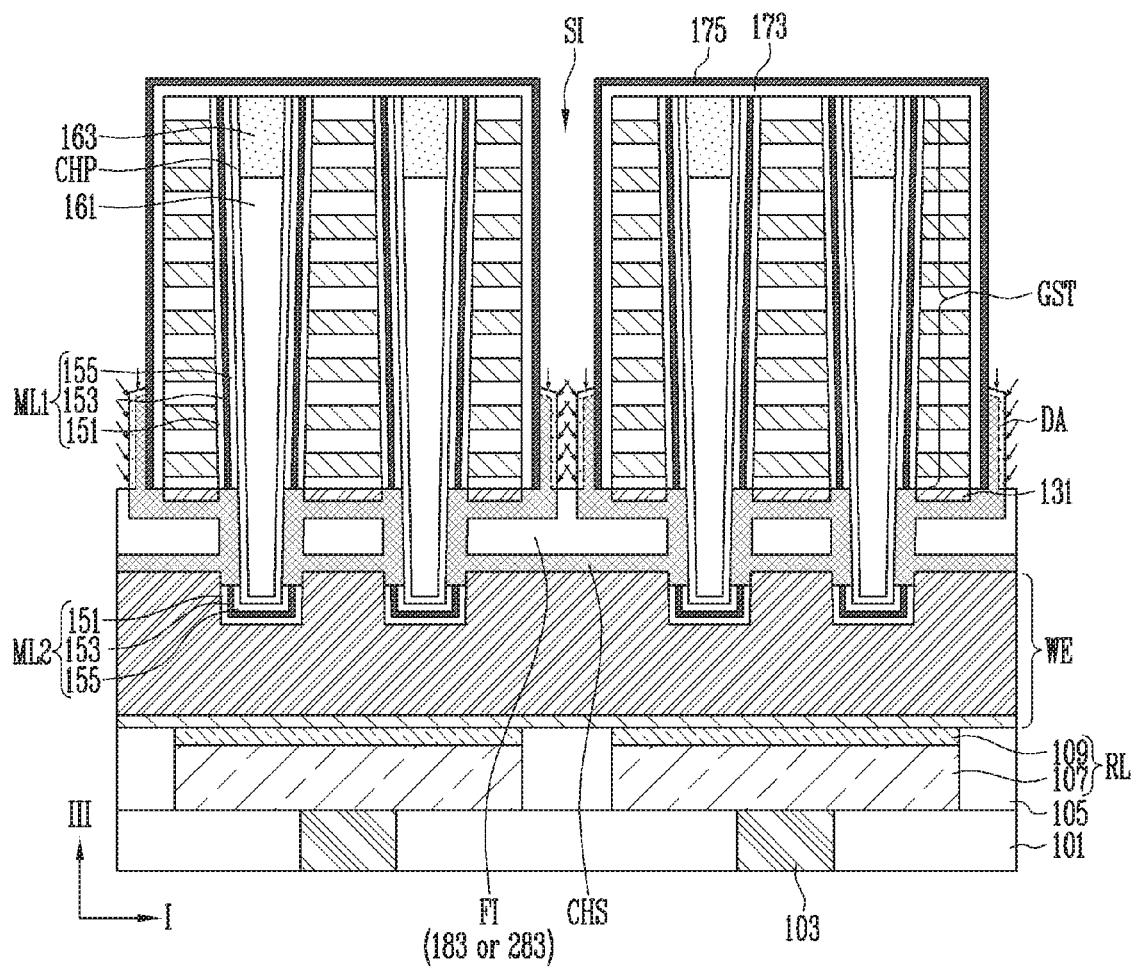
Figure 14C:
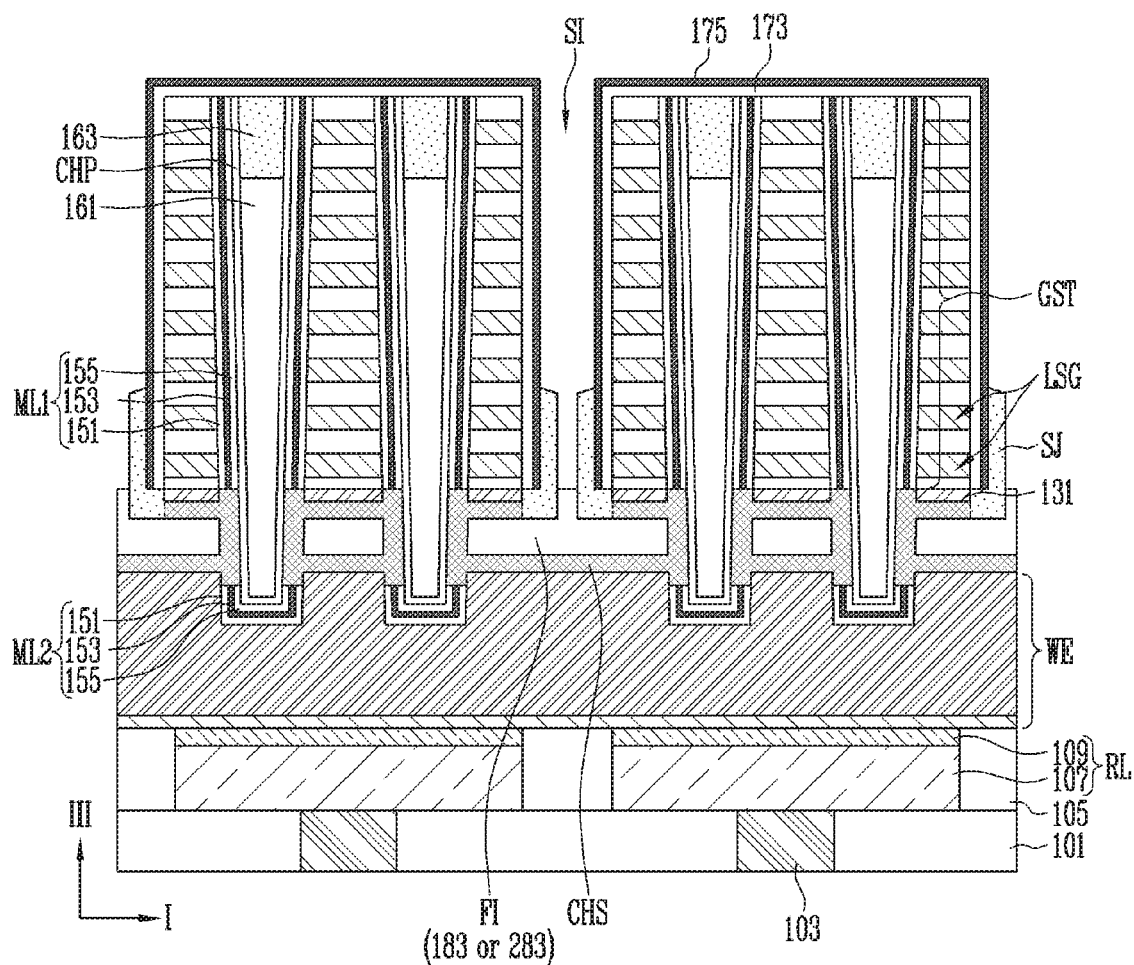

FIGS. 14A to 14C are cross-sectional views illustrating step ST23 shown in FIG. 3.

Referring to FIG. 14A, step ST23 may include patterning the gap-fill insulating pattern F1 by performing the etching processes for lowering the height of the insulating material 183 as illustrated in FIG. 12C or the insulating material 283 as illustrated in FIG. 13B.

The gap-fill insulating pattern FI may be formed by recessing the insulating material 183 or 283 so as to expose an end portion of the select channel pattern CHS protruding into the slit SI, The gap-fill insulating pattern F1 may remain to fill the horizontal space HSP, and the select channel pattern CHS may surround the gap-fill insulating pattern F1 and protrude farther into the slit SI than the gap-fill insulating pattern FI to extend on the sidewall of the slit SI.

Referring to FIG. 14B, step ST23 may include forming a doping region DA by injecting a second conductivity type impurity. The second conductivity type impurity may be the same conductivity type as an impurity included in the capping pattern 163, and may be a different conductivity type from an impurity included in the well structure WE. A plasma doping process or a tilt ion implantation process may be performed to form the doping region DA.

The doping region DA may be formed by injecting the second conductivity type impurity to a predetermined thickness from a surface of an end portion of the select channel pattern CHS protruding farther than the gap-fill insulating pattern FI.

The word "predetermined" as used herein with respect to a parameter, such as a predetermined thickness, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring to FIG. 14C, step ST23 may further include diffusing the second conductivity type impurity which is injected into the doping region DA from the doping region DA into the select channel pattern CHS, and performing a heat treatment process for activating the second conductivity type impurity. Through the heat treatment process, the source junction SJ may be formed in the select channel pattern CHS which protrudes farther than the gap-fill insulating pattern FI. The source junction SJ may be disposed at the same height as a height of the lower select gate group LSG of the gate stack structure GST to serve as a channel of the source select transistor.

Referring to FIG. 3, after step ST23, step ST25 may be performed to form a common source line.

Figure 15A:
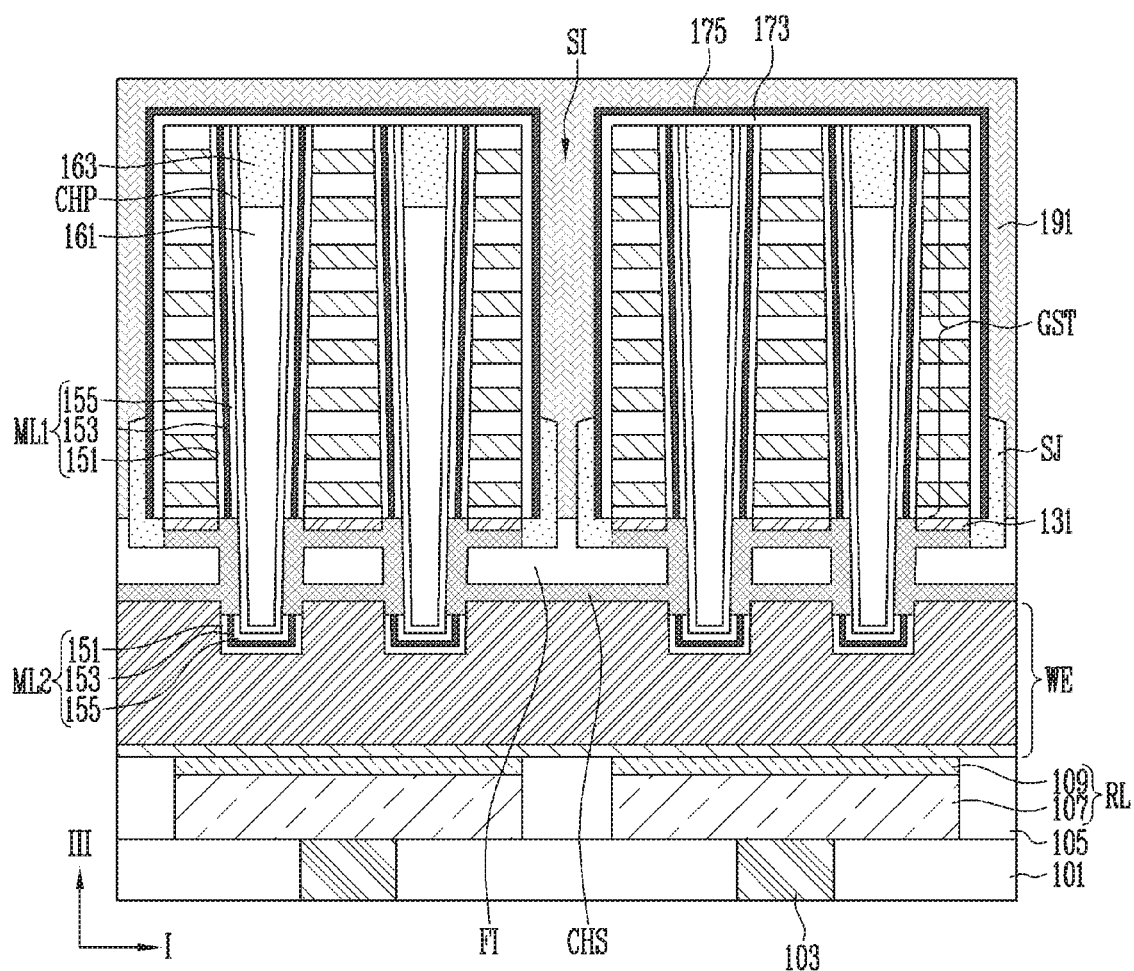
FIGS. 15A and 15B are cross-sectional views illustrating step ST25 shown in FIG. 3.
Figure 15B:
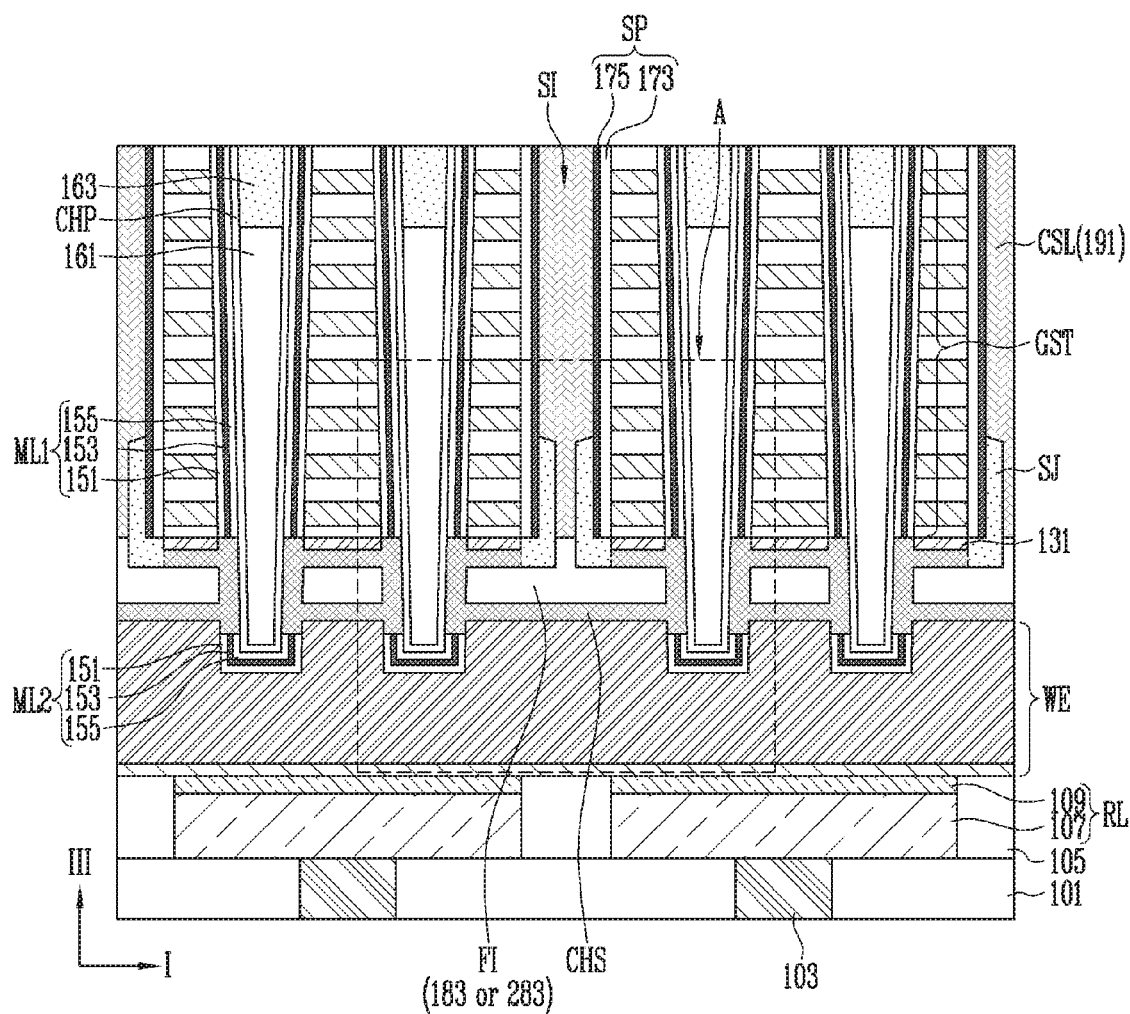

FIGS. 15A and 15B are cross-sectional views illustrating step ST25 shown in FIG. 3.

Referring to FIG. 15A, step ST25 may include forming a conductive material 191 so as to completely fill the slit SI opened by the select channel pattern CHS including the source junction SJ. The conductive material 191 may include at least one of a silicide layer and a metal layer. The conductive material 191 may be formed as a single layer or multiple layers.

Referring to FIG. 15B, step ST25 may include planarizing the conductive material 191 so as to expose a top surface of the gate stack structure GST. The planarizing may be performed by a method such as a Chemical Mechanical Polishing (CMP), etc. The conductive material 191 may be patterned to the common source line CSL by the planarization.

The common source line CSL may be disposed above the gap-fill insulating pattern FI and directly contact the source junction SJ. The common source line CSL may protrude higher towards into the slit SI than the source junction 53.

A portion of the spacer insulating layer 173 and a portion of the first protective layer 175 which cover a top surface of the gate stack structure GST may be removed by planarization. Accordingly, the spacer insulating layer 173 and the first protective layer 175 may be patterned as the insulating spacer SP in the slit SI.

The common source line CSL may completely fill the rest of the space in the slit SI which is not filled with the insulating spacer SP and the source junction SJ.

Although not illustrated in FIG. 15B, after forming the common source line CSL, subsequent processes for forming a bit line may be performed.

Figure 16:
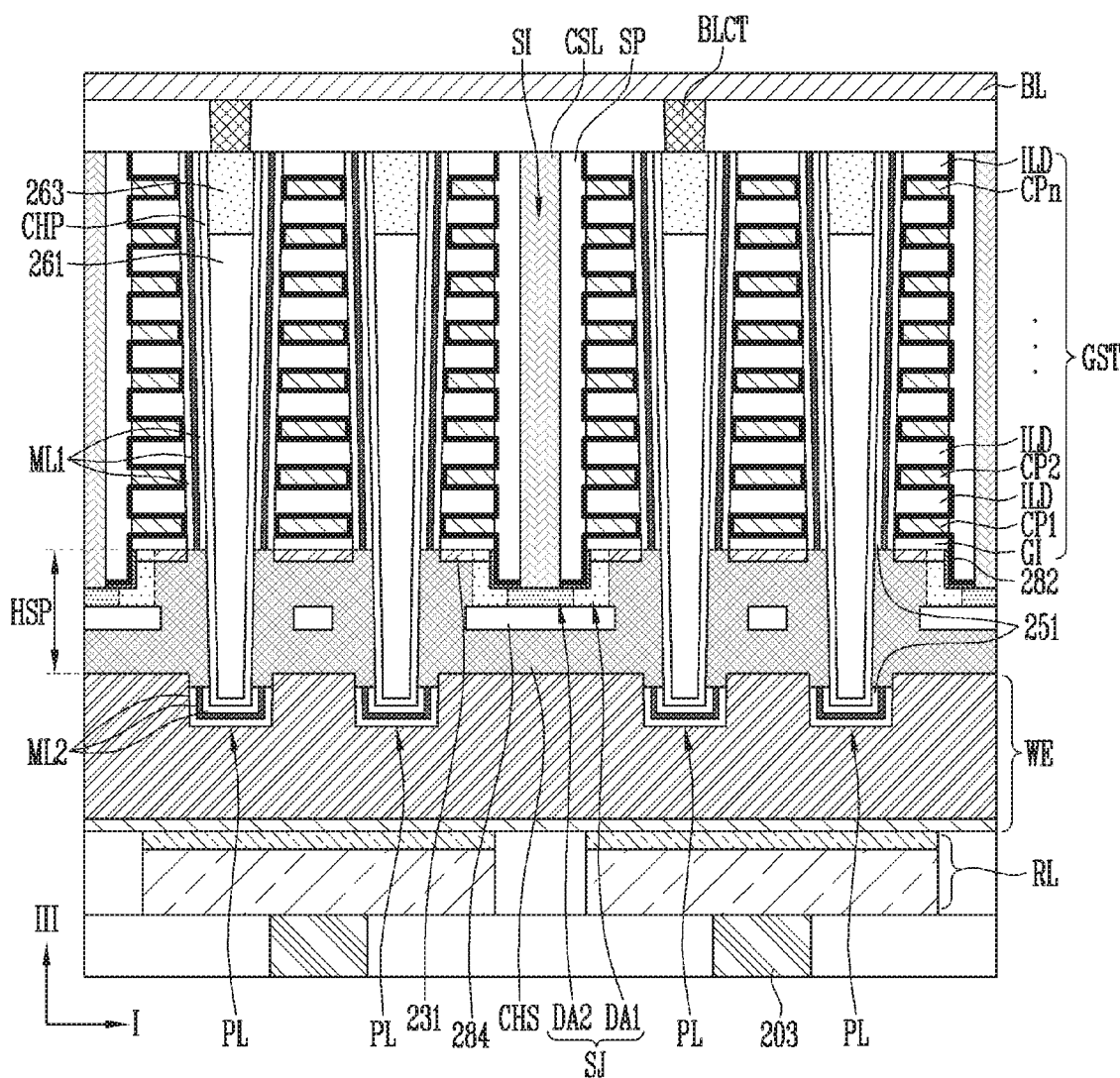
FIG. 16 is a cross-sectional view illustrating a semiconductor device according to an embodiment.

FIG. 16 is a cross-sectional view illustrating a semiconductor device according to an embodiment. A first direction I and a third direction III in drawings below correspond to the first direction I and the third direction III described in FIG.

Referring to FIG. 16, the semiconductor device according to an embodiment may include the well structure WE, the select channel pattern CHS, the cell plugs PL, the gate stack structures GST, the slit SI, the common source line CSL, and the bit line BL.

As described in FIG. 1, the well structure WE may be electrically connected to the circuit section (not illustrated) disposed under the well structure WE through at least one of a lower contact 203 and the routing wiring RL. The lower contact 203 and the routing wiring RL as illustrated in FIG. 16 may include the same structure and the same material as described in FIG.

The well structure WE may include the same structure and the same material as described in FIG.

Each of the gate stack structures GST may include the gate insulating layer GI, the conductive patterns CP1 to CPn alternately stacked on the gate insulating layer GI, and the interlayer insulating layers ILD. The conductive patterns CP1 to CPn, the interlayer insulating layers ILD, and the gate insulating layer GI may include the same structure and the same material as described in FIG.

The gate stack structures GST may be spaced apart from the well structure WE with the horizontal space HSP interposed therebetween. The horizontal space HSP disposed between the gate stack structures GST and the well structure WE may not be coupled to the slit SI. For example, the horizontal space HSP and the slit SI may be separated from each other by the select channel pattern CHS. The slit SI may extend not only in the third direction III which is an upward direction among the neighboring gate stack structures GST but also in the second direction II described in FIG.

The slit SI may be filled with the common source line CSL. The common source line CSL may include a conductive layer. For example, the common source line CSL may include various materials such as a silicide layer, a metal layer, a doped silicon layer, etc. The insulating spacer SP may be formed on a sidewall of the slit SI. The insulating spacer SP may be disposed between the common source line CSL and the gate stack structure GST. The insulating spacer SP may have a sufficient thickness to insulate the conductive patterns CP1 to CPn from the common source line CSL. The insulating spacer SP may include an oxide layer.

The cell plugs PL may pass through the gate stack structures GST disposed at both sides of the slit SI and extend into the well structure WE. Each of the cell plugs PL may include the channel pillar CHP, the first multilayer memory pattern ML1, the second multilayer memory pattern ML2, and a capping pattern 263. Each of the cell plugs PL may further include a core insulating layer 261.

The channel pillar CHP, the first multilayer memory pattern ML1, the second multilayer memory pattern ML2, the capping pattern 263, and the core insulating layer 261, respectively, may have the same structures and may be formed of the same material layers as described in FIG.

Second blocking insulating layers 282 may be further formed at interfaces between insulating layers which include the interlayer insulating layers ILD and the gate insulating layer GI and the conductive patterns CP1 to CPn, and at interfaces between the first multilayer memory pattern ML1 and the conductive patterns CP1 to CPn, respectively. The second blocking insulating layer 282 may extend between the insulating spacer SP and the insulating layers GI and ILD, and between the select channel pattern CHS and the insulating spacer SP. The second blocking insulating layer 282 may include an insulating material having a dielectric constant higher than that of each first blocking insulating layer 251 included in each of the first and second multilayer memory patterns ML1 and ML2. For example, the second blocking insulating layer 282 may include an aluminum oxide.

The select channel pattern CHS may be disposed in the horizontal space HSP between the well structure WE and the gate stack structure GST. A gap 284 may be defined in the select channel pattern CHS. The gap 284 may be an airgap including an empty space. The gap 284 may be formed during a manufacturing process of a semiconductor device according to an embodiment. The select channel pattern CHS may include a portion contacting the well structure WE and a portion contacting the common source line CSL. The gap 284 may be disposed between the portion of the select channel pattern CHS contacting the well structure WE and the portion of the select channel pattern CHS contacting the common source line CSL.

The select channel pattern CHS may extend on a sidewall of the channel pillar CHP passing in the horizontal space HSP to directly contact the channel pillar CHP. The common source line CSL may contact the portion of the select channel pattern CHS. The source junction SJ may be distributed in the select channel pattern CHS. The common source line CSL may contact the source junction SJ formed in the select channel pattern CHS. The source junction SJ may be an internal region of the select channel pattern CHS in which impurities are distributed. A first conductivity type impurity may be distributed in the well structure WE and a second conductivity type impurity different from the first conductivity type impurity may be distributed in the source junction SJ. The select channel pattern CHS may include a semiconductor layer. For example, the select channel pattern CHS may include a silicon layer.

The select channel pattern CHS may function as electrically connecting the well structure WE and the source junction SJ to the channel pillar CHP. An auxiliary channel layer 231 may be further disposed between the select channel pattern CHS and the gate stack structure GST. The auxiliary channel layer 231 may include the same structure and the same material as described in FIG. 1.

The bit line BL may be electrically coupled to the channel pillar CHP and the capping pattern 263 via the bit line contact plug BLCT. The bit line BL and the bit line contact plug BLCT, respectively, may include the same structures as described in FIG. 1.

FIGS. 17A to 17I are cross-sectional views illustrating a manufacturing method of the semiconductor device shown in FIG. 16. FIGS. 17A to 17I may illustrate processes performed after forming the lower contact 203 and the routing wiring RL as illustrated in FIG. 16.

Figure 17A:
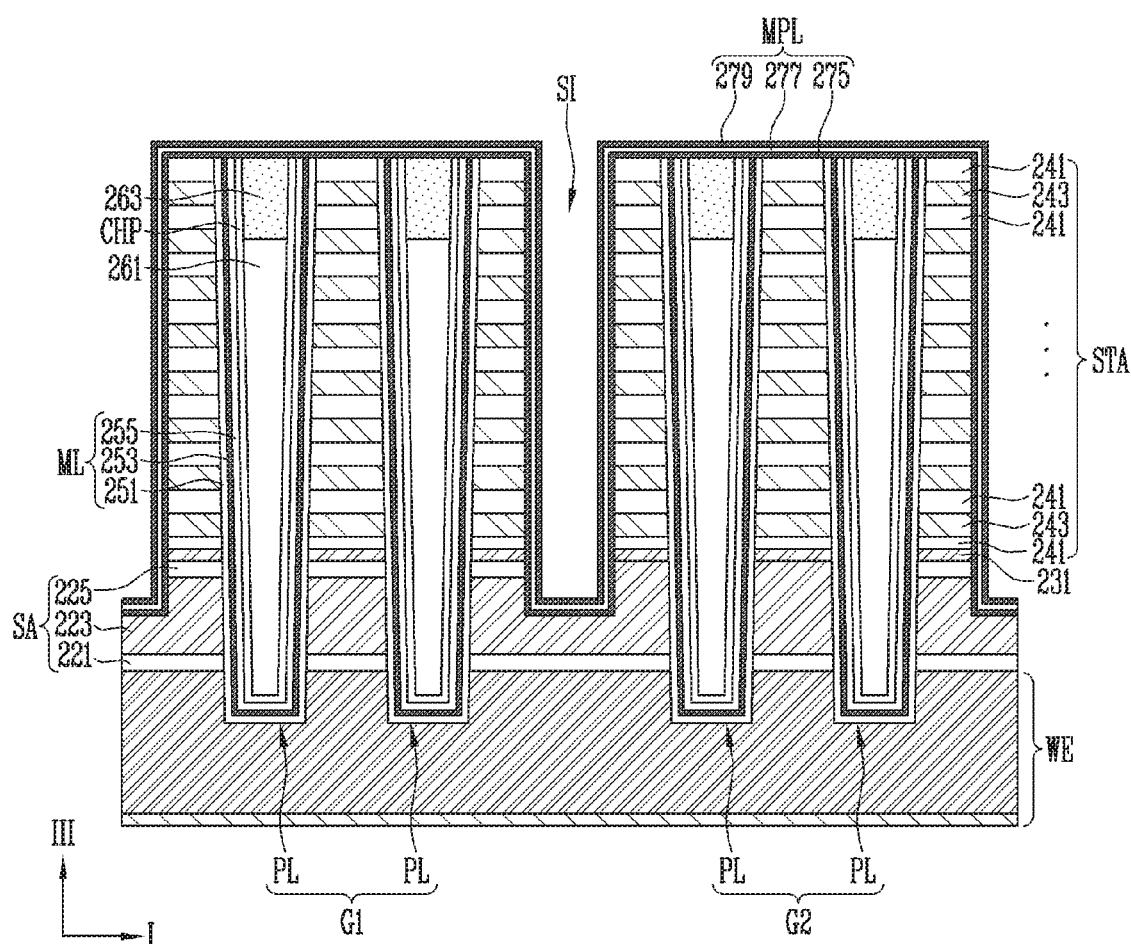

Referring to FIG. 17A, the well structure WE may be formed by using the processes as described in FIG. 4B. Subsequently, the sacrificial group SA may be formed above the well structure WE. The sacrificial group SA may include first, second, and third sacrificial layers 221, 223, and 225 sequentially stacked on the well structure WE. The first, second, and third sacrificial layers 221, 223, and 225 may include the materials as described in FIG. 5.

Subsequently, the auxiliary channel layer 231 may be formed above the sacrificial group SA. The auxiliary channel layer 231 may include the same material as described in FIG. 6.

Subsequently, the stack structure STA may be formed above the sacrificial group SA or the auxiliary channel layer 231. The stack structure STA may include first material layers 241 and second material layers 243, which are alternately stacked one by one. The first material layers 241 and the second material layers 243 may include various materials as described in FIG. 7.

Subsequently, the cell plugs PL passing through the stack structure STA and extending into the well structure WE may be formed by using the processes described in FIGS. 8A to 8C. The cell plugs PL may be divided into the first group G1 and the second group G2.

Each of the cell plugs PL may be formed in the hole H passing through the stack structure STA and extending into the well structure WE. Each of the cell plugs PL may include the multilayer memory layer ML, the channel pillar CHP, the core insulating layer 261, and the capping pattern 263. The multilayer memory layer ML may include the first blocking insulating layer 251, a data storage layer 253, and a tunnel insulating layer 255.

Subsequently, the slit SI passing through the stack structure STA and the auxiliary channel layer 231 to extend in the sacrificial group SA may be formed. The slit SI may be formed between the cell plugs of the first group G1 and the cell plugs of the second group G2. The stack structure STA may be divided into the first sub-stack structure surrounding the cell plugs of the first group G1 and the second sub-stack structure surrounding the cell plugs of the second group G2 by the slit SI.

Subsequently, the multilayer protective layer MPL may be conformally formed along a surface of the slit SI and a surface of the stack structure STA. The multilayer protective layer MPL may include a first protective layer 275, a second protective layer 277, and a third protective layer 279 sequentially stacked on one another. The first protective layer 275 may include an insulating material having a different etch rate from the first blocking insulating layer 251, the second protective layer 277 may include an insulating material having a different etch rate from the data storage layer 253, and the third protective layer 279 may include an insulating material having a different etch rate from the tunnel insulating layer 255. The first protective layer 275 and the third protective layer 279 may include the same material as the data storage layer 253. For more specific example, the first protective layer 275 and the third protective layer 279 may include a nitride layer. The second protective layer 277 may include an oxide layer.

Figure 17B:
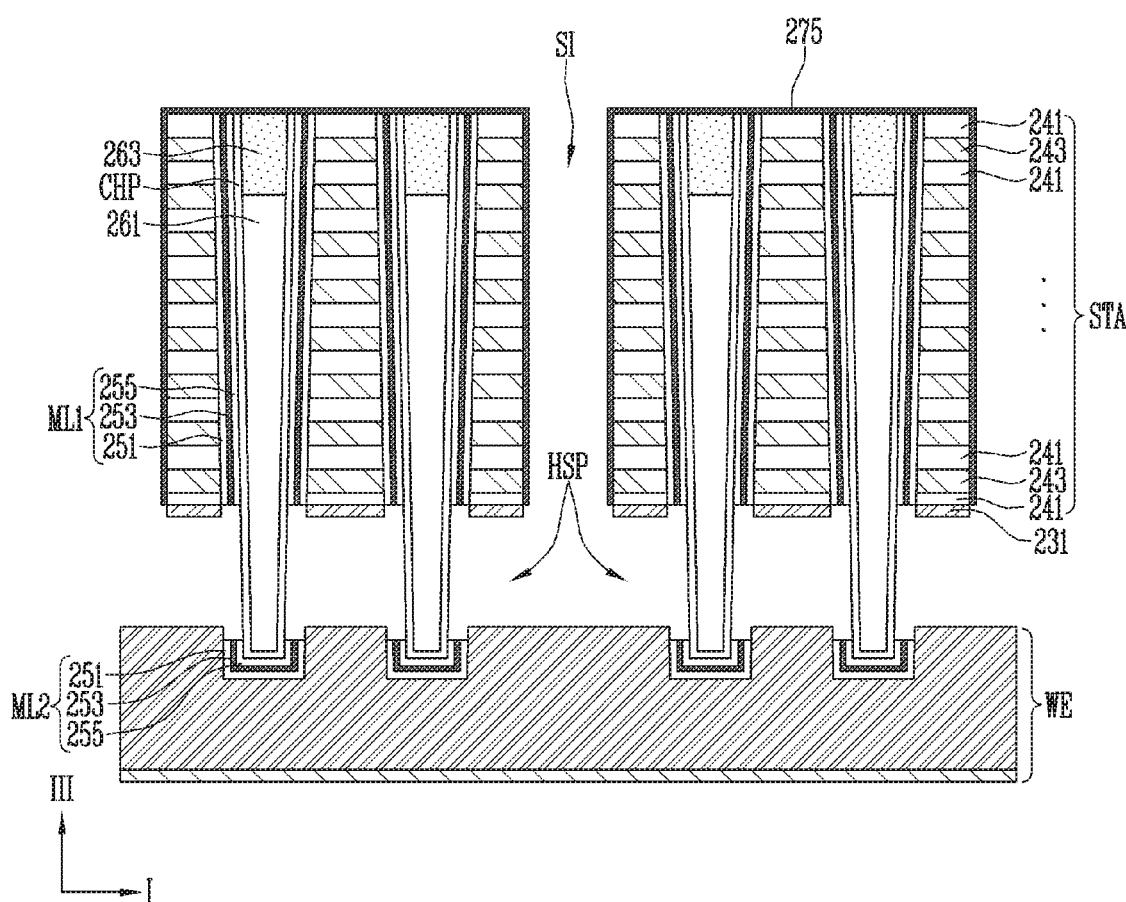

Referring to FIG. 17B, the horizontal space HSP and the first and second multilayer memory patterns ML1 and ML2 may be formed by using the processes described in FIGS. 11B to 11E.

The horizontal space HSP may be a region from which the sacrificial group SA illustrated in FIG. 17A is removed, and the region opened between the auxiliary channel layer 231 and the well structure WE, and may be coupled to the slit SI.

The first and second multilayer memory patterns ML1 and ML2 may be separated from each other during a process in which the sidewalk of the channel pillars CHP are exposed by removing the first blocking insulating layer 251, the data storage layer 253, and the tunnel insulating layer 255 which are opened by the horizontal space HSP.

The multilayer protective layer MPL, the first sacrificial layer 121 and the third sacrificial layer 125 as described in FIG. 17A may serve as protective layers when etching processes for forming the first and second multilayer memory patterns ML1 and ML2 and the horizontal space HSP are performed. Accordingly, damage to the auxiliary channel layer 231 and the well structure WE may be minimized, and the first protective layer 275 may remain to protect the stack structure STA.

Figure 17C:
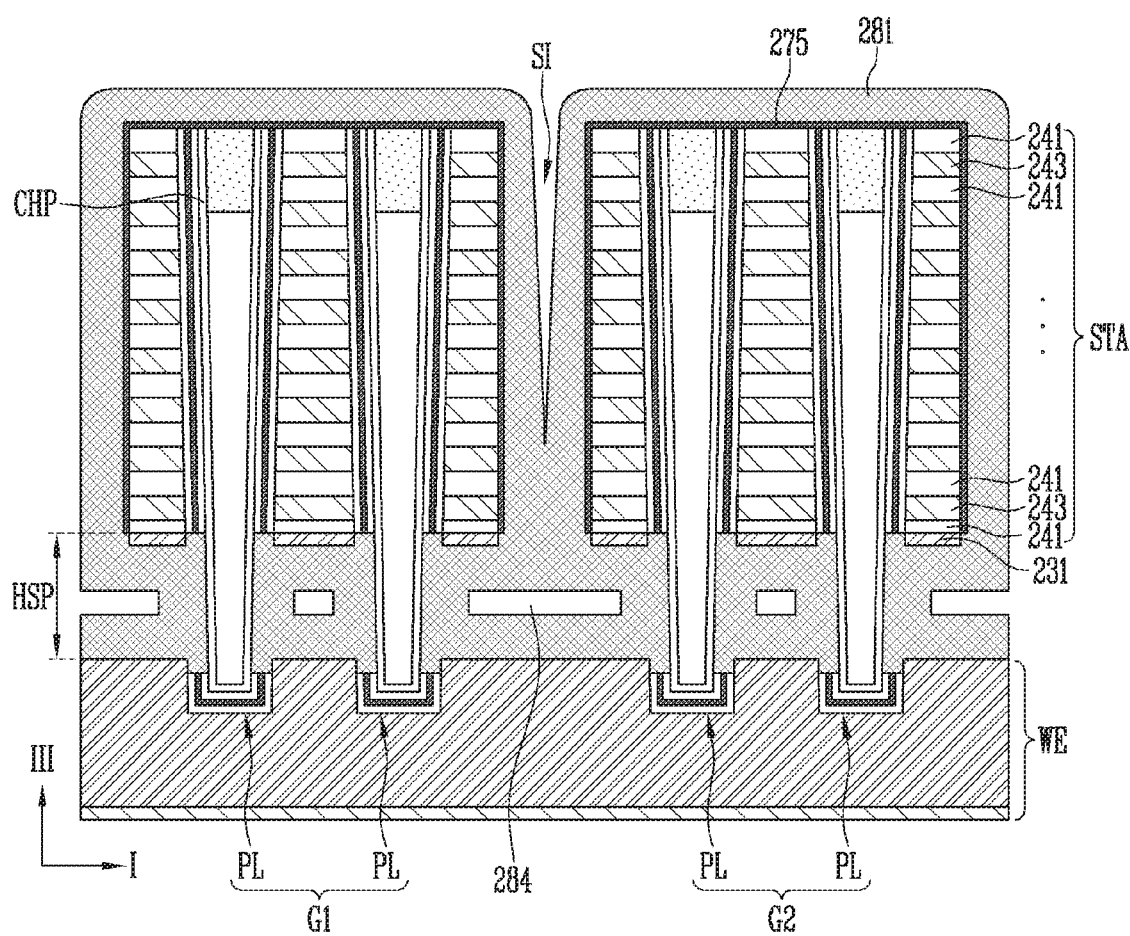

Referring to FIG. 17C, a step in which a semiconductor layer 281 along a surface of the horizontal space HSP and a surface of the slit SI is formed may be included. The semiconductor layer 281 may directly contact the sidewall of the channel pillar CHP and the well structure WE exposed by the horizontal space HSP. The semiconductor layer 281 may directly contact the auxiliary channel layer 231 exposed by the horizontal space HSP.

The semiconductor layer 281 may serve as a channel and may be an undoped layer to which impurities are not doped. The semiconductor layer 281 may include various materials, for example, the semiconductor layer 281 may be a polysilicon layer. The semiconductor layer 281 may be formed by using a deposition method (for example, Chemical Vapor Deposition (CVD)). The semiconductor layer 281 may be deposited so as to define the gap 284 such as an air gap in the horizontal space HSP under the slit SI.

When a width of the slit SI is minimized, a lower end of the slit SI may be blocked by the semiconductor layer 281 before the semiconductor layer 281 completely fill the horizontal space HSP under the slit SI. Accordingly, the gap 284 may be defined in the horizontal space HSP disposed under the slit SI. When the width of the slit SI is minimized, a size of a memory block may be reduced.

The gap 284 may be formed between different groups of the cell plugs PL. For example, the gap 284 may be formed between the cell plugs of the first group G1 and the cell plugs of the second group G2. In addition, the gap 284 may be formed between the cell plugs PL included in the first group G1 or between the cell plugs PL included in the second group G2.

Figure 17D:
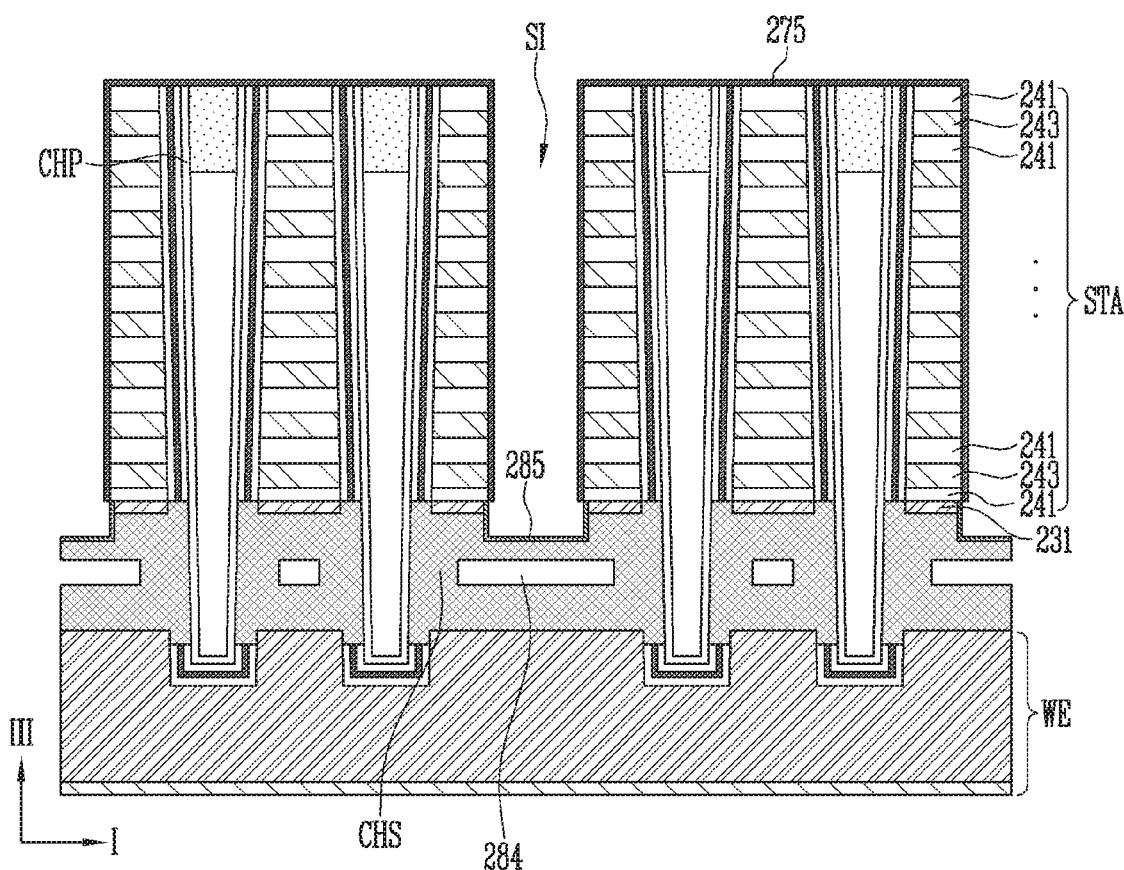

Referring to FIG. 17D, a portion of the semiconductor layer 281 may be etched to form the select channel pattern CHS. Etching processes of the semiconductor layer 281 may be controlled to have the gap 284 remain in a state in which the gap 284 is isolated from the slit: SI by the select channel pattern CHS. During the etching processes for forming the select channel pattern CHS, the first protective layer 275 may protect the stack structure STA. The processes for etching the semiconductor layer 281 may be performed by using wet etching processes and etch-back processes.

Subsequently, a fourth protective layer 285 may be formed by oxidizing a portion of the auxiliary channel layer 231 and a portion of the select channel pattern CHS which are exposed through the slit SI.

Subsequent processes may be performed in various methods depending on types of the first material layers 241 and the second material layers 243 which constitute the stack structure STA.

For example, when the first material layers 241 include a sacrificial conductive material and the second material layers 243 include a conductive material for conductive patterns, the first material layers 241 may be replaced by an insulating material such as an oxide layer through the slit SI.

Alternatively, when the first material layers 241 include an insulating material, and the second material layers 243 include a conductive material for conductive patterns, subsequent processes described in FIG. 17G may be successively performed while skipping subsequent processes described with reference to FIGS. 17E and 17F.

Figure 17F:
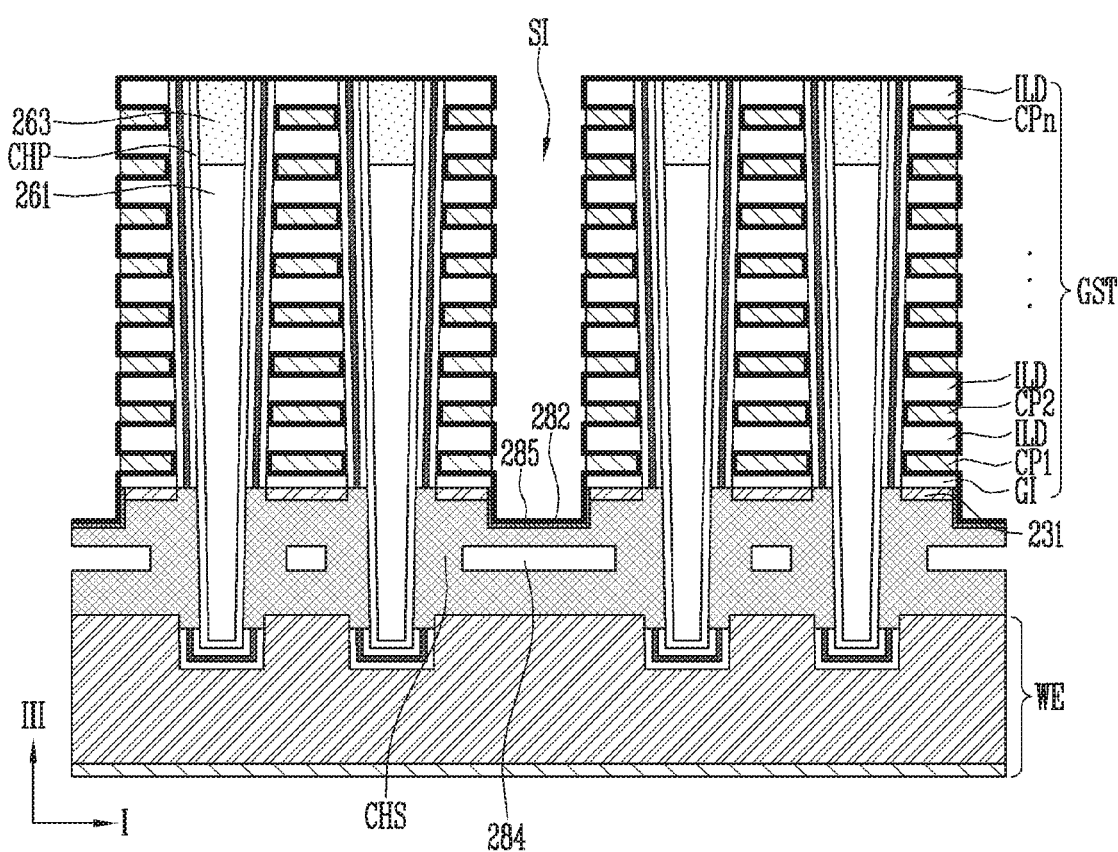

In addition, when the first material layers 241 include an insulating material and the second material layers 243 include a sacrificial insulating material, processes for replacing the second material layers 243 by conductive patterns may be performed as illustrated in FIGS. 17E and 17F.

Referring to FIG. 17E, the openings OP may be formed by selectively removing the second material layers 243 illustrated in FIG. 17D through the slit SI.

Referring to FIG. 17F, the conductive patterns CP1 to CPn may be formed in the openings OP illustrated in FIG. 17E. Before forming the conductive patterns CP1 to CPn, the second blocking insulating layer 282 may be conformally formed along a surface of each of the openings OP and a surface of the slit SI further.

As described above, the gate stack structure GST including insulating layers and conductive layers alternately stacked on one another may be formed by using various methods as described above.

Figure 17G:
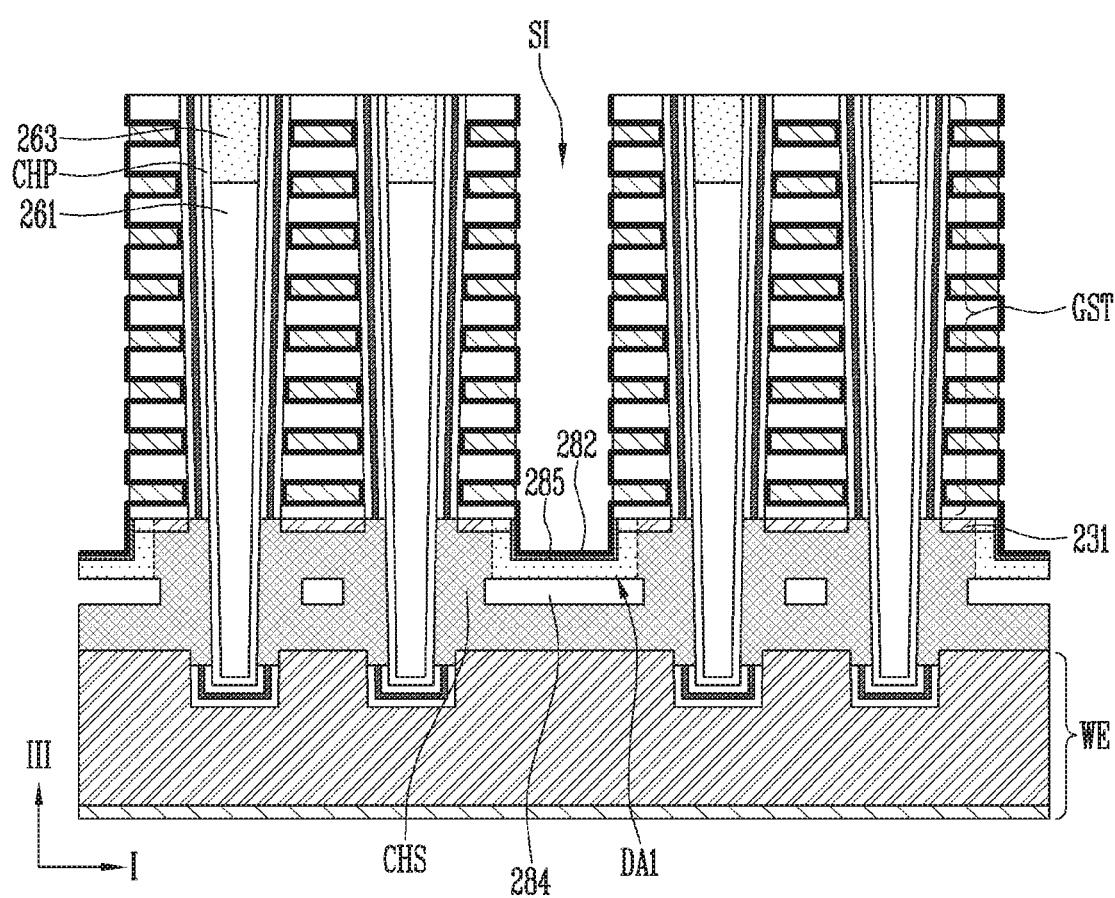

Referring to FIG. 17G, after forming the gate stack structure GST, an impurity may be injected at the first concentration into the select channel pattern CHS and the auxiliary channel layer 231 which are adjacent to the slit SI. Thereby, a first doping region DA1 may be formed. The injected impurity may be the second conductivity type impurity which is different from the first conductivity type impurity injected into the well structure WE. The second conductivity type impurity may be an n-type impurity.

Figure 17H:
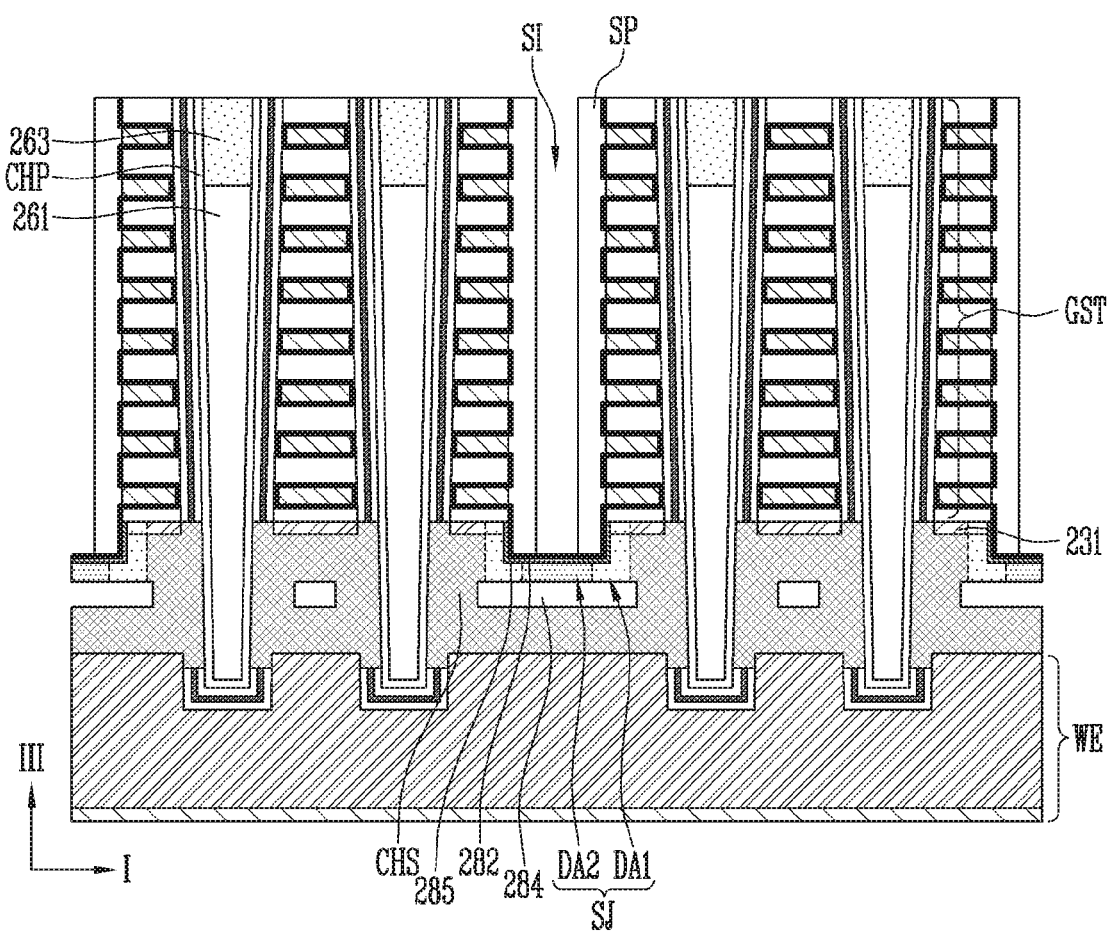

Referring to FIG. 17H, the insulating spacer SP may be formed on a sidewall of the slit SI. The insulating spacer SP may include an oxide.

Subsequently, the second conductivity type impurity may be injected at the second concentration into the select channel pattern CHS which is not blocked by the insulating spacer SP. The second concentration has a higher level than the first concentration. Thereby, a second doping region DA2 may be formed in the first doping region DA1.

When the second conductivity type impurity described in FIGS. 17G and 17H are injected, the second blocking insulating layer 282 and the fourth protective layer 285 may serve as buffer layers so as to prevent damage to the select channel pattern CHS.

The first doping region DA1 and the second doping region DA2 may serve as the source junction SJ.

Figure 17I:
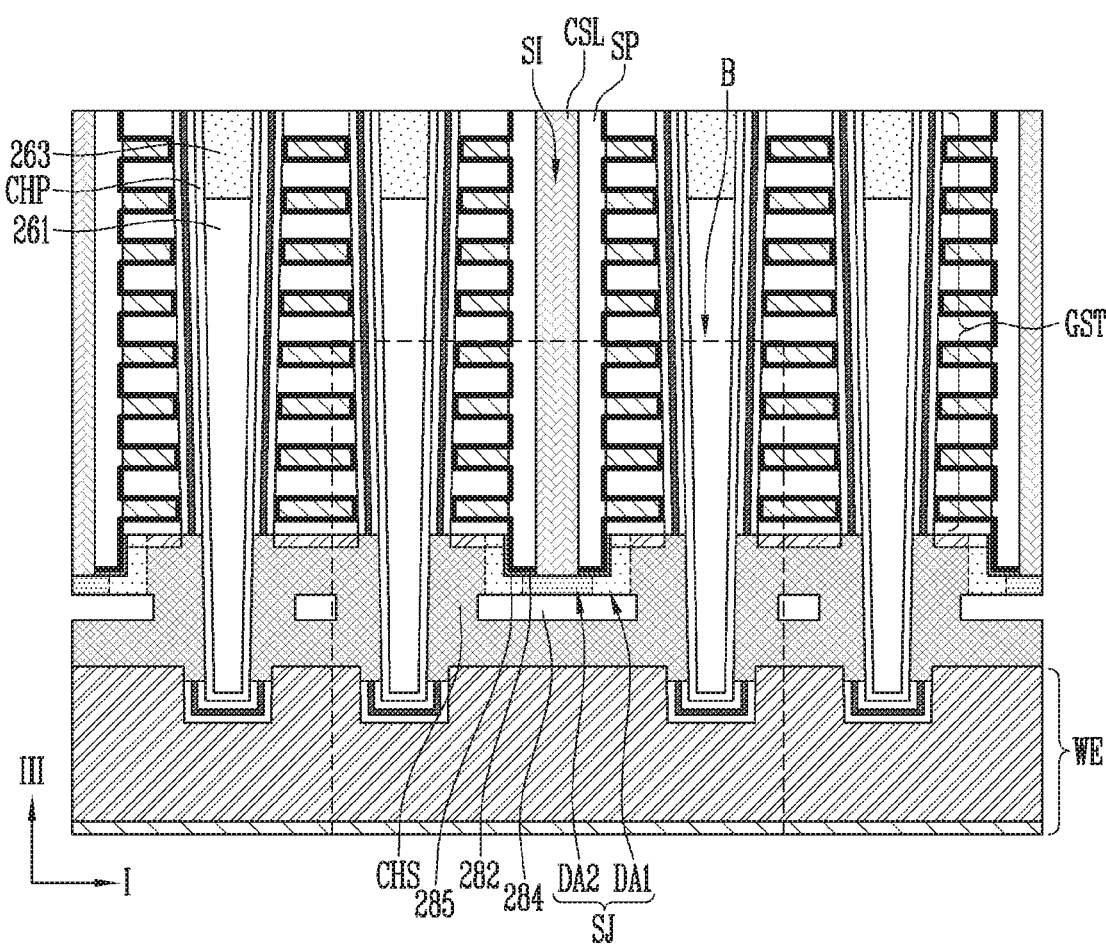

Referring to FIG. 17I, the second blocking insulating layer 282 and the fourth protective layer 285 which remain on a bottom surface of the slit SI may be etched so as to expose the second doping region DA2 of the source junction SJ.

Subsequently, the common source line CSL may be formed so as to completely fill the slit SI. The common source line CSL may include at least one of a silicide layer and a metal layer. The common source line CSL may be formed as a single layer or multiple layers. The forming of the common source line CSL may include filling the slit SI with a conductive material, and planarizing the conductive material so as to expose a top surface of the gate stack structure GST.

Although not illustrated, after forming the common source line CSL, subsequent processes for forming the bit line may be performed.

Figure 18A:
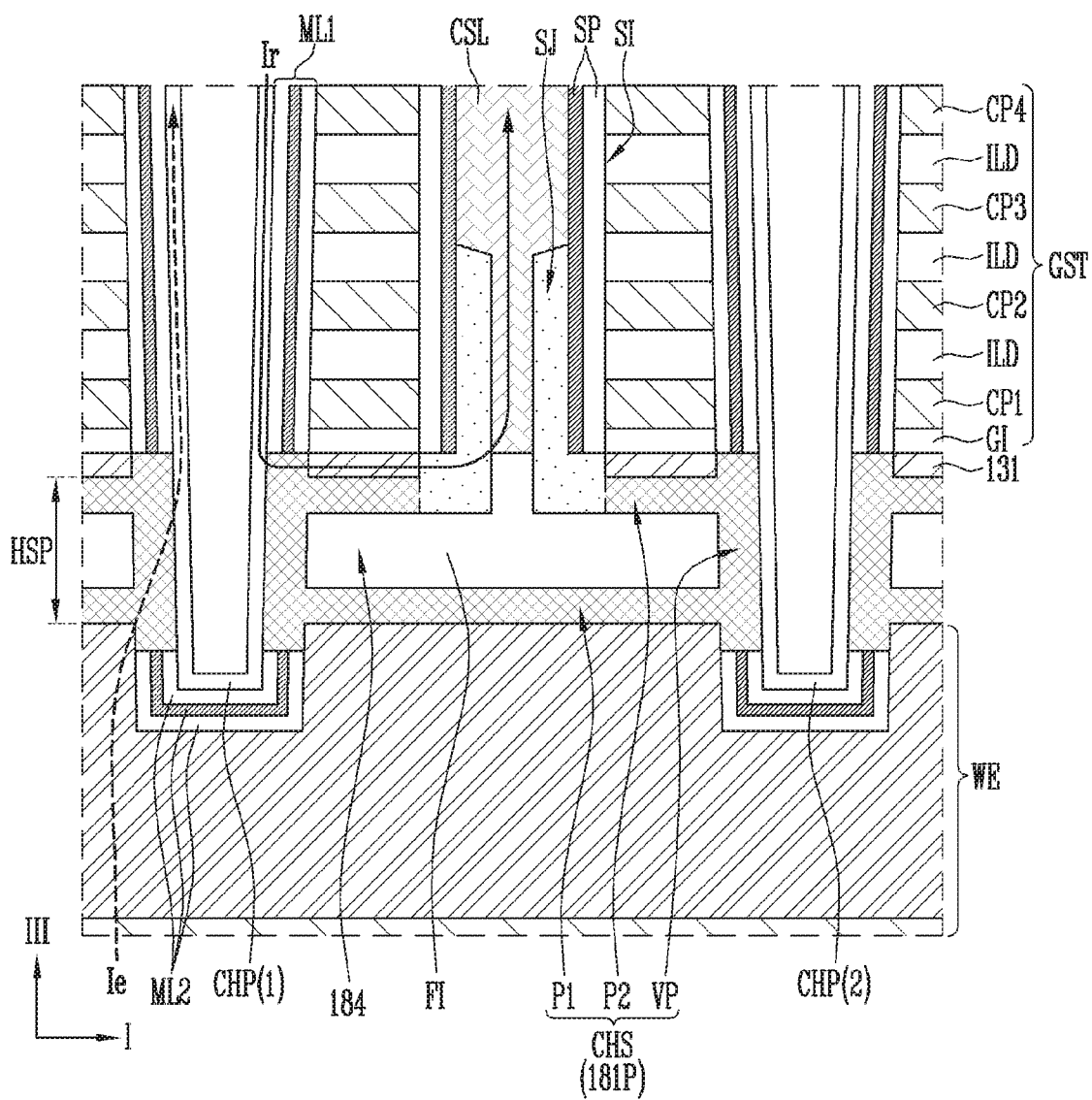
FIGS. 18A and 18B are cross-sectional views illustrating current flow paths in semiconductor devices according to embodiments.
Figure 18B:
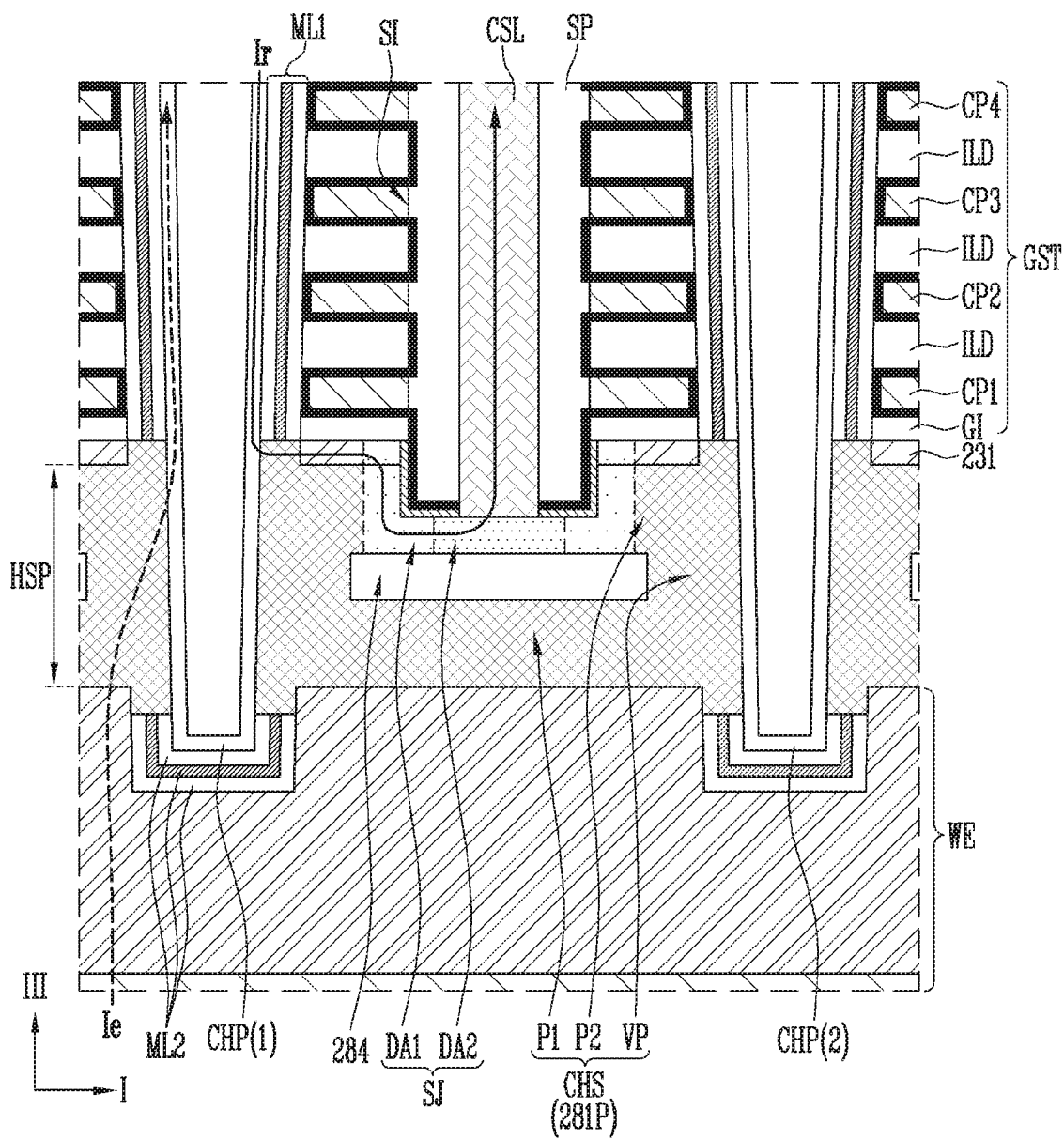

FIGS. 18A and 18B are cross-sectional views illustrating current flow paths in semiconductor devices according to embodiments. FIG. 18A illustrates a portion of the semiconductor device corresponding to a region A of FIG. 15B, and FIG. 18B illustrates a portion of the semiconductor device corresponding to a region B of FIG. 17I. Hereinafter, features of the semiconductor devices according to the embodiments will be described with reference to FIGS. 18A and 18B.

Referring to FIGS. 18A and 18B, the semiconductor device according to the embodiments may include the well structure WE, the channel pillars CHP, the gate stack structures GST, a semiconductor pattern 181P or 281P, the source junction SJ, the common source line CSL, and the insulating spacer SP. The semiconductor device according to the embodiments may further include the auxiliary channel layer 131 or 231.

When a circuit section (not illustrated) for driving the semiconductor device is disposed under the well structure WE, the circuit section may be formed on a single-crystal silicon substrate (not illustrated). The well structure WE may be disposed over the single-crystal silicon substrate including the circuit section and may include a doped semiconductor layer. The well structure WE may include the doped semiconductor layer including the first conductivity type impurity as described in FIGS. 1 and 16. For example, the well structure WE may include a doped silicon layer including a p-type impurity.

The channel pillars CHP may be divided into a first channel pillar 1 passing through the gate stack structure GST disposed at one side of the slit SI and a second channel pillar 2 passing through the gate stack structure GST disposed at the other side of the slit SI. According to this definition, the slit SI may be disposed between the first channel pillar 1 and the second channel pillar 2. The first channel pillar 1 and the second channel pillar 2 may extend from the inside of the well structure WE along the third direction III which is an upward direction.

The semiconductor pattern 181P or 281P may be the select channel pattern CHS as described in FIGS. 1 and 16 and may include the source junction 53. The semiconductor pattern 181P or 281P may be formed by patterning the semiconductor layer. For example, the semiconductor pattern 181P or 281P may include a polysilicon layer.

The semiconductor pattern 181P or 281P may be conformally formed on a surface of the horizontal space HSP so that a gap 184 or the gap 284 may be defined in the horizontal space HSP formed between the well structure WE and the gate stack structures GST. The semiconductor pattern 181P or 281P may be coupled between the first channel pillar 1 and the second channel pillar 2. The gap 184 or 284 in the semiconductor pattern 181P or 281P may be formed in a central region of the semiconductor pattern 181P or 281P disposed between the first channel pillar 1 and the second channel pillar 2. The gap 184 or 284 may be filled with an insulating material or may remain as an air gap. In an embodiment, the gap 184 or 284 may be filled with a gas or air. The gap 184 or 284 may be formed in various forms depending on a method of forming the semiconductor layer, a condition for forming the semiconductor layer, a width of the slit SI, etc.

For example, referring to FIG. 18A, the gap 184 may extend into the slit SI between the gate stack structures GST. A portion of the gap 184 facing the slit SI may be filled with the common source line CSL. The rest of the gap 184 disposed under the common source line CSL may be filled with the gap-fill insulating pattern FI.

For another example, referring to FIG. 18B, the gap 284 may remain in a form in which the gap 284 is spaced apart from the common source line CSL, and is blocked from the slit SI. In this example, the semiconductor pattern 281P may extend along a bottom surface of the common source line CSL. An inside of the gap 284 may remain as an empty space.

Referring to FIGS. 18A and 18B, the semiconductor pattern 181P or 281P may include the vertical portions VP, a first portion P1, and a second portion P2. The first portion P1 may be a portion of the second horizontal portion HP2 described in FIGS. 1 and 2, and the second portion P2 may include the first horizontal portion HP1 and the source junction SJ described in FIGS. 1 and 2. The vertical portions VP may surround the first channel pillar 1 and the second channel pillar 2. The first portion P1 may contact the well structure WE and extend along a horizontal direction intersecting the third direction III in which the first channel pillar 1 and the second channel pillar 2 extend. The horizontal direction may be in line with the first direction I and the second direction II illustrated in FIG. 1. The second portion P2 may be disposed above the first portion P1 with the gap 184 or 284 interposed therebetween. The first portion P1 and the second portion P2 may extend from the vertical portions VP. The source junction SJ may be formed in the second portion P2 of the semiconductor pattern 181P or 281P.

The source junction SJ may be disposed above the well structure WE with the gap 184 or 284 interposed therebetween. The source junction SJ may be a doping region in which the second conductivity type impurity which is different from the first conductivity type impurity is distributed as described in FIGS. 1 and 16. For example, the source junction SJ may be the doping region including an n-type impurity.

The common source line CSL may be disposed in the slit SI between the gate stack structures GST. The common source line CSL may contact the source junction 53.

Referring to FIG. 18A, the second portion P2 of the semiconductor pattern 181P and the source junction SJ may extend between the respective gate stack structures GST and the common source line CSL. The second portion P2 of the semiconductor pattern 181P and the source junction SJ may extend having a smaller height than the common source line CSL, the first channel pillar 1, and the second channel pillar 2, respectively.

Referring to FIG. 18B, the second portion P2 of the semiconductor pattern 281P may extend along a bottom surface of the common source line CSL so that the gap 284 is not opened towards the common source line CSL. The source junction SJ distributed in the second portion P2 may include the first doping region DA1 and the second doping region DA2 as described in FIG. 16. The common source line CSL may contact the second doping region DA2 including a second conductivity type impurity at a relatively high concentration.

Referring to FIGS. 18A and 18B, the gate stack structures GST may surround a portion of the first channel pillar 1 and a portion of the second channel pillar 2, respectively, which protrude farther towards an upward direction (the third direction III) than the vertical portions VP of the semiconductor pattern 181P or 281P. Each of the gate stack structures GST may include the insulating layers GI and ILD alternately stacked on each other and the conductive patterns CP1 to CP4.

The auxiliary channel pattern 131 or 231 may further be disposed between the gate stack structures GST and the second portion P2 of the semiconductor pattern 181P or 281P. The source junction SJ may be formed in the auxiliary channel layer 131 or 231.

The gate stack structures GST and the common source line CSL may be insulated from each other by the insulating spacer SP. The second multilayer memory patterns ML2 may be disposed between the well structure WE and the channel pillars CHP, and the first multilayer memory patterns ML1 may be disposed between the gate stack structures GST and the channel pillars CHP. Each of the vertical portions VP of the semiconductor pattern 181P or 281P may contact each of the corresponding channel pillar CHP between each of the corresponding first multilayer memory pattern ML1 and each of the corresponding second multilayer memory pattern ML2.

According to embodiments, the first portion P1 of the semiconductor pattern 181P or 281P may be electrically connected to the well structure WE including the first conductivity type impurity, and the second portion P2 of the semiconductor pattern 181P or 281P may include the source junction SJ in which an n-type impurity which is the second conductivity type impurity is distributed. In addition, according to the embodiments, the first portion P1 of the semiconductor pattern 181P or 281P which contacts the well structure WE and the second portion P2 of the semiconductor pattern 181P or 281P which serves as the source junction SJ may be physically isolated from each other by the gap 184 or 284. Accordingly, during a program operation and a read operation, a current flow may be controlled to head for the common source line CSL, and during an erase operation, holes may be supplied through the well structure WE.

For example, a first path Ir may be formed during the read operation of the semiconductor device. The first path Ir may be formed in the channel pillar CHP coupled between the common source line CSL and the bit line BL illustrated in FIGS. 1 and 16. The bit line BL illustrated in FIGS. 1 and 16 may be precharged to a predetermined level during the read operation. In addition, during the read operation, a turn-on voltage may be applied to conductive patterns (for example, CPn and CPn−1 illustrated in FIGS. 1 and 16) serving as a drain select line and conductive patterns (for example, CP1 and CP2) serving as a source select line. When a voltage level applied to the rest of the conductive patterns other than the conductive patterns serving as the drain select line and the source select line is higher than a threshold voltage of memory cell transistors coupled to the rest of the conductive patterns, a channel may be formed in the channel pillar CHP, and the precharge level of the bit line BL illustrated in FIGS. 1 and 16 may be discharged through a ground (not illustrated) which is electrically connected to the common source line CSL.

A second path Ie may be formed during the erase operation of the semiconductor device. The second path Ie may be formed in the channel pillar CHP coupled between the well structure WE and the bit line BL illustrated in FIGS. 1 and 16. An erase voltage may be applied to the well structure WE during the erase operation. Holes may be injected into the channel pillar CHP by the erase voltage applied to the well structure WE.

According to embodiments, a leakage current between the source junction SJ and the well structure WE through the gap 184 or 284 disposed between the source junction SJ and the well structure WE may be reduced.

FIG. 19 is a flowchart schematically comparing methods of manufacturing semiconductor devices in accordance with embodiments.

Referring to FIG. 19, step STC1 for forming a sacrificial group on a well structure may be performed in order to manufacture the semiconductor device illustrated in FIGS. 1 and 16. Step STC1 may be formed by using the processes described in FIG. 5.

In order to manufacture the semiconductor device illustrated in FIGS. 1 and 16, after step STC1, step STC3 for forming a stack structure, step STC5 for forming a cell plug, and step STC7 for forming a slit may be performed sequentially. Processes for forming an auxiliary channel layer may be performed further before step STC3. The processes for forming the auxiliary channel layer may be performed by using the processes described in FIG. 6.

Step STC3 may be performed by using the processes described in FIG. 7. Step STC5 may be performed by using the processes described in FIGS. 8A to 8C. Step STC7 may be performed by using the processes described in FIG. 9.

In order to manufacture the semiconductor device illustrated in FIG. 1, steps 1ST11 to 1ST17 may be performed after step STC7. Depending on material layers constituting the stack structure, step 1ST9 may be performed further before step 1ST11, or step 1ST9 may be skipped.

For example, when the stack structure has a structure in which sacrificial layers and interlayer insulating layers are alternately stacked on each other, step 1ST9 in which the sacrificial layers are replaced by conductive layers may be performed. Step 1ST9 may be performed by using the processes described in FIGS. 10A and 10B.

In step 1ST11, a spacer insulating layer and a multilayer protective layer may be conformally formed along a surface of a slit. Step 1ST11 may be performed by using the processes described in FIG. 11A.

In step 1ST13, a horizontal space may be formed by removing a sacrificial group through the slit. Step 1ST13 may be performed by the processes described in FIGS. 11B to 11E.

In step 1ST15, after forming a semiconductor layer conformally along surfaces of the horizontal space and the slit so as to define a gap in the horizontal space, a semiconductor pattern may be formed by patterning the semiconductor layer. Step 1ST15 may be performed by using the processes described in FIGS. 12A to 12C or the processes described in FIGS. 13A and 13B. As illustrated in FIG. 18A, the semiconductor pattern 181P may extend on the surface of the slit SI, and the gap 184 may be opened towards the slit SI.

In step 1ST17, a source junction may be formed in the semiconductor pattern. Step 1ST17 may be performed by using the processes described in FIGS. 14A to 14C. As illustrated in FIG. 18A, the gap 184 in the horizontal space HSP which is defined by the semiconductor pattern 181P may be filled with the gap-fill insulating pattern FI.

In order to manufacture the semiconductor device illustrated in FIG. 16, steps 2ST9 to 2ST15 may be performed after step STC7.

In step 2ST9, a horizontal space may be formed by removing a sacrificial group through a slit. Step 2ST9 may be performed by using the processes described in FIGS. 17A and 17B.

In step 2ST11, after forming a semiconductor layer along a surface of the horizontal space so as to define a gap in the horizontal space, a semiconductor pattern may be formed by patterning the semiconductor layer. Step 2ST11 may be performed by using the processes described in FIGS. 17C and 17D. The gap 284 and the slit SI may be isolated from each other by the semiconductor pattern 281P as illustrated in FIG. 18B.

Step 2ST13 may be skipped or performed after step 2ST11 depending on material layers constituting a stack structure. For example, when the stack structure has a structure in which sacrificial layers and interlayer insulating layers are alternately stacked on each other, step 2ST13 in which the sacrificial layers are replaced by conductive patterns may be performed. Step 2ST13 may be performed by using the processes described in FIGS. 17E and 17F.

Step 2ST15 may include forming a source junction in the semiconductor pattern and forming an insulating spacer on a sidewall of the slit. Step 2ST15 may be performed by using the processes described in FIGS. 17G and 17H. The first doping region DA1 may be formed in the semiconductor pattern 281P, the insulating spacer SP may be formed on the sidewall of the slit, and the second doping region DA2 may be formed in the first doping region DA1 which is not blocked by the insulating spacer SP as illustrated in FIG. 18B.

After step 1ST17 or 2ST15, step STC21 for forming a common source line may be performed in order to manufacture the semiconductor device illustrated in FIGS. 1 and 16. Step STC21 may be performed by the processes described in FIGS. 15A and 15B, or the processes described in FIG. 17I.

Although the embodiments are described based on the structure in which the gate stack structure or the stack structure are completely passed through by the holes to extend in one direction and the manufacturing method thereof, the embodiments are not limited thereto. For example, the gate stack structure or the stack structure of the semiconductor device according to the embodiment may include two or more stack groups sequentially stacked in the one direction. For more specific example, the gate stack structure or the stack structure may include a lower stack group and an upper stack group. The lower stack group may be passed through by a lower hole and the upper stack group may be passed through by an upper hole. The lower hole may be formed before forming the upper stack group, and the upper hole may be coupled to the lower hole after forming the upper stack group.

According to the embodiments, the source junction and the well structure may physically be isolated from each other. Accordingly, in the embodiments, since the current path via the source junction and the current path via the well structure are distinguished from each other, reliability of the semiconductor device operation may be improved.

Figure 20:
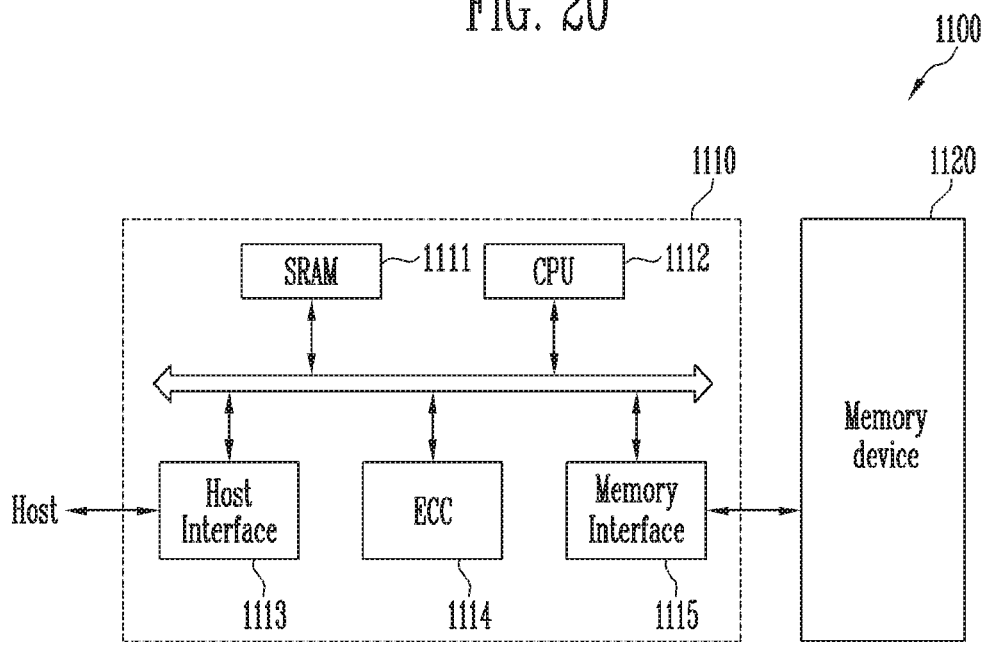
FIG. 20 is a block diagram illustrating a configuration of a memory system according to an embodiment.

FIG. 20 is a block diagram illustrating a configuration of a memory system 1100 according to an embodiment.

Referring to FIG. 20, the memory system 1100 according to the embodiment may include a memory device 1120 and a memory controller 1110.

The memory device 1120 may include the structure described in FIGS. 1 and 2, or the structure described in FIG. 16. For example, the memory device 1120 may include a gate stack structure disposed on a well structure, a slit passing through the gate stack structure, and a semiconductor pattern disposed in a space between the well structure and the gate stack structure and including first and second portions which are isolated from each other with a gap interposed therebetween. The memory device 1120 may be a multi-chip package formed of a plurality of flash memory chips.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host coupled to the memory system 1100, In addition, the ECC 1114 may detect and correct errors included in the data read from the memory device 1120, and the memory interface 1115 may perform interfacing with the memory device 1120. In addition, the memory controller 1110 may further include a Read Only Memory (ROM) for storing code data for interfacing with the host.

The above-described memory system 1100 may be a memory card or a Solid State Disk (SSD) equipped with the memory device 1120 and the controller 1110. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 21:
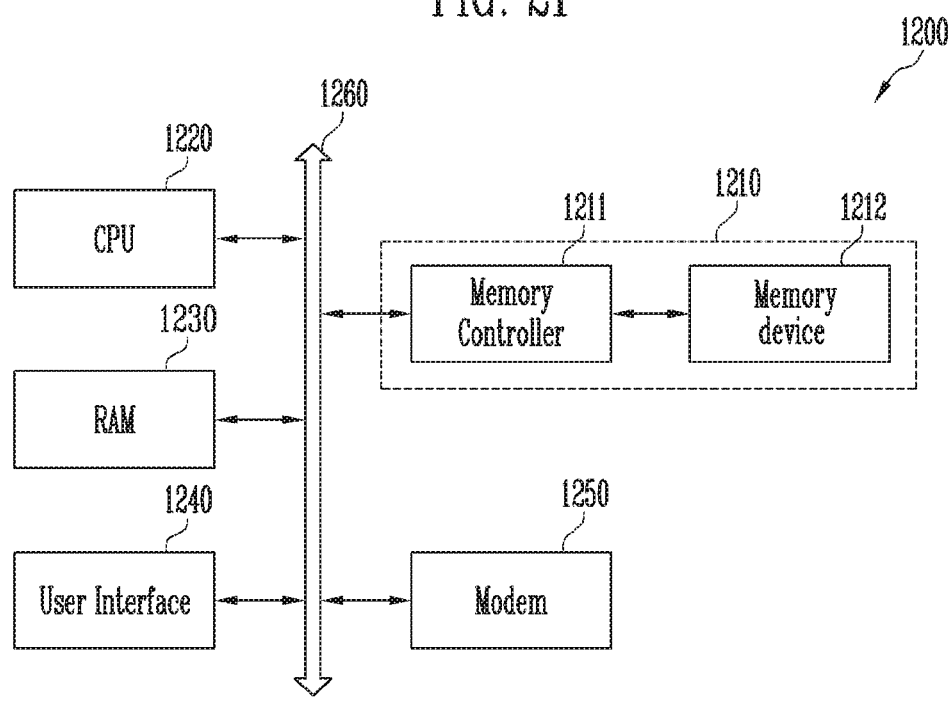
FIG. 21 is a block diagram illustrating a configuration of a computing system in accordance with an embodiment.

FIG. 21 is a block diagram illustrating a configuration of a computing system 1200 in accordance with an embodiment.

Referring to FIG. 21, the computing system 1200 according to an embodiment may include a CPU 1220, a Random Access Memory (RAM) 1230, a user interface 1240, a modem 1250, and a memory system 1210 which are electrically connected to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

The memory system 1210, as described with reference to FIG. 20, may be configured with a memory device 1212 and a memory controller 1211.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A method of manufacturing a semiconductor device, the method comprising:
    forming a sacrificial group above a well structure;
    forming a stack structure above the sacrificial group;
    forming a slit passing through the stack structure and extending into the sacrificial group;
    forming a horizontal space by removing the sacrificial group through the slit;
    forming a semiconductor pattern on a surface of the horizontal space to define a gap in the horizontal space; and
    forming a source junction in the semiconductor pattern.

2. The method of claim 1, wherein the forming of the semiconductor pattern comprises forming a semiconductor layer along surfaces of the horizontal space and the slit so that the semiconductor pattern extends on a sidewall of the slit and the gap opens towards the slit.

3. The method of claim 2 wherein the forming of the source junction comprises:
    forming an insulating layer filling the gap in the horizontal space defined by the semiconductor pattern; and
    injecting an impurity into the semiconductor pattern disposed on the surface of the slit through the slit.

4. The method of claim 2, wherein the stack structure includes interlayer insulating layers and sacrificial layers alternately stacked on each other,
    the method further comprising before removing the sacrificial group:
    replacing the sacrificial layers by conductive patterns; and
    forming a spacer insulating layer and a multilayer protective layer on the sidewall of the slit including a sidewall of the conductive patterns.

5. The method of claim 1, wherein the forming of the semiconductor pattern comprises forming a semiconductor layer so that the gap and the slit are isolated from each other.

6. The method of claim 5, wherein the forming of the source junction comprises:
    forming a first doping region including an impurity at a first concentration in the semiconductor pattern exposed through the slit;
    forming an insulating spacer on the sidewall of the slit; and
    forming a second doping region including the impurity at a second concentration higher than the first concentration in the first doping region not blocked by the insulating spacer.

7. The method of claim 5, wherein the stack structure includes interlayer insulating layers and sacrificial layers alternately stacked on each other,
    the method further comprising replacing the sacrificial layers with conductive patterns after forming the semiconductor pattern.

8. A method of manufacturing a semiconductor device, the method comprising:
    forming a sacrificial group on a well structure;
    forming a stack structure including first and second material layers alternately stacked on each other on the sacrificial group;
    forming a slit passing through the stack structure and extending into the sacrificial group;
    opening a horizontal space by removing the sacrificial group through the slit;
    forming a semiconductor layer along a surface of the horizontal space and a surface of the slit such that a gap opened by the semiconductor layer is defined in each of the slit and the horizontal space;
    forming a select channel pattern by removing a portion of the semiconductor layer so that the semiconductor layer remains lower than the slit;
    forming a gap-fill insulating pattern filling the gap in the horizontal space and being lower than the select channel pattern; and
    forming a source junction in the select channel pattern protruding farther than the gap-fill insulating pattern.

9. The method of claim 8, further comprising forming a common source line on the gap-fill insulating pattern, the common source line directly contacting the source junction, protruding farther into the slit than the source junction, and filling the slit.

10. The method of claim 8, further comprising:
forming holes passing through the stack structure and extending into the well structure;
forming a multilayer memory layer on a surface of each of the holes; and
forming a channel pillar on the multilayer memory layer.

11. The method of claim 10, further comprising forming an auxiliary channel layer on the sacrificial group before forming the stack structure,
wherein the auxiliary channel layer is penetrated by the holes.

12. The method of claim 11, wherein the opening of the horizontal space comprises removing a portion of the multilayer memory layer between the well structure and the channel pillar from between the auxiliary channel layer and the channel pillar to form a first ring type groove between the auxiliary channel layer and the channel pillar, and a second ring type groove between the well structure and the channel pillar.

13. The method of claim 12, wherein the select channel pattern fills the first and second ring type grooves and directly contacts the well structure, the auxiliary channel layer, and the channel pillar.

14. The method of claim 8, wherein a lowermost layer disposed at a lowermost level among the first material layers of the stack structure has a smaller thickness than the rest of the first material layers.

15. The method of claim 8, further comprising forming a channel pillar passing through the stack structure and extending into the well structure,
wherein the channel pillar is exposed by the horizontal space.

16. The method of claim 15,
wherein the semiconductor layer and the select channel pattern directly contact the well structure and the channel pillar, and
wherein the forming of the gap-fill insulating pattern filling the gap in the horizontal space and being lower than the select channel pattern comprises:
filling the slit and the horizontal space opened by the select channel pattern with an insulating material; and
patterning the gap-fill insulating pattern by removing a portion of the insulating material to expose an end portion of the select channel pattern protruding into the slit.

17. The method of claim 15,
wherein the semiconductor layer and the select channel pattern directly contact the well structure and the channel pillar,
wherein the forming of the gap-fill insulating pattern filling the gap in the horizontal space and being lower than the select channel pattern comprises:
completely filling the slit opened by the semiconductor layer with an insulating material;
primarily etching the insulating material so that the insulating material is lower than the slit; and
patterning the gap-fill insulating pattern by secondarily etching the insulating material primarily etched to expose an end portion of the select channel pattern protruding into the slit, and
wherein the select channel pattern is formed by etching the semiconductor layer using the insulating material primarily etched as an etching barrier.

18. The method of claim 8, wherein the well structure includes a first conductivity type impurity.

19. The method of claim 18, wherein the forming of the source junction comprises:
forming a doping region by injecting a second conductivity type impurity different from the first conductivity type impurity to a predetermined thickness from a surface of the select channel pattern protruding farther than the gap-fill insulating pattern; and
performing a heat treatment process so that the second conductivity type impurity diffuses into the select channel pattern from the doping region and the second conductivity type impurity is activated.

20. The method of claim 8, further comprising before opening the horizontal space:
forming a gate stack structure by replacing the first material layers or the second material layers with third material layers through the slit;
forming a spacer insulating layer and a multilayer protective layer along a surface of the gate stack structure; and
removing a portion of the spacer insulating layer and a portion of the multilayer protective layer to expose the sacrificial group through a bottom surface of the slit.

21. The method of claim 20, wherein the first material layers are insulating layers,
wherein the second material layers are sacrificial materials having different etch rate from the insulating layers, and
wherein the third material layers replacing the second material layers are conductive materials.

* * * * *